(12) United States Patent
Jin et al.

(10) Patent No.: US 10,186,516 B2
(45) Date of Patent: Jan. 22, 2019

(54) ONE TIME PROGRAMMABLE MEMORY DEVICE, METHOD OF MANUFACTURING THE SAME, AND ELECTRONIC DEVICE INCLUDING THE SAME

(71) Applicant: Samsung Electronics Co., Ltd., Suwon-si (KR)

(72) Inventors: Min-jung Jin, Yongin-si (KR); Sang-woo Pae, Seongnam-si (KR); Hyun-min Choi, Uiwang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/347,139

(22) Filed: Nov. 9, 2016

(65) Prior Publication Data

US 2017/0154890 A1    Jun. 1, 2017

(30) Foreign Application Priority Data

Nov. 30, 2015   (KR) .................. 10-2015-0169280

(51) Int. Cl.

| | | |
|---|---|---|
| *H01L 27/112* | (2006.01) | |
| *H01L 23/525* | (2006.01) | |
| *H01L 29/78* | (2006.01) | |
| *H01L 29/423* | (2006.01) | |
| *H01L 29/51* | (2006.01) | |
| *H01L 29/49* | (2006.01) | |

(52) U.S. Cl.
CPC .... *H01L 27/11206* (2013.01); *H01L 23/5252* (2013.01); *H01L 29/7851* (2013.01); *H01L 29/42376* (2013.01); *H01L 29/495* (2013.01); *H01L 29/517* (2013.01)

(58) Field of Classification Search
CPC ....................... H01L 27/11206; H01L 23/5252
See application file for complete search history.

(56) References Cited

U.S. PATENT DOCUMENTS

| | | |
|---|---|---|
| 6,580,144 B2 | 6/2003 | Anthony |
| 8,053,809 B2 | 11/2011 | Cheng et al. |
| 8,101,471 B2 | 1/2012 | Hafez et al. |
| 8,227,890 B2 | 7/2012 | Lin et al. |
| 8,334,572 B2 | 12/2012 | Chung et al. |

(Continued)

FOREIGN PATENT DOCUMENTS

| | | |
|---|---|---|
| JP | 2003115574 | 4/2003 |
| JP | 2013187534 | 9/2013 |

(Continued)

*Primary Examiner* — Marc Armand
*Assistant Examiner* — Sarah Salerno
(74) *Attorney, Agent, or Firm* — Onello & Mello, LLP

(57) ABSTRACT

A one time programmable (OTP) memory device, a method of manufacturing the same, and an electronic device including the same, which lower a programming voltage to enhance programming efficiency, increase reliability of peripheral input/output (I/O) elements used for a design of the OTP memory device, and simplify the design, are provided. The OTP memory device includes a transistor including one of a first gate structure including a high-k dielectric layer, a rare earth element (RE) supply layer, and a second metal layer, a second gate structure including the high-k dielectric layer, a first metal layer, and the second metal layer, and a third gate structure including the high-k dielectric layer and the second metal layer.

11 Claims, 73 Drawing Sheets

(56) References Cited

U.S. PATENT DOCUMENTS

| | | |
|---|---|---|
| 8,742,457 B2 | 6/2014 | Yang |
| 9,040,370 B2 | 5/2015 | Yang |
| 2003/0062595 A1 | 4/2003 | Anthony |
| 2009/0152636 A1* | 6/2009 | Chudzik ........... H01L 21/82384 257/369 |
| 2012/0164799 A1 | 6/2012 | Kurz et al. |
| 2012/0211841 A1 | 8/2012 | Kurjanowicz |
| 2013/0126979 A1 | 5/2013 | Chern et al. |
| 2013/0153960 A1 | 6/2013 | Yang |
| 2014/0048867 A1 | 2/2014 | Toh et al. |
| 2014/0179070 A1 | 6/2014 | Yang |
| 2015/0069524 A1* | 3/2015 | Hong ................. H01L 27/1203 257/392 |
| 2015/0221656 A1 | 8/2015 | Yang |
| 2016/0315164 A1* | 10/2016 | Son .................... H01L 29/4958 |

FOREIGN PATENT DOCUMENTS

| | | |
|---|---|---|
| KR | 101346875 | 1/2014 |
| KR | 20140024210 | 2/2014 |

* cited by examiner

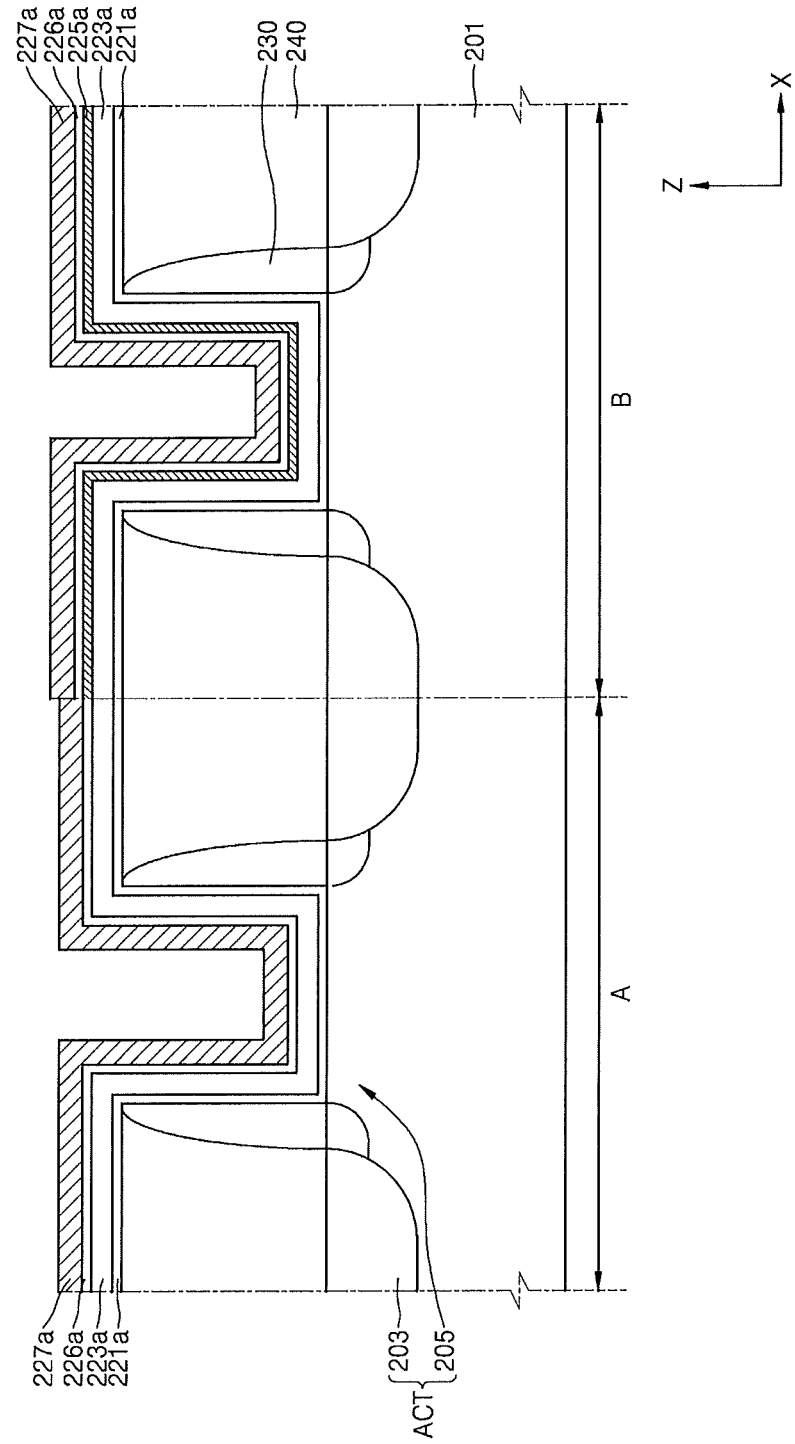

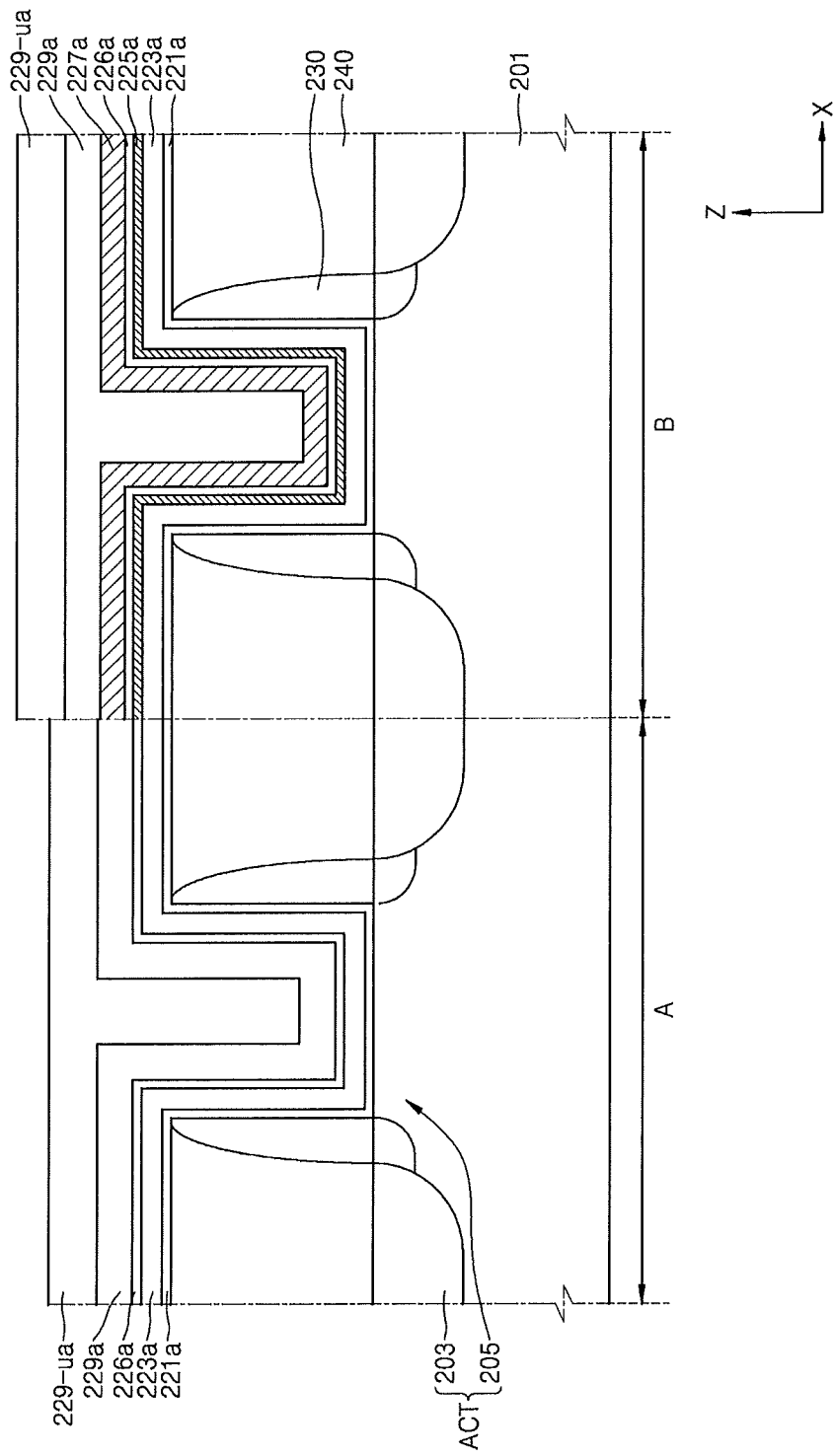

ONE TIME PROGRAMMABLE MEMORY DEVICE, METHOD OF MANUFACTURING THE SAME, AND ELECTRONIC DEVICE INCLUDING THE SAME

CROSS-REFERENCE TO RELATED APPLICATION

This application claims the benefit of Korean Patent Application No. 10-2015-0169280, filed on Nov. 30, 2015, in the Korean Intellectual Property Office, the disclosure of which is incorporated herein in its entirety by reference.

BACKGROUND

The inventive concept relates to a semiconductor device, and more particularly, to a one time programmable (OTP) memory device where a modification to data written to memory is prohibited and a method of manufacturing the same.

In memory devices such as nonvolatile memory devices that store electronic data, stored data may be maintained even when power is cut off or removed from the device. For example, examples of the nonvolatile memory devices may include read-only memory (ROM), magnetic disks, optical disks, flash memory devices, etc. Nonvolatile memory devices where changing of written data is prohibited are referred to as OTP memory devices. If data is programmed in an OTP memory device, a structure of an OTP cell which is included in the OTP memory device and is a unit of data storage is changed to an irreversible structure, and a 0 or 1 value may be stored by using the irreversible structure.

SUMMARY

The inventive concept provides an OTP memory device, a method of manufacturing the same, and an electronic device including the same, which lower a programming voltage to enhance programming efficiency, increase reliability of peripheral input/output (I/O) elements used for a design of the OTP memory device, and simplify the design.

According to an aspect of the inventive concept, there is provided a one time programmable (OTP) memory device disposed with a logic device including a plurality of metal oxide semiconductor field effect transistors (MOSFETs) having different threshold voltages, the OTP memory device comprising: a program transistor configured to write data once according to a programming voltage being applied to a first gate structure, the program transistor including the first gate structure; and a read transistor configured to read data stored in the program transistor according to an operating voltage being applied to a second gate structure, the read transistor including the second gate structure, wherein at least one of the plurality of MOSFETs comprises a third gate structure which includes a high-k dielectric layer, a rare earth element (RE) supply layer, a first metal layer, and a second metal layer, wherein the first gate structure comprises a first gate oxide layer having at least one layer and a first metal electrode layer having at least one layer on the first gate oxide layer and comprises at least one of a first structure at which the first metal electrode layer is thinner than a sum of a thickness of the first metal layer and a thickness of the second metal layer, and a second structure at which the first gate oxide layer is thinner than a sum of a thickness of the high-k dielectric layer and a thickness of the RE supply layer.

In some embodiments, the OTP memory device comprises at least one fin extending in a first direction at a protruding structure on a semiconductor substrate; the first gate structure and the second gate structure cover a portion of the fin on the semiconductor substrate and extend in a second direction vertical to the first direction; and the second gate structure comprises a structure which is substantially the same as a structure of the first gate structure.

In some embodiments, the first metal layer comprises a nitride or an oxynitride of titanium (Ti) or a nitride or an oxynitride of tantalum (Ta). In some embodiments, the RE supply layer comprises at least one of lanthanum (La), scandium (Sc), erbium (Er), strontium (Sr), and yttrium (Yt).

In some embodiments, the first gate structure comprises the first structure; and the first metal electrode layer comprises the second metal layer and does not include the first metal layer.

In some embodiments, the first gate structure comprises the second structure; and the first gate oxide layer comprises the high-k dielectric layer and does not include the RE supply layer.

In some embodiments, the first gate structure comprises a complex structure which includes the first structure and the second structure; the first metal electrode layer comprises the second metal layer and does not include the first metal layer; and the first gate oxide layer comprises the high-k dielectric layer and does not include the RE supply layer.

In some embodiments, the second metal layer comprises aluminum (Al); and the high-k dielectric layer comprises a hafnium (Hf)-based material or a zirconium (Zr)-based material.

In some embodiments, the plurality of MOSFETs, the read transistor, and the program transistor comprise a Fin-FET structure; and the read transistor and the program transistor are formed along with the plurality of MOSFETs.

In some embodiments, the logic device comprises at least one of: a first MOSFET including the third gate structure and a first threshold voltage; a second MOSFET including a fourth gate structure and a second threshold voltage, the fourth gate structure including the high-k dielectric layer, the RE supply layer, and the second metal layer; a third MOSFET including a fifth gate structure and a third threshold voltage, the fifth gate structure including the high-k dielectric layer, the first metal layer, and the second metal layer; and a fourth MOSFET including a sixth gate structure and a fourth threshold voltage, the sixth gate structure including the high-k dielectric layer and the second metal layer, and wherein: a threshold voltage increases in an order of the second threshold voltage, the fourth threshold voltage, the first threshold voltage, and the third threshold voltage; a breakdown voltage increases in an order of the fourth MOSFET, the second MOSFET, the third MOSFET, and the first MOSFET; and the first gate structure and the second gate structure each comprises a structure which is the same as a structure of one of the fourth to sixth gate structures.

In some embodiments, the first gate structure comprises: an interface layer under the first gate oxide layer; and a barrier metal layer between the first gate oxide layer and the first metal electrode layer.

According to another aspect of the inventive concept, there is provided a one time programmable (OTP) memory device that includes a transistor including one of a first gate structure including a high-k dielectric layer, a rare earth element (RE) supply layer, and a second metal layer, a second gate structure including the high-k dielectric layer, a first metal layer, and the second metal layer, and a third gate structure including the high-k dielectric layer and the second metal layer.

In some embodiments, the transistor comprises a FinFET structure; the OTP memory device comprises two transistors; and one of the two transistors is a program transistor that writes data once according to a programming voltage being applied thereto, and the other of the two transistors is a read transistor that reads data stored in the program transistor according to an operating voltage being applied thereto.

In some embodiments, the OTP memory device comprises either a 1.5TR structure where one of a source and a drain of the program transistor is in floating state, or a 2TR structure where the source and the drain are connected to each other. In some embodiments, the OTP memory device comprises a 1TR structure.

In some embodiments, a logic device is disposed near the OTP memory device; the logic device comprises a plurality of metal oxide semiconductor field effect transistors (MOSFETs) having different threshold voltages; each of the plurality of MOSFETs comprises one of the first gate structure, the second gate structure, the third gate structure, and a fourth gate structure that includes the high-k dielectric layer, the RE supply layer, the first metal layer, and the second metal layer; and the transistor is formed along with the plurality of MOSFETs.

According to another aspect of the inventive concept, there is provided an electronic device that includes a logic device including a plurality of metal oxide semiconductor field effect transistors (MOSFETs) having different threshold voltages, at least one of the plurality of MOSFETs including a first gate structure that includes a high-k dielectric layer, a rare earth element (RE) supply layer, a first metal layer, and a second metal layer, and a one time programmable (OTP) memory device disposed near a logic device, the OTP memory device including a transistor including a second gate structure that includes a first gate oxide layer having at least one layer and a first metal electrode layer having at least one layer on the first gate oxide layer, wherein the second gate structure includes at least one of a first structure, where the first metal electrode layer is formed thinner than a sum of a thickness of the first metal layer and a thickness of the second metal layer, and a second structure where the first gate oxide layer is formed thinner than a sum of a thickness of the high-k dielectric layer and a thickness of the RE supply layer.

In some embodiments, the transistor comprises a FinFET structure; the OTP memory device comprises two the transistors; one of the two transistors is a program transistor that writes data once according to a programming voltage being applied thereto, and the other is a read transistor that reads data stored in the program transistor according to an operating voltage being applied thereto; and a structure of a second gate structure of the program transistor is substantially the same as a structure of a second gate structure of the read transistor.

In some embodiments, the second gate structure comprises the first structure; and first gate oxide layer comprises the high-k dielectric layer and the RE supply layer; and the first metal electrode layer comprises the second metal layer and does not include the first metal layer.

In some embodiments, the second gate structure comprises the second structure; the first gate oxide layer comprises the high-k dielectric layer and does not include the RE supply layer; and the first metal electrode layer comprises the first metal layer and the second metal layer.

In some embodiments, the second gate structure comprises a complex structure which includes the first structure and the second structure; the first gate oxide layer comprises the high-k dielectric layer and does not include the RE supply layer; and the first metal electrode layer comprises the second metal layer and does not include the first metal layer.

In some embodiments, each of the plurality of MOSFETs comprises one of the first gate structure, a third gate structure including the high-k dielectric layer, the RE supply layer, and the second metal layer, a fourth gate structure including the high-k dielectric layer, the first metal layer, and the second metal layer, and a fifth gate structure including the high-k dielectric layer and the second metal layer; and each of the first to fifth gate structures comprises: an interface layer under the high-k dielectric layer or the first gate oxide layer; and a barrier metal layer on the high-k dielectric layer, the first gate oxide layer, or the RE supply layer.

According to another aspect of the inventive concept, there is provided a method of manufacturing a one time programmable (OTP) memory device, the method comprising: preparing a semiconductor substrate where first to fourth regions are defined; forming an interface layer and a high-k dielectric layer on the semiconductor substrate; forming a rare earth element (RE) supply layer on the high-k dielectric layer; forming a first mask on the RE supply layer at the first and second regions and etching the RE supply layer at the third and fourth regions by using the first mask to remove the RE supply layer; forming a first metal layer on the RE supply layer at the first and second regions and the high-k dielectric layer at the third and fourth regions; forming a second mask on the first metal layer at the first and third regions and etching the first metal layer at the second and fourth regions by using the second mask to remove the first metal layer; forming a second metal layer on the first metal layer at the first and third regions, the RE supply layer at the second region, and the high-k dielectric layer at the fourth region; and forming a first gate structure at the first region, a second gate structure at the second region, a third gate structure at the third region, and a fourth gate structure at the fourth region, the first gate structure including the interface layer, the high-k dielectric layer, the RE supply layer, the first metal layer, and the second metal layer, the second gate structure including the interface layer, the high-k dielectric layer, the RE supply layer, and the second metal layer, the third gate structure including the interface layer, the high-k dielectric layer, the first metal layer, and the second metal layer, and the fourth gate structure including the interface layer, the high-k dielectric layer, and the second metal layer, wherein the OTP memory device comprises a transistor including one of the second to fourth gate structures.

In some embodiments, before the forming of the interface layer and the high-k dielectric layer: forming a plurality of dummy gate structures, which extend in a first direction and each include a dummy insulation layer and a dummy gate electrode, on the semiconductor substrate; forming a spacer on a side wall of the dummy gate structure; forming an interlayer insulation layer that covers the semiconductor substrate and a resultant material on the semiconductor substrate; planarizing the interlayer insulation layer to expose a top of the dummy gate structure; and removing the dummy gate structure, wherein the interface layer and the high-k dielectric layer are formed in a portion, from which the dummy gate structure is removed, and on the interlayer insulation layer.

In some embodiments, before forming the interface layer and the high-k dielectric layer: etching a portion of the semiconductor substrate to form a trench, and forming a protruding structure, which protrudes from the semiconductor substrate and extends in a first direction, between a plurality of the trenches; filling a portion of the trench with an insulating material to form an isolation layer, and forming at least one fin that corresponds to an upper portion of the protruding structure and protrudes from the isolation layer; forming a dummy gate structure that covers a portion of each of the semiconductor substrate, the isolation layer, and the at least one fin, extends in a second direction, and includes a dummy insulation layer and a dummy gate electrode; forming a spacer on a side of the dummy gate structure;

forming an interlayer insulation layer that covers the semiconductor substrate and a resultant material on the semiconductor substrate; planarizing the interlayer insulation layer to expose a top of the dummy gate structure; and removing the dummy gate structure, wherein the interface layer and the high-k dielectric layer are formed in a portion, from which the dummy gate structure is removed, and on the interlayer insulation layer.

In some embodiments, the method further comprises forming a sacrificial layer before forming at least one of the first mask and the second mask; and forming at least one of the first mask and the second mask on the sacrificial layer.

In some embodiments, the method further comprises forming a source and a drain in fin portions on both sides of the dummy gate structure before forming the interlayer insulation layer.

According to another aspect of the inventive concept, there is provided a memory device, comprising: a substrate; a first region on the substrate where a OTP memory device is provided, the OTP memory device comprising: a program transistor including a first gate structure, the program transistor configured to write data once according to a programming voltage being applied to the first gate structure; and a read transistor configured to read data stored in the program transistor according to an operating voltage being applied to a second gate structure; a second region on the substrate wherein a logic device comprising a plurality of metal oxide semiconductor (MOS) transistors are provided, wherein at least one of the MOS transistors comprises a third gate structure which includes a high-k dielectric layer, a rare earth element (RE) supply layer, a first metal layer, and a second metal layer.

In some embodiments, the first gate structure comprises a first gate oxide layer having at least one layer and a first metal electrode layer having at least one layer on the first gate oxide layer and comprises at least one of a first structure at which the first metal electrode layer is thinner than a sum of a thickness of the first metal layer and a thickness of the second metal layer, and a second structure at which the first gate oxide layer is thinner than a sum of a thickness of the high-k dielectric layer and a thickness of the RE supply layer.

In some embodiments, the memory device further comprises a FinFET structure comprising the plurality of MOS transistors, the read transistor, and the program transistor.

In some embodiments, the logic device comprises at least one of a first MOSFET of the plurality of MOS transistors, the first MOSFET including the third gate structure and a first threshold voltage; a second MOSFET of the plurality of MOS transistors, the second MOSFET including a fourth gate structure and a second threshold voltage, the fourth gate structure including the high-k dielectric layer, the RE supply layer, and the second metal layer; a third MOSFET of the plurality of MOS transistors, the third MOSFET including a fifth gate structure and a third threshold voltage, the fifth gate structure including the high-k dielectric layer, the first metal layer, and the second metal layer; and a fourth MOSFET of the plurality of MOS transistors, the fourth MOSFET including a sixth gate structure and a fourth threshold voltage, the sixth gate structure including the high-k dielectric layer and the second metal layer, wherein: a threshold voltage increases in an order of the second threshold voltage, the fourth threshold voltage, the first threshold voltage, and the third threshold voltage; a breakdown voltage increases in an order of the fourth MOSFET, the second MOSFET, the third MOSFET, and the first MOSFET; and the first gate structure and the second gate structure each comprises a structure which is the same as a structure of one of the fourth to sixth gate structures.

BRIEF DESCRIPTION OF THE DRAWINGS

Embodiments of the inventive concept will be more clearly understood from the following detailed description taken in conjunction with the accompanying drawings in which:

FIGS. 19A to 19H are cross-sectional views illustrating a process of manufacturing the OTP memory device of FIG. 6A.

DETAILED DESCRIPTION OF THE EMBODIMENTS

Figure 1:
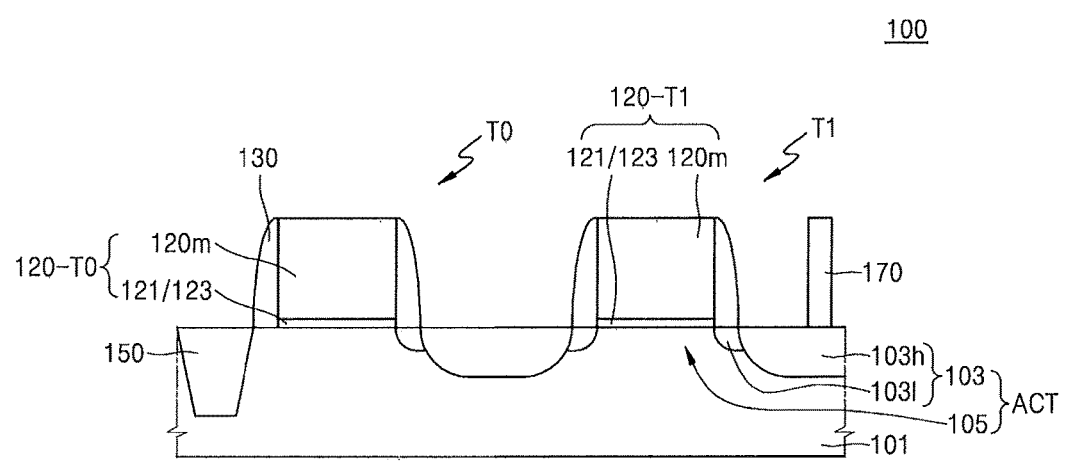
FIG. 1 is a cross-sectional view schematically illustrating an OTP memory device according to an embodiment.

As used herein, the term "and/or" includes any and all combinations of one or more of the associated listed items. Expressions such as "at least one of" when preceding a list of elements, modify the entire list of elements and do not modify the individual elements of the list.

Hereinafter, exemplary embodiments will be described in detail with reference to the accompanying drawings.

Embodiments of the inventive concept are provided for fully conveying the concept of the inventive concept to those skilled in the art. The inventive concept may be embodied in many different forms and should not be construed as being limited to the embodiments set forth herein; rather, these embodiments are provided so that this disclosure will be thorough and complete, and will fully convey the concept of the inventive concept to those skilled in the art.

In this disclosure below, when an element is described as being connected to another element, the element may be directly connected to the other element, but a third element may be disposed therebetween. When an element is referred to as being 'on' another element, it may be directly on the other element, or intervening elements may also be present. Structures or sizes of elements illustrated in the accompanying drawings and an interval between the elements may be exaggerated for clarity of the specification, and a portion irrelevant to description is omitted. Like reference numerals refer to like elements throughout. Terms used herein are described for the purpose of describing the inventive concept, and are not described for limiting a meaning or limiting the spirit and scope of the inventive concept defined by claims.

Figure 2A:
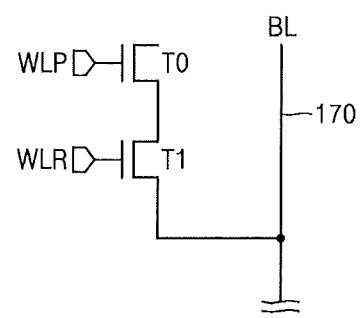
FIGS. 2A and 2B are circuit diagrams for describing an operation of the OTP memory device of FIG. 1.
Figure 2B:
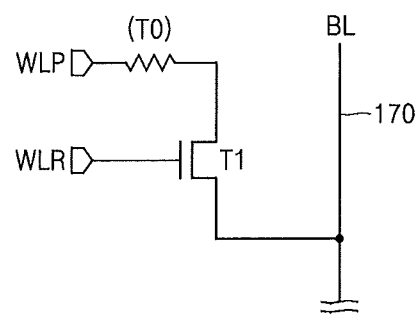

FIG. 1 is a cross-sectional view schematically illustrating an OTP memory device 100 according to an embodiment. FIGS. 2A and 2B are circuit diagrams for describing an operation of the OTP memory device 100 of FIG. 1.

Referring to FIG. 1, the OTP memory device 100 according to the present embodiment may include a program transistor T0 and a read transistor T1, which may be paired. Each of the program transistor T0 and the read transistor T1 may be formed on a semiconductor substrate 101. The program transistor T0 and the read transistor T1 may collectively configure or form a unit cell of the OTP memory device 100.

The semiconductor substrate 101 may be based on a silicon bulk wafer or a silicon-on-insulator (SOI) wafer. However, a material of the semiconductor substrate is not limited to silicon. For example, the semiconductor substrate 101 may include material for a Group IV semiconductor such as germanium (Ge) and the like, Group IV-IV compound semiconductor such as silicon germanium (SiGe), silicon carbide (SiC), or the like, or Group III-V compound semiconductor such as gallium arsenide (GaAs), indium arsenide (InAs), indium phosphide (InP), or the like. Also, the semiconductor substrate 101 may be based on a SiGe wafer, an epitaxial wafer, a polished wafer, an annealed wafer, or the like.

The semiconductor substrate 101 may be, for example, a p-type substrate including a p-type impurity ion. However, the semiconductor substrate 101 is not limited to the p-type substrate. For example, the semiconductor substrate 101 may be an n-type substrate including an n-type impurity ion.

The semiconductor substrate 101 may include an active region ACT which is defined in an upper portion of the semiconductor substrate 101 by an isolation layer 150 such as shallow trench isolation (STI). The active region ACT may include an impurity region which is formed by injecting impurity ions (i.e., dopants) into the semiconductor substrate 101 at a high concentration. For example, the active region ACT may include a source/drain region 103, which is formed by injecting dopants into upper portions of the semiconductor substrate 101 on both sides of a gate structure 120-T1 of the read transistor T1 at $1E20/cm^3$ or more, and a channel region 105 under the gate structure 120-T1. The source/drain region 103, as illustrated, may include a high-concentration doping region 103h and a low-concentration doping region (LDD) 103l.

The isolation layer 150 may be formed in a structure which surrounds the active region ACT corresponding to a unit cell of the OTP memory device 100. The isolation layer 150 may be disposed between a plurality of the active regions ACT and may electrically isolate the active regions ACT. The isolation layer 150 may include, for example, at least one of silicon oxide, silicon nitride, silicon oxynitride, and a combination thereof.

As described above, the unit cell of the OTP memory device 100 may include the program transistor T0 and the read transistor T1. The program transistor T0, a type of anti-fuse device, may be a structure where a conduction state is changeable.

For reference, the anti-fuse device may be a structure which is changeable from a non-conducted state to a conducted state, and in response to an electrical stress such as a programming voltage or current, the anti-fuse device may be changed from a high-resistance state to a low-resistance state. The programming voltage may be applied in a pulse form of several to several tens µs. The anti-fuse device may be simply implemented in a capacitor structure, or may be implemented in a transistor structure as in the OTP memory device 100 according to the present embodiment. The anti-fuse device having the transistor structure may be implemented along with peripheral transistors through a complementary metal-oxide semiconductor (CMOS) process. Here, the CMOS process may include a FinFET process of forming a transistor having a three-dimensional (3D) structure by using an active fin. Also, even though the anti-fuse device has the transistor structure, the anti-fuse device may not perform a general transistor function except for a special case. In the OTP memory device 100 according to the present embodiment, the anti-fuse device may be formed in the transistor structure and may have a gate structure which is substantially the same as that of the read transistor T1. Thus, the anti-fuse device may be referred to as a program transistor T0. Hereinafter, the program transistor T0 may be used as having the same or similar meaning as that of the anti-fuse device.

The program transistor T0, as illustrated, may include a gate structure 120-T0, a spacer 130, and a source/drain region 103. The gate structure 120-T0 may include a gate oxide layer 121/123 contacting the semiconductor substrate 101 and a metal layer 120m having at least one layer stacked on the gate oxide layer 121/123. The gate oxide layer 121/123 may include, for example, an interface layer 121 and a high-k dielectric layer 123. The gate oxide layer 121/123 and the metal layer 120m will be described in detail in describing FIG. 4 or 5A.

The spacer 130 may be formed on both sides of the gate structure 120-T0 and may be formed of an insulating material such as oxide, nitride, oxynitride, or the like. For example, the spacer 130 may be formed of silicon oxide, silicon nitride, silicon oxynitride, and/or the like. The spacer 130 may be formed in an L-shape without being limited to an illustrated shape. Also, the spacer 130 may be formed of a single layer, but is not limited thereto. In other embodiments, the spacer 130 may be formed of a multilayer.

The source/drain region 103 may act as a type of current path in the program transistor T0, but may not correspond to a general source/drain region. However, the source/drain region 103 may also be used in the read transistor T1 in common. Thus, in the read transistor T1, the source/drain region 103 may correspond to a normal source/drain region. In addition, as illustrated, in the program transistor T0, the isolation layer 150 instead of the source/drain region may be disposed on one side of the gate structure 120-T0. Since the isolation layer 150 is disposed, the program transistor T0 may have a structure where one terminal is floated (see FIG. 2A). Depending on the case, the program transistor T0 may be formed in a depletion type where a source and a drain are connected to each other (see FIG. 3A). For reference, when the program transistor T0 has a floating structure, the OTP memory device may have a 1.5TR structure, and when the program transistor T0 has a depletion structure, the OTP memory device may have a 2TR structure.

The read transistor T1 may include, as illustrated, the gate structure 120-T1, the spacer 130, the source/drain region 103, and the channel region 105. The read transistor T1 may be referred to as an access transistor or a pass transistor. The gate structure 120-T1 and the spacer 130 may each include a structure and a material which are substantially the same as those of the gate structure 120-T0 and spacer 130 of the program transistor T0. Therefore, the gate structure 120-T1 may include the gate oxide layer 121/123 on the semiconductor substrate 101 and the metal layer 120m on the gate oxide layer 121/123. Also, the spacer 130 may be formed of an insulating material, such as oxide, nitride, oxynitride, or the like, on both sides of the gate structure 120-T1.

The source/drain region 103 may be formed in upper portions of the semiconductor substrate 101 on the both sides of the gate structure 120-T1, and the channel region 105 may be formed in an upper portion of the semiconductor substrate 101 between the source and the drain under the gate structure 120-T1. Since the read transistor T1 is a general transistor, the source/drain region 103 and the channel region 105 may respectively perform functions which are substantially the same as those of a source/drain region and a channel region of the general transistor. Also, as illustrated, a bit line 170 may contact the source/drain region 103, e.g., the drain region, for example, the high-concentration doping region 103h.

To briefly describe the operation principle of the OTP memory device 100 with reference to FIGS. 2A and 2B, as illustrated in FIG. 2A, due to the gate oxide layer 121/123 shown in FIG. 1, a high-resistance state may be maintained between a gate structure WLP of the program transistor T0 and the source/drain region 103 before a programming voltage is applied to the gate structure WLP. Therefore, when a certain voltage is applied to the gate structure WLP of the program transistor T0 and the bit line 170 and an operating voltage is applied to a gate structure WLR of the read transistor T1, a current flowing to the bit line 170 may be relatively low.

When a high programming voltage is applied to the gate structure WLP of the program transistor T0, the gate oxide layer 121/123 may be broken down and thus may be changed to a low-resistance state. In FIG. 2B, the program transistor T0 may be changed to the low-resistance state. Here, the program transistor T0 is illustrated as a resistor instead of a transistor. As described above, the program transistor T0 may be put in the low-resistance state. When a certain voltage is applied to the gate structure WLP of the program transistor T0 and the bit line 170 and an operating voltage is applied to the gate structure WLR of the read transistor T1, the current flowing to the bit line 170 may be relatively high. As a result, the OTP memory device 100 may store data by applying the high programming voltage to the program transistor T0. For example, the OTP memory device 100 may store, as a 0 value, data corresponding to a case where the program transistor T0 maintains the high-resistance state and may store, as a 1 value, data corresponding to a case where the program transistor T0 is changed to the low-resistance state due to the programming voltage applied thereto.

In the OTP memory device 100 according to the present embodiment, the program transistor T0 and the read transistor T1 may be formed by a CMOS process or the like. Also, the program transistor T0 and the read transistor T1 may be formed in a structure where a threshold voltage of a transistor is low and/or a structure where a thickness of a gate oxide layer is thin. Therefore, in the program transistor T0, the gate oxide layer is broken down by applying the low programming voltage, and thus, programming is easily performed. For example, in the OTP memory device 100 according to the present embodiment, the gate structure 120-T0 of the program transistor T0 and the gate structure 120-T1 of the read transistor T1 may each be formed in a structure where a metal layer is thinly formed and/or a structure where a rare earth element (RE) supply layer is omitted.

In the OTP memory device 100 according to the present embodiment, the program transistor T0 and the read transistor T1 may be formed by a CMOS process or the like, and moreover, the program transistor T0 may be formed in a structure where breakdown is easily made by applying the low programming voltage, thereby enhancing the programming efficiency of the OTP memory device 100, and increasing reliability of peripheral input/output (I/O) elements used for a design of the OTP memory device 100, resulting in a simplified design. Depending on the configuration and/or case, only the program transistor T0 may be formed in a structure where breakdown is easily made by applying the low programming voltage. However, since the read transistor T1 is formed along with the program transistor T0 by a CMOS process or the like, the program transistor T0 and the read transistor T1 may be formed in the substantially same structure in consideration of a level of difficulty of a process. Accordingly, the read transistor T1 may also be broken down by applying the low programming voltage.

For reference, in OTP memory devices, a high voltage is generally applied to a program transistor in order for programming to be easily performed, namely, in order for a gate oxide layer to be easily broken down. Also, the OTP memory devices may have a structure where the gate oxide layer of the program transistor is easily broken down. In conventional OTP memory devices, a high programming voltage of 4 V or more is applied to the program transistor. Also, a charge pump and a level shifter may generally be used for applying a high voltage. However, when a high voltage of 4 V or more is applied, reliability of I/O elements applied to the charge pump and the level shifter is degraded, and leakage occurs. Therefore, the charge pump may be formed to have a large size for solving the problems of the leakage and reliability of the I/O elements, but an area is wasted, causing a reduction in degree of integration. Also, in a case of lowering the programming voltage of the program transistor, the programming efficiency of the OTP memory devices is reduced.

However, in the OTP memory device 100 according to the present embodiment, the program transistor T0 may be formed in a structure where breakdown is easily made by applying the low programming voltage, thereby solving the problems of the conventional OTP memory devices.

Figure 3A:
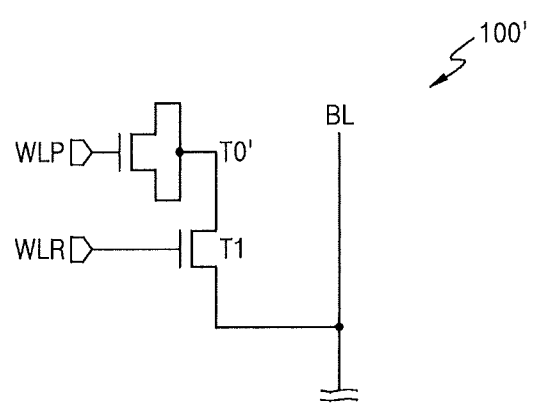
FIGS. 3A and 3B are circuit diagrams for describing a structure of an OTP memory device, according to another embodiment.
Figure 3B:
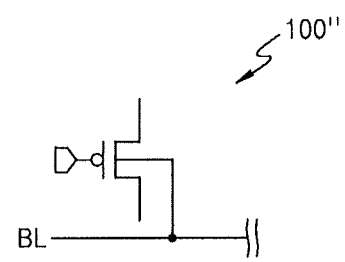

FIGS. 3A and 3B are circuit diagrams for describing a structure of an OTP memory device, according to another embodiment.

Referring to FIG. 3A, in an OTP memory device 100' according to the present embodiment, a program transistor T0' may be formed in a depletion type where a source and a drain are connected to each other. The OTP memory device 100' having such a structure may be referred to as an OTP memory device having a 2TR structure. Even in the OTP memory device 100' according to the present embodiment, a gate structure (120-T0 of FIG. 1) of the program transistor T0' and a gate structure (120-T1 of FIG. 1) of a read transistor T1 may each include a gate oxide layer (121/123 of FIG. 1) and a metal layer (120m of FIG. 1) having at least one layer. The gate structure (120-T0 of FIG. 1) of the program transistor T0' and the gate structure (120-T1 of FIG. 1) of the read transistor T1 may be formed having a substantially same or similar structure.

Referring to FIG. 3B, an OTP memory device 100" according to the present embodiment may be configured with one transistor, for example, a PMOS transistor. The OTP memory device 100" having such a structure may be referred to as an OTP memory device having a 1TR structure. To briefly describe the operation principle, a source region and a drain region of the PMOS transistor may all be maintained in a floated state. In applying a programming voltage to both ends of a gate electrode and a body, a gate oxide layer may be broken down. When the breakdown is made, a parasitic PN diode may be formed between the gate electrode and the body. Before the breakdown is made, the PMOS transistor may be in an open state where a current hardly flows between the gate electrode and the body, data may correspond to 0. When the breakdown is made, a current may flow through the PN diode formed between the gate electrode and the body, data may correspond to 1.

Even in the OTP memory device 100" of FIG. 3B according to the present embodiment, the PMOS transistor may include a gate oxide layer (121/123 of FIG. 1) and a metal layer (120m of FIG. 1) having at least one layer. However, the PMOS transistor may be formed in an N-type well which is formed in a semiconductor substrate. Also, the metal layer having at least one layer may be formed of p-type metal.

For reference, n-type metal may denote metal configuring a gate electrode of an NMOS transistor, and p-type metal may denote metal configuring a gate electrode of a PMOS transistor. Generally, the n-type metal may include an aluminium (Al) compound containing titanium (Ti) or tantalum (Ta). For example, the n-type metal may include an Al compound such as TiAlC, TiAlN, TiAlC—N, or TiAl, or the like. However, a material of the n-type meal is not limited to the materials. The p-type metal may include at least one of molybdenum (Mo), palladium (Pd), ruthenium (Ru), platinum (Pt), TiN, WN, TaN, iridium (Ir), TaC, RuN, and MoN. Particularly, TiN may be mainly used as the p-type metal. However, a material of the p-type meal is not limited to the materials.

Figure 4:
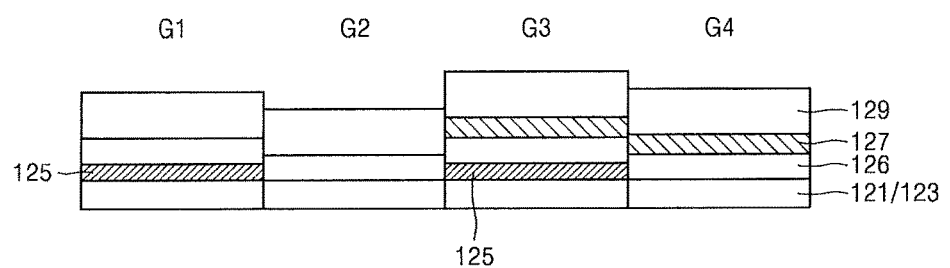
FIG. 4 is a cross-sectional view for describing one or more gate structures applied to a transistor of an OTP memory device according to an embodiment.

FIG. 4 is a cross-sectional view for describing one or more gate structures applied to a transistor of an OTP memory device according to an embodiment.

Referring to FIG. 4, the OTP memory device according to the present embodiment may include a program transistor T0 and a read transistor T1. A gate structure of each of the program transistor T0 and the read transistor T1 may include various material layers. For example, as illustrated in the leftmost portion, a first gate structure G1 of each of the program transistor T0 and the read transistor T1 may include an interface layer/high-k dielectric layer 121/123, an RE supply layer 125, a barrier metal layer 126, and a second metal layer 129.

In FIG. 4, the interface layer/high-k dielectric layer 121/123 is illustrated as one layer, but an interface layer 121 and a high-k dielectric layer 123 may be different layers. In detail, the interface layer 121 may be formed on a semiconductor substrate 101 and may be thinly formed of an insulating material such as oxide, nitride, oxynitride, or the like. For example, the interface layer 121 may be formed of silicon oxide ($SiO_2$), silicon oxynitride (SiON), and/or the like. The interface layer 121 may configure a gate oxide layer along with the high-k dielectric layer 123.

The high-k dielectric layer 120 may be referred to as a high-k layer and may be formed of a dielectric material having a high dielectric constant (k). The high-k dielectric layer 123 may be formed of a hafnium (Hf)-based material or a zirconium (Zr)-based material. For example, the high-k dielectric layer 123 may include hafnium oxide ($HfO_2$), hafnium silicon oxide (HfSiO), hafnium silicon oxynitride (HfSiON), hafnium oxynitride (HfON), hafnium aluminum oxide (HfAlO), hafnium lanthanum oxide (HfLaO), zirconium oxide ($ZrO_2$), zirconium silicon oxide (ZrSiO), and/or the like.

Moreover, a material of the high-k dielectric layer 123 is not limited to the Hf-based material or the Zr-based material. In other embodiments, the high-k dielectric layer 123 may include another material, for example, lanthanum oxide ($La_2O_3$), lanthanum aluminum oxide ($LaAlO_3$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), lead scandium tantalum oxide ($PbSc_{0.5}Ta_{0.5}O_3$), lead zinc niobate oxide ($PbZnNbO_3$), and/or the like.

The high-k dielectric layer 123 may be formed through various deposition methods such as an atomic layer deposition (ALD) method, a chemical vapor deposition (CVD) method, a physical vapor deposition (PVD) method, etc. Subsequently, in order to adjust the number of REs diffused from the RE supply layer 125, a film material structure and a layer thickness may be adjusted in forming the high-k dielectric layer 123, A thermal treatment or related technique may be performed with respect to the high-k dielectric layer 123.

The RE supply layer 125 may be formed on the interface layer/high-k dielectric layer 121/123 and may include an RE. For example, the RE supply layer 125 may include at least one of lanthanum (La), scandium (Se), erbium (Er), strontium (Sr), and yttrium (Yt), but is not limited thereto. In other embodiments, the RE supply layer 125 may include another RE. In the first gate structure G1, the RE supply layer 125 may include lanthanum oxide (LaO).

The RE supply layer 125 may supply an RE to an interface between the interface layer 121 and the high-k dielectric layer 123 through diffusion of materials. The RE on the interface between the interface layer 121 and the high-k dielectric layer 123 may form a dipole along with a material (for example, $SiO_2$ or SiON) of the interface layer 121, thereby changing a threshold voltage (Vt) of the program transistor T0 or the read transistor T1 which includes the first gate structure G1 and the active region ACT. Generally, by supplying the RE to the interface between the interface layer 121 and the high-k dielectric layer 123, a threshold voltage (Vt) of the NMOS transistor may be lowered, and/or a threshold voltage (Vt) of the PMOS transistor may be increased.

The barrier metal layer 126 may be formed on the RE supply layer 125 to prevent the RE from being diffused to a second metal layer 129. Also, the barrier metal layer 126 enables the second metal layer 129 to be easily deposited. The barrier metal layer 126 may include metal nitride. The metal nitride may include, for example, titanium (Ti), tantalum (Ta), tungsten (W), ruthenium (Ru), niobium (Nb), molybdenum (Mo), hafnium (Hf), lanthanum (La), or a combination thereof. In the first gate structure G1 according to the present embodiment, the barrier metal layer 126 may be formed of a double layer which includes a TiN layer and a TaN layer. Also, in the first gate structure GI according to the present embodiment, the barrier metal layer 126 may be omitted.

The second metal layer 129 may be formed on the barrier metal layer 126, and for example, may be formed of n-type metal. For example, when the second metal layer 129 is formed of the n-type metal, the second metal layer 129 may include an Al compound containing Ti or Ta. For example, the second metal layer 129 may include an Al compound such as TiAlC, TiAlN, TiAlC—N, or TiAl or an Al compound such as TaAlC, TaAlN, TaAlC—N, or TaAl. However, a material of the second metal layer 129 as the n-type meal is not limited to the materials. The second metal layer 129 may be formed of p-type metal without being limited to the n-type metal. When the second metal layer 129 is formed of the p-type metal, the second metal layer 129 may include at least one of molybdenum (Mo), palladium (Pd), ruthenium (Ru), platinum (Pt), TiN, WN, TaN, iridium (Ir), TaC, RuN, and MoN. However, a material of the second metal layer 129 as the p-type meal is not limited to the materials. The second metal layer 129 may be formed of a multilayer including two or more layers instead of a single layer.

Referring again to the first gate structure G1 according to the present embodiment, the second metal layer 129 may be formed of n-type metal and may include Al. For example, the second metal layer 129 may be formed as a TiAlC layer. In the first gate structure G1 according to the present embodiment, the second metal layer 129 and the barrier metal layer 126 may configure a metal electrode. For reference, 'second' of the second metal layer 129 is attached in consideration of a case where the first metal layer 127 is formed under the second metal layer 129 in other gate structures G3 and G4.

As an example of another gate structure of each of the program transistor T0 and the read transistor T1, a second gate structure G2 second close to the left may include an interface layer/high-k dielectric layer 121/123, a barrier metal layer 126, and a second metal layer 129. That is, the second gate structure G2 may have a structure that does not include an RE supply layer, i.e., where the RE supply layer 125 of the first gate structure G1 is omitted. The interface layer/high-k dielectric layer 121/123, barrier metal layer 126, and second metal layer 129 of the second gate structure G2 are similar to the above description of the first gate structure G1.

As an example of another gate structure of each of the program transistor T0 and the read transistor T1, a fourth gate structure G4 disposed on an end of the right may include an interface layer/high-k dielectric layer 121/123, a barrier metal layer 126, a first metal layer 127, and a second metal layer 129. The interface layer/high-k dielectric layer 121/123, the barrier metal layer 126, and the second metal layer 129 are similar to the above description of the first gate structure G1.

The first metal layer 127 may be formed on the barrier layer 126 and may include a nitride of Ti, a nitride of Ta, an oxynitride of Ti, or an oxynitride of Ta. For example, the first metal layer 127 may include a two-element metal nitride such as TiN, TaN, and/or the like, a three-element metal nitride such as TiAlN, TaAlN, TiSiN, and/or the like, or an oxidized form thereof (i.e., metal oxynitride). In a fourth gate structure G4 according to the present embodiment, the first metal layer 127 may be formed as a p-type TiN layer.

The first metal layer 127 may be formed through various deposition methods such as the ALD method, the CVD method, the PVD method, etc. The first metal layer 127 may configure a metal electrode of the fourth gate structure G4 along with the second metal layer 129 and may have a function of adjusting a work function of the metal electrode. Therefore, the first metal layer 127 may be referred to as a work function adjustment layer. For example, Al of the second metal layer 129 may be injected into the first metal layer 127 through diffusion to adjust the work function of the metal electrode, and moreover, electrons may move between the first metal layer 127 and the second metal layer 129 to adjust the work function. Since the work function is adjusted by the diffusion of Al and the movement of the electrons, a threshold voltage of the fourth gate structure G4 may be determined. As a more detailed example, when the first metal layer 127 is formed as the p-type TiN layer, a threshold voltage of the NMOS transistor may be lowered as the first metal layer 127 becomes thinner, and a threshold voltage of the PMOS transistor may be lowered as the first metal layer 127 becomes thicker. Even in the fourth gate structure G4, the barrier metal layer 126 may configure a portion of the metal electrode.

The third gate structure G3 shown in FIG. 4 may have a structure where the RE supply layer 125 is further added into the fourth gate structure G4 or a structure where the first metal layer 127 is further added into the first gate structure G1. That is, the third gate structure G3 may include an interface layer/high-k dielectric layer 121/123, an RE supply layer 125, a barrier metal layer 126, a first metal layer 127, and a second metal layer 129.

In the OTP memory device according to the present embodiment, the program transistor T0 and the read transistor T1 may each include one of the first gate structure G1, the second gate structure G2, and the fourth gate structure G4. The first gate structure G1, the second gate structure G2, and the fourth gate structure G4 may be simultaneously formed in the CMOS process. For example, a plurality of MOS transistors having various threshold voltages may be formed by using a multi-work function metal layer in the CMOS process, and the first gate structure G1, the second gate structure G2, and the fourth gate structure G4 may be simultaneously formed in the CMOS process. Since the first gate structure G1, the second gate structure G2, and the fourth gate structure G4 are simultaneously formed in the CMOS process, an additional mask and process is unnecessary, and a manufacturing process is efficient as compared to other devices.

For reference, considering a level of a threshold voltage on the assumption that NMOS transistors are implemented with the first gate structure G1, the second gate structure G2, the third gate structure G3, and the fourth gate structure G4, the threshold voltage may increase in the order of the first gate structure G1, the second gate structure G2, the third gate structure G3, and the fourth gate structure G4. Since the first gate structure G1 includes the RE supply layer 125, the first gate structure G1 may be lower in threshold voltage than the second gate structure G2. Also, since the second gate structure G2 does not include the first metal layer 127, the second gate structure G2 may be lower in threshold voltage than the fourth gate structure G4. Since the third gate structure G3 includes the RE supply layer 125, the third gate structure G3 may have a lower threshold voltage than the fourth gate structure G4. Generally, a threshold voltage adjustment function of the first metal layer 127 is better than that of the RE supply layer 125, and thus, the second gate structure G2 may be lower in threshold voltage than the third gate structure G3.

Considering a breakdown voltage (i.e., a level of the programming voltage) for breaking down the gate oxide layer, the breakdown voltage may increase in the order of the second gate structure G2, the first gate structure G1, the fourth gate structure G4, and the third gate structure G3. The thinner the thickness of the metal electrode, the lower the breakdown voltage. Also, the thinner the thickness of the gate oxide layer, the lower the breakdown voltage. Here, the gate oxide layer may include an interface layer 121, a high-k dielectric layer 123, and an RE supply layer 125. Based on such a reference, the second gate structure G2 may be the thinnest in thickness of each of the metal electrode and the gate oxide layer. Thus, the breakdown voltage of the second gate structure G2 may be the lowest. The RE supply layer 125 is generally formed to have a very thin thickness of 10 nm and is to be directly broken down, and thus, the breakdown voltage of the first gate structure G1 may be next higher after the breakdown voltage of the second gate structure G2. Next, the breakdown voltage may increase in the order of the fourth gate structure G4 and the third gate structure G3 according to whether the RE supply layer 125 is provided.

In the OTP memory device according to the present embodiment, the program transistor T0 and the read transistor T1 may be implemented using one of the first gate structure G1, the second gate structure G2, and the fourth gate structure G4 instead of the third gate structure G3 where the breakdown voltage is high. Thus, the gate oxide layer is broken down by applying the low breakdown voltage, i.e., the programming voltage, to the program transistor T0, whereby programming is easily performed.

As a detailed example, when the program transistor T0 is implemented with the third gate structure G3, the breakdown voltage of 4 V or more, i.e., the programming voltage, may be used for causing breakdown. On the other hand, when the program transistor T0 is implemented with the second gate structure G2, the low breakdown voltage of 3.75 V or less may be used. In other words, in a case of programming the program transistor T0 implemented with the third gate structure G3 and the second gate structure G2, the program transistor T0 implemented with the second gate structure G2 may be programmed by 100% with a voltage of about 3.75 V, but the program transistor T0 implemented with the third gate structure G3 may be programmed by 100% by applying a voltage of 4.0 V or more. On the other hand, when a voltage of about 3.75 V is applied, the program transistor T0 implemented with the third gate structure G3 may be programmed by about 90%.

Figure 5A:
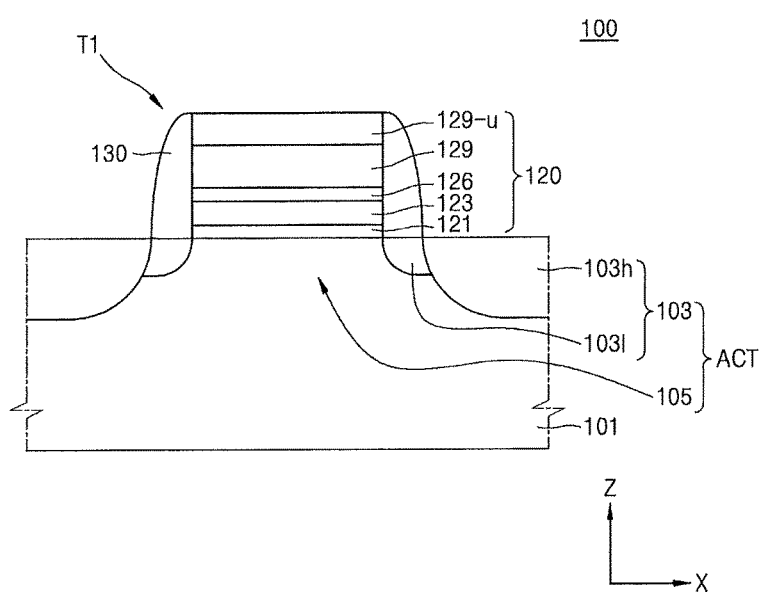
FIGS. 5A to 5C are cross-sectional views illustrating a transistor structure of an OTP memory device according to an embodiment.
Figure 5B:
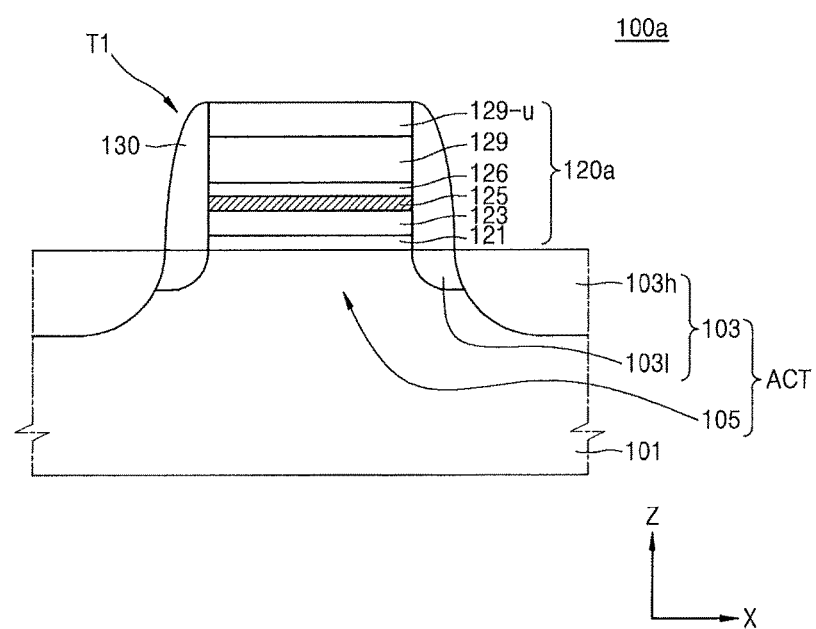
Figure 5C:
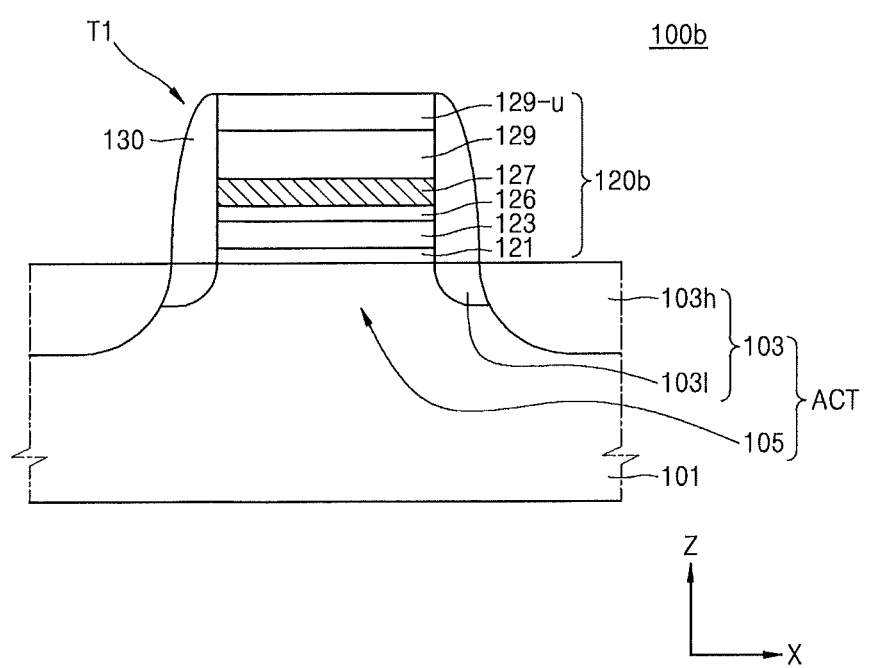

FIGS. 5A to 5C are cross-sectional views illustrating a transistor structure of an OTP memory device according to an embodiment.

Referring to FIG. 5A, an OTP memory device 100 according to the present embodiment shows in detail the read transistor T1 in the OTP memory device 100 of FIG. 1. As described above, in the OTP memory devices of FIGS. 1 and 5A, a structure of a gate structure of each of a program transistor T0 and a read transistor T1 may be substantially the same. Depending on the kind of the OTP memory device, a source/drain structure may have a slight difference. Thus, the following description will be made with reference to a structure of the read transistor T1 which is common, and the following other embodiments are similar.

In the OTP memory device 100 according to the present embodiment, the read transistor T1 may include an active region ACT, a gate structure 120, and a spacer 130. The active region ACT and the spacer 130 are as described above with reference to FIG. 1. The gate structure 120 may include an interface layer 121, a high-k dielectric layer 123, a barrier metal layer 126, a second metal layer 129, and a gap-fill metal layer 129-u. The interface layer 121, the high-k dielectric layer 123, the barrier metal layer 126, and the second metal layer 129 are described above with reference to FIG. 4.

The gap-fill metal layer 129-u may be formed on the second metal layer 129 and may include tungsten (W) or the like. The gap-fill metal layer 129-u may be a metal layer that finally fills a gap remaining after other metal layers are formed in forming a replacement metal gate (RMG) structure. The gap-fill metal layer 129-u, as illustrated, may configure an uppermost metal layer of the gate structure 120 having a planar structure. A material of the gap-fill metal layer 129-u is not limited to tungsten. The gap-fill metal layer 129-u may be formed of various metals suitable to fill a gap. For example, the gap-fill metal layer 129-u may include a material selected from the group consisting of metal nitride such as TiN or TaN, Al, metal carbide, metal silicide, metal aluminum carbide, metal aluminum nitride, and metal silicon nitride, or the like. Depending on the case, the gap-fill metal layer 129-u may be omitted from the configuration of the memory device 100.

In the OTP memory device 100 according to the present embodiment, the gate structure 120 may be similar to the second gate structure G2 of FIG. 4. That is, except for the gap-fill metal layer 129-u, the gate structure 120 may be substantially the same as the second gate structure G2 of FIG. 4. As described above, description is made with reference to the read transistor T1, but a gate structure of the program transistor T0 may also have the same structure as that of the gate structure 120 of the read transistor T1. Therefore, the OTP memory device 100 according to the present embodiment has the above-described good characteristics. That is, the program transistor T0 and read transistor T1 of the OTP memory device 100 according to the present embodiment may be formed along with transistors disposed in another region by a CMOS process or the like. Also, the gate structure 120 of each of the program transistor T0 and the read transistor T1 may be formed as the second gate structure G2, breakdown is caused by applying a low programming voltage, thereby enhancing the programming efficiency of the OTP memory device 100, increasing reliability of peripheral I/O elements used for a design of the OTP memory device 100, and simplifying the design.

Referring to FIG. 5B, in an OTP memory device 100a according to the present embodiment, a gate structure 120a of a read transistor T1 may distinguish from the memory device 100 of FIG. 5A in that the memory device 100a may further include an RE supply layer 125. That is, in the OTP memory device 100a according to the present embodiment, the gate structure 120a of the read transistor T1 may include the RE supply layer 125 on a high-k dielectric layer 123 and thus may have a structure similar to that of the first gate structure G1 of FIG. 4. That is, except for the gap-fill metal layer 129-u, the gate structure 120a may be substantially the same as the first gate structure G1 of FIG. 4. Also, in the OTP memory device 100a according to the present embodiment, a gate structure of a program transistor T0 may have a structure which is substantially the same as that of the gate structure 120a of the read transistor T1.

Referring to FIG. 5C, in an OTP memory device 100b according to the present embodiment, a gate structure 120b of a read transistor T1 may further distinguish from the memory device 100 of FIG. 5A in that the memory device 100a may include a first metal layer 127. That is, in the OTP memory device 100b according to the present embodiment, the gate structure 120b of the read transistor T1 may include the first metal layer 127 on a barrier metal layer 126 and may have a structure similar to that of the fourth gate structure G4 of FIG. 4. That is, except for the gap-fill metal layer 129-u, the gate structure 120b may be substantially the same as the fourth gate structure G4 of FIG. 4. Also, in the OTP memory device 100b according to the present embodiment, a gate structure of a program transistor T0 may have a structure which is substantially the same as that of the gate structure 120b of the read transistor T1.

Figure 6A:
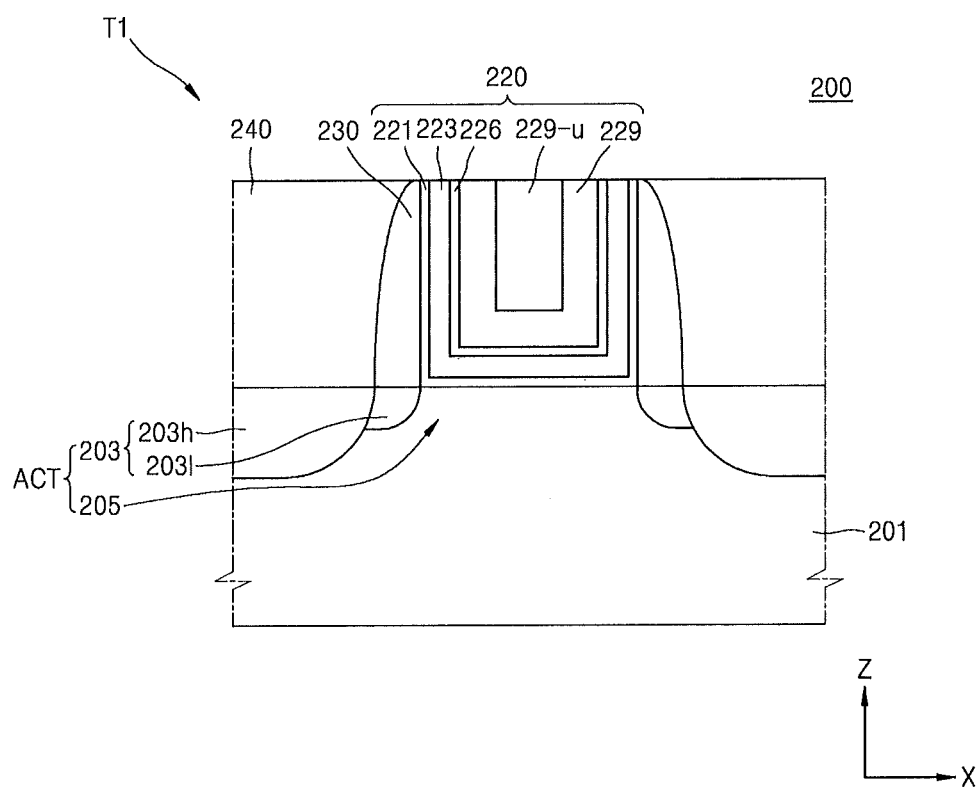
FIGS. 6A to 6C and 7 are cross-sectional views illustrating a transistor structure of an OTP memory device according to an embodiment.
Figure 6B:
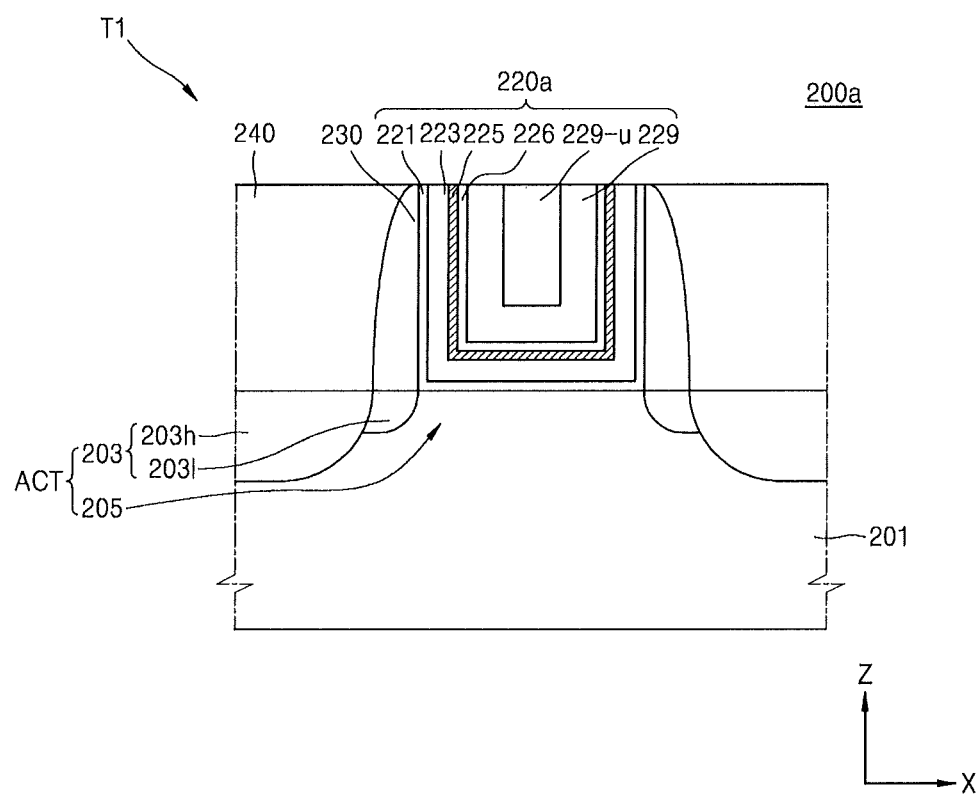
Figure 6C:
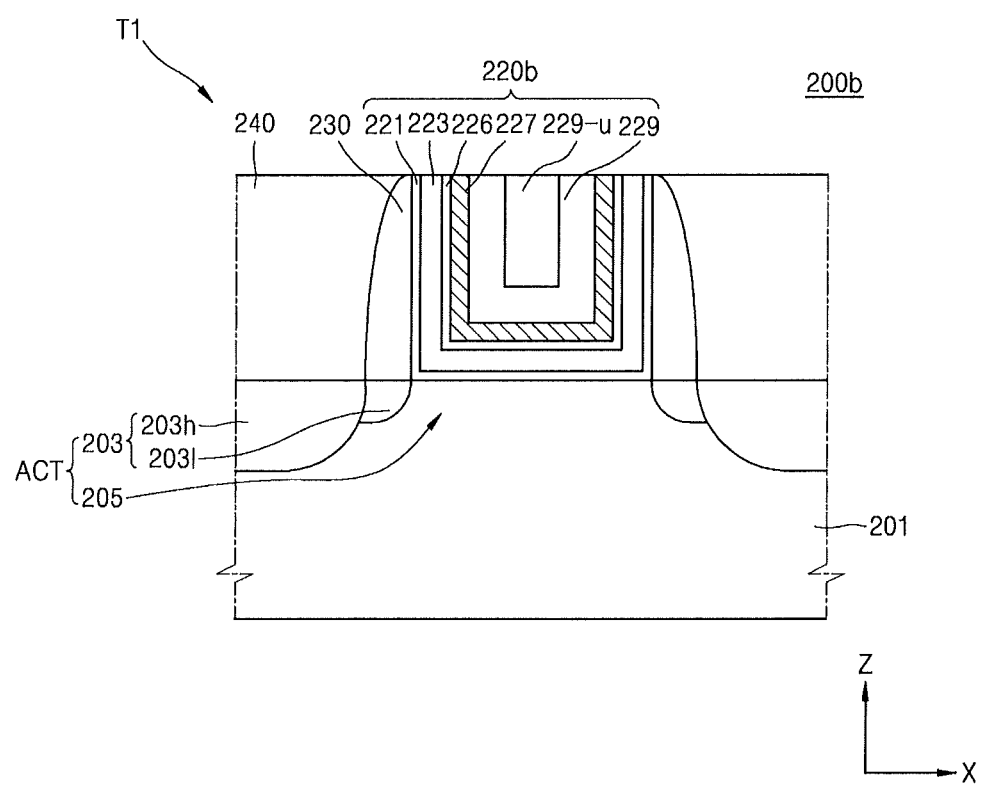
Figure 7:
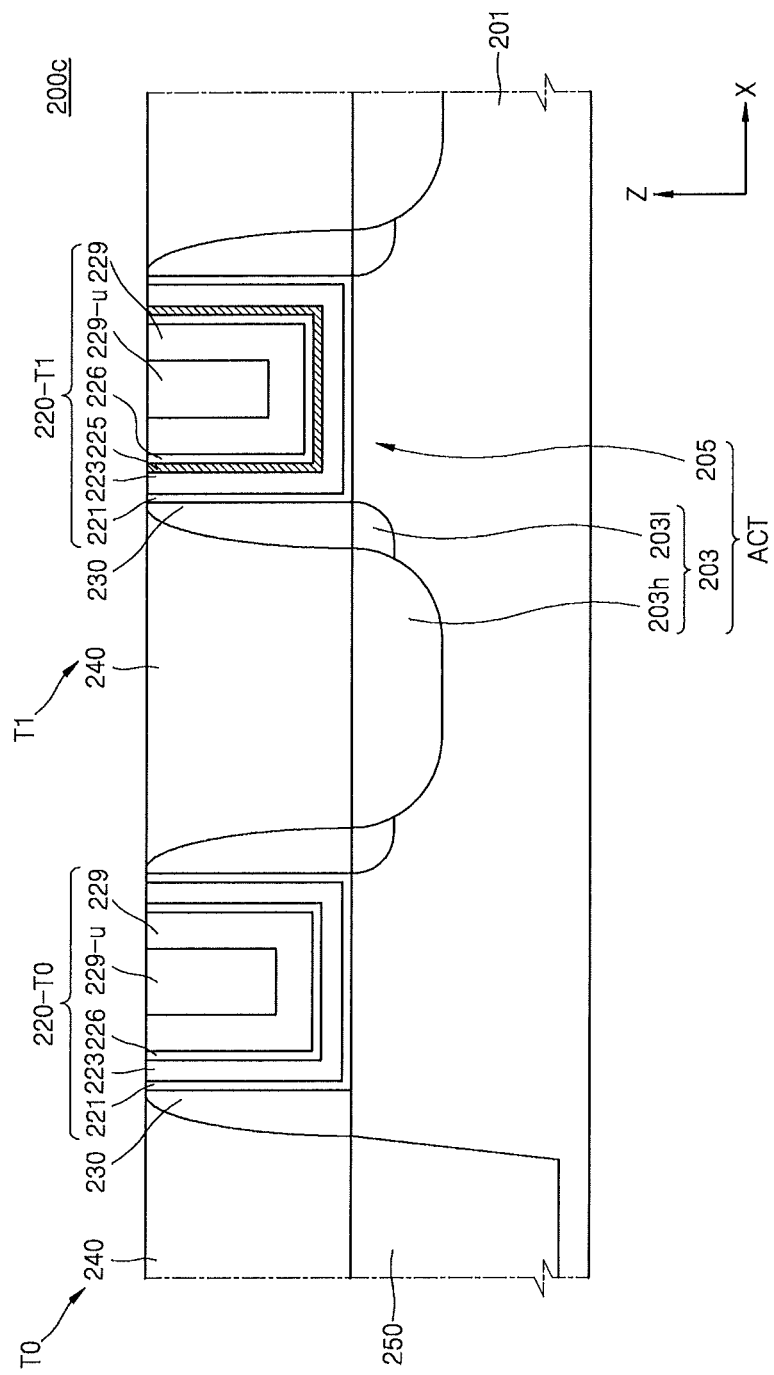

FIGS. 6A to 7 are cross-sectional views illustrating a transistor structure of an OTP memory device according to an embodiment.

Referring to FIG. 6A, an OTP memory device 200 according to the present embodiment may have an RMG structure unlike the OTP memory device 100 of FIG. 5A. For example, the RMG structure may include a metal gate that is formed in a portion from which a dummy gate is removed after a source/drain region is formed by using a dummy gate structure, and may be referred to as a gate last structure.

A read transistor T1 included in the OTP memory device 200 according to the present embodiment may include an active region ACT, a gate structure 220, and a spacer 230. The active region ACT may be defined in an upper portion of a semiconductor substrate 201 by an isolation layer. The active region ACT may include a source/drain region 203 and a channel region 205. The source/drain region 203 may include a high-concentration doping region 203h and a low-concentration doping region 203l (collectively, 203).

The gate structure 220 may include an interface layer 221, a high-k dielectric layer 223, a barrier metal layer 226, a second metal layer 229, and a gap-fill metal layer 229-u. The spacer 230 may be formed on both sides of the gate structure 220. Also, the spacer 230 may be surrounded by an interlayer insulation layer 240. The interlayer insulation layer 240 may be formed on the semiconductor substrate 201, and particularly, may be formed in a portion where the gate structure 220 and the spacer 230 are not provided, whereby the interlayer insulation layer 240 may surround a side of the spacer 230.

A layered structure of the gate structure 220 may be similar to that of the gate structure 120 of the read transistor T1 included in the OTP memory device 100 of FIG. 5A. However, each of the layers configuring the gate structure 220 may be formed in a structure that surrounds a top of the semiconductor substrate 201 and the side of the spacer 230. In detail, the interface layer 221 may be formed on the top of the semiconductor substrate 201 and the side of the spacer 230. The high-k dielectric layer 223 may be formed on a top of a floor layer and both sides of the interface layer 221, and may include side and bottom portions sandwiched between the interface layer 221 and the barrier metal layer 226. Also, the barrier metal layer 226, the second metal layer 229, and the gap-fill metal layer 229-u may be sequentially formed on a top of a floor layer and both sides of a lower layer. Also, as illustrated, the gap-fill metal layer 229-u may be formed in a structure that fills a trench or a gap remaining after the second metal layer 229 is formed. Therefore, when there is no gap remaining after the second metal layer 229 is formed, the gap-fill metal layer 229-u may be omitted from the configuration of the memory device 100.

The function or material of each of the layers configuring the gate structure 220 is as described above with reference to FIG. 4 or 5A. Except that the gate structure 220 has a layered structure which is formed in a U-shape instead of a plate shape, the gate structure 220 may be similar to the second gate structure G2 of FIG. 4. That is, notwithstanding a shape of the layered structure, in a state where the gap-fill metal layer 229-u is excluded from the gate structure 220, the gate structure 220 may be similar to the second gate structure G2 of FIG. 4. Also, in the OTP memory device 200 according to the present embodiment, a gate structure of a program transistor T0 may have a structure which is substantially the same as that of the gate structure 220 of the read transistor T1.

Referring to FIG. 6B, in an OTP memory device 200a according to the present embodiment, a gate structure 220a of a read transistor T1 may further distinguish from the memory device 200 of FIG. 6A in that the memory device 200a may include an RE supply layer 225. That is, in the OTP memory device 200a according to the present embodiment, the gate structure 220a of the read transistor T1 may include the RE supply layer 125 on a high-k dielectric layer 123. Except for a shape of a layered structure and a gap-fill metal layer 229-u, the gate structure 220a of the read transistor T1 may have a structure similar to that of the first gate structure G1 of FIG. 4. Also, in the OTP memory device 200a according to the present embodiment, a gate structure of a program transistor T0 may have a structure which is substantially the same as that of the gate structure 220a of the read transistor T1.

Referring to FIG. 6C, in an OTP memory device 200b according to the present embodiment, a gate structure 220b of a read transistor T1 may further include a first metal layer 227, and for this reason, the OTP memory device 200b may differ from the OTP memory device 200 of FIG. 6A. That is, in the OTP memory device 200b according to the present embodiment, the gate structure 220b of the read transistor T1 may include the first metal layer 227 on a barrier metal layer 226, and thus, except for a shape of a layered structure and a gap-fill metal layer 229-u , the gate structure 220b of the read transistor T1 may have a structure similar to that of the fourth gate structure G4 of FIG. 4. Also, in the OTP memory device 200b according to the present embodiment, a gate structure of a program transistor T0 may have a structure which is substantially the same as that of the gate structure 220b of the read transistor T1.

Referring to FIG. 7, in an OTP memory device 200c according to the present embodiment, a gate structure 220-T0 of a program transistor T0 may have a structure that is different from that of a gate structure 220-T1 of a read transistor T1 unlike the OTP memory devices 220, 200a and 200b of FIGS. 6A to 6C, respectively. In detail, the gate structure 220-T0 of the program transistor T0 may have a structure of the gate structure 220 of the read transistor T1 illustrated in FIG. 6A. The gate structure 220-T1 of the read transistor T1 may have a structure of the gate structure 220a of the read transistor T1 illustrated in FIG. 6B.

In the OTP memory device 200c according to the present embodiment, for example, the program transistor T0, may include the gate structure 220-T0 which uses a minimum breakdown voltage, and the read transistor T1 may use the gate structure 220-T1 having a low threshold voltage. As described above, in the OTP memory device 200c according to the present embodiment, a gate structure may be formed to be suitable for characteristic of each of the program transistor T0 and the read transistor T1, thereby enhancing the performance and reliability of the OTP memory device 200c. However, the gate structure of the program transistor T0 and the gate structure of the read transistor T1 may be formed differently, causing an increase in difficulty of a process.

Figure 8:
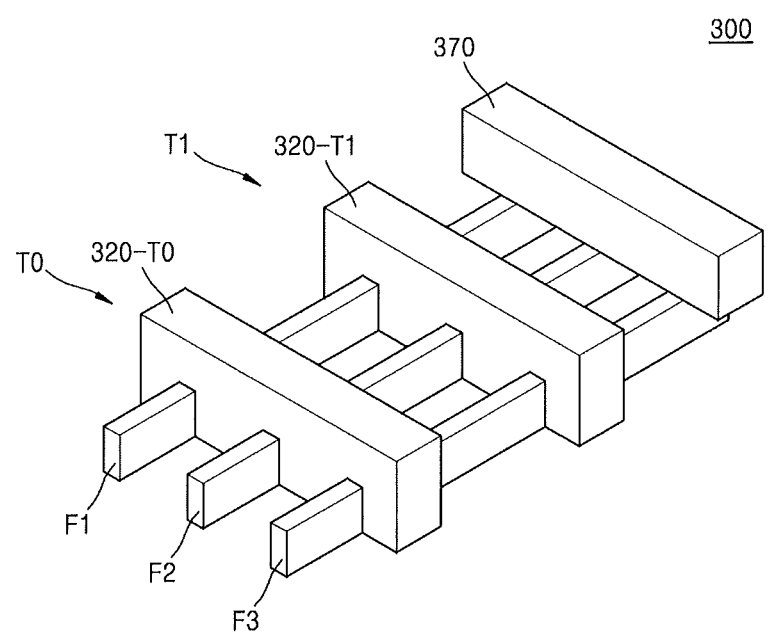
FIG. 8 is a perspective view schematically illustrating an OTP memory device according to an embodiment.

FIG. 8 is a perspective view schematically illustrating an OTP memory device 300 according to an embodiment.

Referring to FIG. 8, the OTP memory device 300 according to the present embodiment may include a program transistor T0 and a read transistor T1 which have a FinFET structure. The OTP memory device 300 may lower a programming voltage by using a multi-work function process in a FinFET process to increase a program yield rate, for example, described with respect to embodiments herein.

In detail, the program transistor T0 may include three active fins F1 to F3 and a gate structure 320-T0, and the read transistor T1 may include three active fins F1 to F3 and a gate structure 320-T1.

The active fins F1 to F3, as illustrated, may protrude to above a semiconductor substrate, and may extend in one direction. The active fins F1 to F3 may correspond to the active region ACT in FIG. 1 or 5A. Therefore, although not shown in detail, the active fins F1 to F3 may include a source/drain region and a channel region. In OTP memory device 300 according to the present embodiment, the three active fins F1 to F3 may be configured for one unit cell, but the number of active fins configuring a unit cell is not limited to three. For example, one or two active fins may be configured for the unit cell, or four or more active fins may be configured for the unit cell.

Each of the gate structures 320-T0 and 320-T1 may cover tops and sides of the active fins F1 to F3 and may extend in one direction across the active fins F1 to F3. Although not shown in detail, each of the gate structures 320-T0 and 320-T1 may include a gate oxide layer and a metal layer having at least one layer and may be formed in a structure which uses a low breakdown voltage. Also, the gate structure 320-T0 of the program transistor T0 and the gate structure 320-T1 of the read transistor T1 may have the substantially same structure. A detailed structure of each of the gate structures 320-T0 and 320-T1 will be described in detail with reference to FIGS. 9A to 9C.

In FIG. 8, the active fins F1 to F3 may protrude and extend to one side of the program transistor T0, but is not limited thereto. In other embodiments, when the OTP memory device 300 is formed in a 1.5TR structure, the active fins F1 to F3 may not protrude to the one side of the program transistor T0. Since the three active fins F1 to F3 configure a unit cell, as illustrated, a bit line 370 may abut or otherwise contact all the three active fins F1 to F3.

Figure 9A:
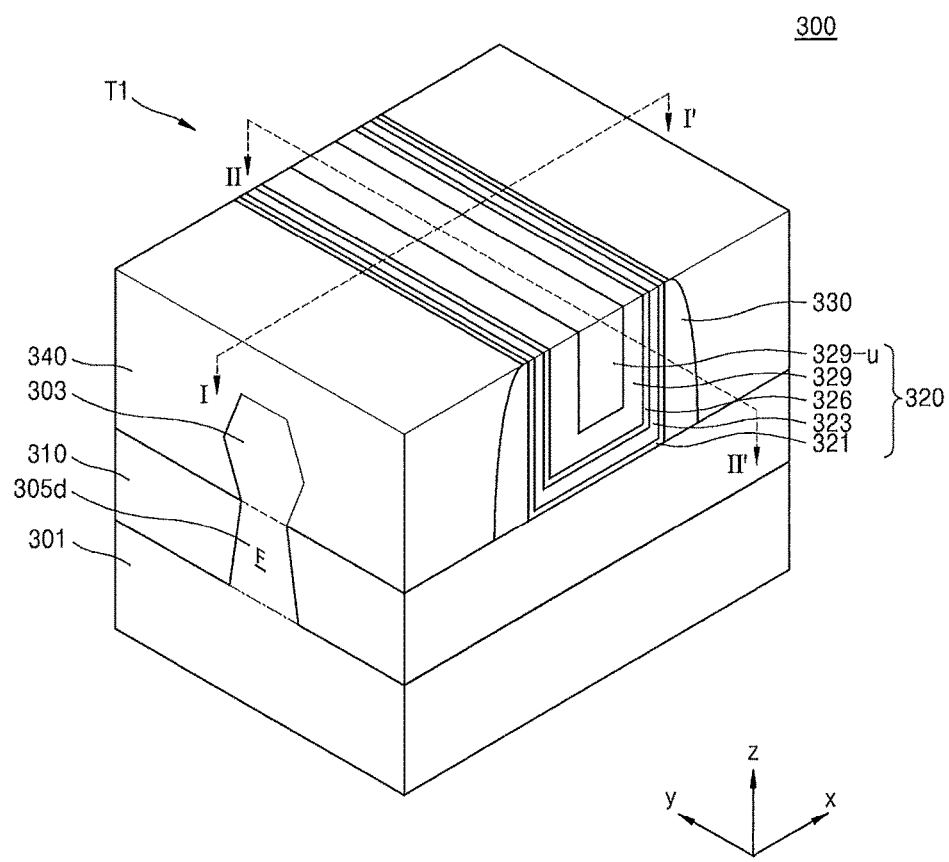
FIGS. 9A to 9C are perspective views and cross-sectional views illustrating a transistor structure of the OTP memory device illustrated in FIG. 8.
Figure 9B:
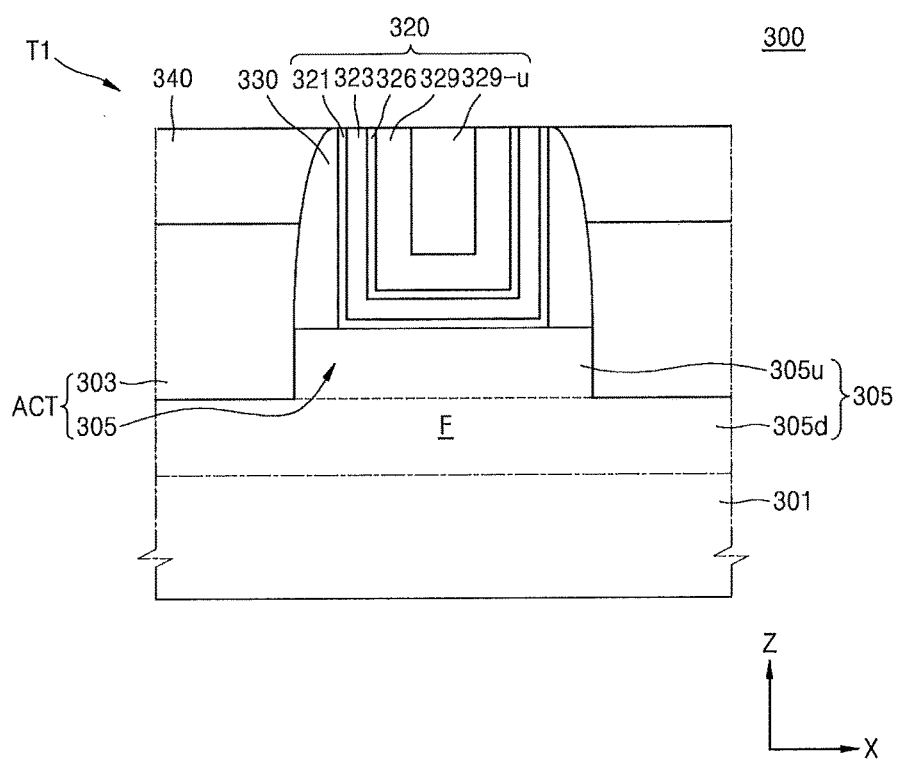
Figure 9C:
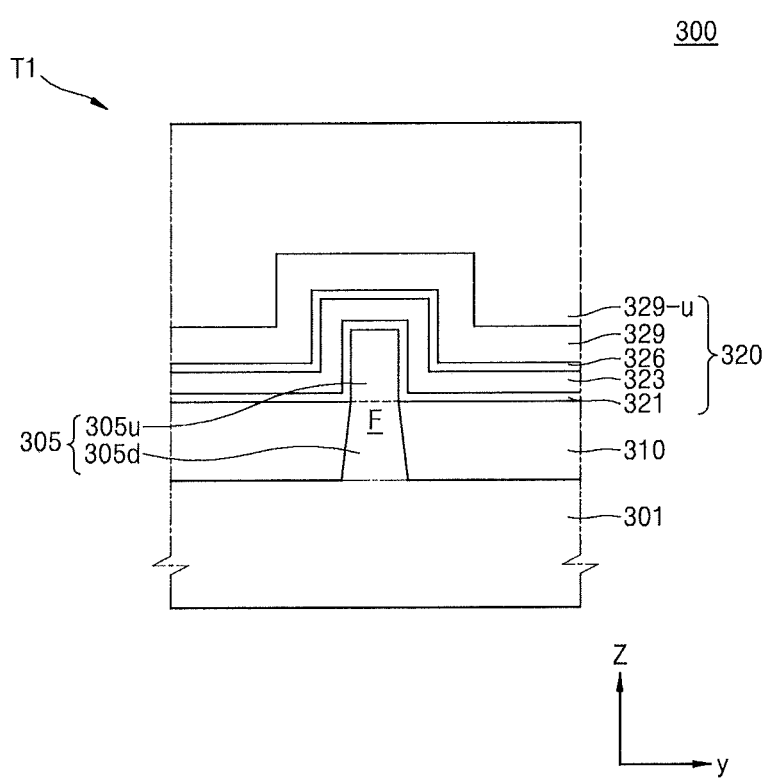

FIGS. 9A to 9C are perspective views and cross-sectional views illustrating a transistor structure of the OTP memory device 300 illustrated in FIG. 8. FIG. 9B is a cross-sectional view taken along line I-I' of FIG. 9A, and FIG. 9C is a cross-sectional view taken along line II-II' of FIG. 9A.

Referring to FIGS. 9A to 9C, the read transistor T1 of the OTP memory device 300 according to the present embodiment may include a semiconductor substrate 301, an active region (hereinafter referred to as a fin active region) ACT having a fin structure, and a gate structure 320. In detail, in the OTP memory device 300 according to the present embodiment, the read transistor T1 may include but not be limited to the semiconductor substrate 301, a fin active region ACT, an isolation layer 310, a gate structure 320, a spacer 330, and an interlayer insulation layer 340.

The semiconductor substrate 301 may correspond to the semiconductor substrate 101 of the OTP memory device 100 of FIG. 1 or 5A, and thus, its detailed description is not provided for brevity.

The fin active region ACT may be formed in a structure which protrudes from the semiconductor substrate 301 and may extend in a first direction (an x direction). The fin active region ACT may be provided in plurality along a second direction (a y direction) on the semiconductor substrate 301. The plurality of fin active regions ACT may be electrically insulated from each other by an isolation layer. The OTP memory device 300 according to the present embodiment may correspond to the OTP memory device 300 of FIG. 8. Therefore, three fin active regions ACT may be formed for configuring a unit cell, but for convenience, only one the fin active region ACT is illustrated. Also, as described above, one the fin active region ACT may be configured for the unit cell.

The fin active region ACT may include a fin 305 and a source/drain region 303. The fin 305 may include a lower fin portion 305d, both sides of which are surrounded by the isolation layer 310, and an upper fin portion 305u which protrudes from a top of the isolation layer 310. The upper fin portion 305u may be disposed under the gate structure 320 and may configure a channel region. The source/drain region 303 may be formed in an upper portion of the lower fin portion 305d on both sides of the gate structure 320.

The fin 305 may include a portion formed based on the semiconductor substrate 301. The source/drain region 303 may be formed of an epi-layer which grows in the lower fin portion 305d. Depending on the case, the upper fin portion 305u may be disposed on both sides of the gate structure 320 and may configure the source/drain region 303. For example, the source/drain region 303 may not be formed through a separate growth of the epi-layer, and similarly to the channel region, the source/drain region 303 may be formed as the upper fin portion 305u of the fin 305.

As described above, the fin 305 may be based on the semiconductor substrate 301, and when the source/drain region 303 is formed as the epi-layer growing in the lower fin portion 305d or is formed as the fin 305, the fin 305 may include silicon or germanium or related element of a semiconductor. Also, the fin 305 may include a compound semiconductor such as a Group IV-IV compound semiconductor or a Group III-V compound semiconductor. For example, the fin 305 may include, as a Group IV-IV compound semiconductor, a binary compound, a ternary compound, or a compound where a Group IV element is doped thereon, which includes two or more of carbon (C), silicon (Si), germanium (Ge), and tin (Sn). Also, for example, the fin 305 may include, as a Group III-V compound semiconductor, one of a binary compound, a ternary compound, and a quaternary compound which are produced by combining at least one of aluminum (Al), gallium (Ga), and indium (In), which are Group III elements, with one of phosphorus (P), arsenic (As), and antimony (Sb) which are Group V elements. A structure of the fin 305 and a method of forming the fin 305 will be described in detail with reference to FIGS. 20A to 29C.

The source/drain region 303 may be formed on both sides of the gate structure 320 and in the upper portion of the lower fin portion 305d. Depending on a channel type of a desired transistor, the source/drain region 303 may include a compressive stress material or a tensile stress material. For example, when a PMOS transistor is formed, the source/drain region 303 on both sides of the gate structure 320 may include a compressive stress material. In detail, when the lower fin portion 305d is formed of silicon, the source/drain region 303 may be formed of a material, for example, SiGe, which is a compressive stress material and is greater in lattice constant than silicon. Also, when an NMOS transistor is formed, the source/drain region 303 on both sides of the gate structure 320 may include a tensile stress material. In detail, when the lower fin portion 305d is formed of silicon, the source/drain region 303 may be formed of a material, for example, SiC, which is a tensile stress material and is silicon or a material less in lattice constant than silicon.

In addition, the OTP memory device 300 according to the present embodiment, the source/drain region 303 of the read transistor T1 may have various shapes. The source/drain region 303 may have various shapes such as diamond, circle, ellipse, polygon, etc. in a cross-sectional surface vertical to the first direction (the x direction). FIG. 9A exemplarily illustrates a hexagonal diamond shape.

The isolation layer 310 may be formed on the substrate 301 to surround both sides of the lower fin portion 305d of the fin 305. The isolation layer 310 may correspond to the isolation layer 110 of the OTP memory device 100 of FIG. 5A and may electrically isolate fins which are arranged along the second direction (the y direction). The isolation layer 310 may include, for example, at least one of silicon oxide, silicon nitride, silicon oxynitride, and a combination thereof.

The upper fin portion 305u of the fin 305 may have a protruding structure without being surrounded by the isolation layer 310. Also, as seen in FIGS. 9B and 9C, the upper fin portion 305u of the fin 305 may be disposed under only the gate structure 320 and may configure a channel region.

The gate structure 320 of the read transistor T1 may extend in the second direction (the y direction) across the fin 305 on the isolation layer 310. The gate structure 320 may be formed in a structure which surrounds a top and a side of the upper fin portion 305u.

The gate structure 320 of the read transistor T1 may correspond to the gate structure 220 of the read transistor T1 in the OTP memory device 200 of FIG. 6A. Therefore, the gate structure 320 shown in FIGS. 9A-9C may include but not be limited to an interface layer 321, a high-k dielectric layer 323, a barrier metal layer 326, a second metal layer 329, and a gap-fill metal layer 329-u. The material or function of each of the layers configuring the gate structure 320 is as described above with reference to FIG. 4, 5A or 6A. However, in the OTP memory device 300 according to the present embodiment, since the gate structure 320 is formed in a structure which covers the fin 305, a structure of the gate structure 320 may differ from that of the gate structure 220 of the OTP memory device 200 of FIG. 6A. Also, since the source/drain region 303 is formed on the lower fin portion 305d as illustrated in FIG. 9B, a structure of the source/drain region 303 of both sides of the gate structure 320 may differ from that of the source/drain region 203 of the OTP memory device 200 of FIG. 6A.

The interlayer insulation layer 340 may be formed on the isolation layer 310 to cover the source/drain region 303. For example, the interlayer insulation layer 340 may have a structure which surrounds a top and a side of the source/drain region 303. The interlayer insulation layer 340 may correspond to the interlayer insulation layer 240 of the OTP memory device 200 of FIG. 6A. Therefore, the material or function of the interlayer insulation layer 340 is as described in describing the OTP memory device 200 of FIG. 6A.

The spacer 330 may be formed between the interlayer insulation layer 340 and the gate structure 320. The spacer 330 may surround both sides of the gate structure 320 and extend in the second direction (the y direction). Also, similarly to the gate structure 320, the spacer 330 may cross the fin 305 and surround the top and side of the upper fin portion 305u. The spacer 330 may correspond to the spacer 230 of the OTP memory device 200 of FIG. 6A. Therefore, the material of the spacer 330 is as described in describing the OTP memory device 200 of FIG. 6A.

In the OTP memory device 300 according to the present embodiment, except for a shape of a layered structure and the gap-fill metal layer 329-u, the gate structure 320 may be similar to the second gate structure G2 of FIG. 4. As described above, the read transistor T1 is described by way of example, but a gate structure of a program transistor T0 may also have the same structure as that of the gate structure 320 of the read transistor T1. Therefore, the OTP memory device 300 according to the present embodiment may exhibit the above-described favorable characteristics. That is, the program transistor T0 and read transistor T1 of the OTP memory device 300 according to the present embodiment may be formed along with transistors disposed in another region by a CMOS process or the like. Also, since the gate structure 320 of each of the program transistor T0 and the read transistor T1 is formed as the second gate structure G2, breakdown is easily caused by applying a low programming voltage, thereby enhancing the programming efficiency of the OTP memory device 300, increasing reliability of peripheral I/O elements used for a design of the OTP memory device 300, and simplifying the design.

Figure 10:
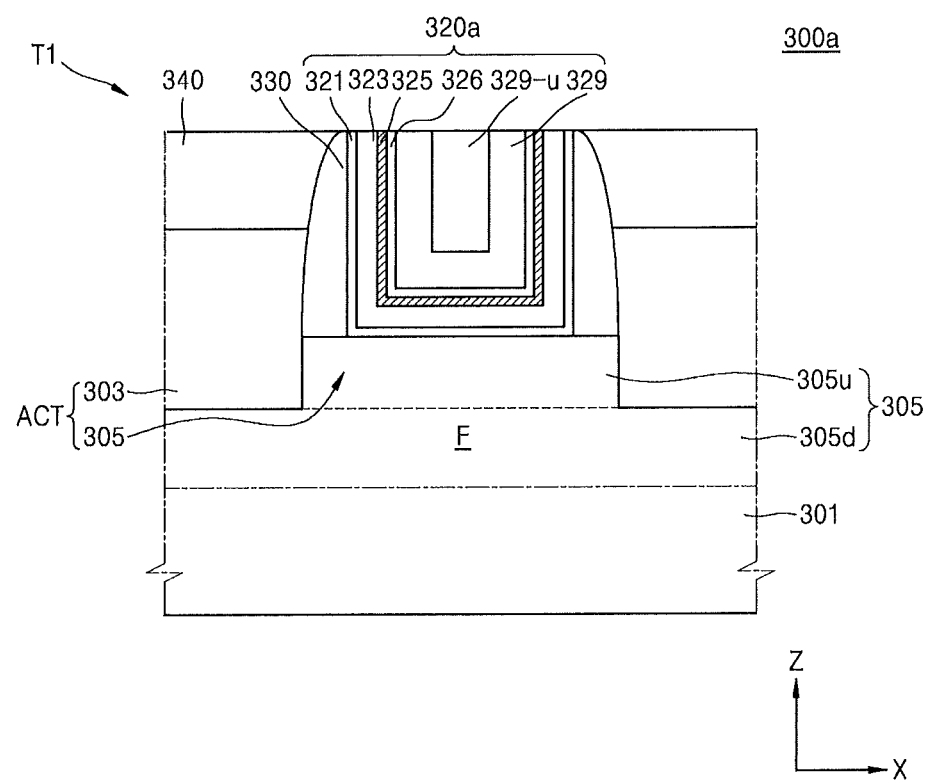
FIGS. 10 to 12 are cross-sectional views illustrating a transistor structure of an OTP memory device according to an embodiment.
Figure 11:
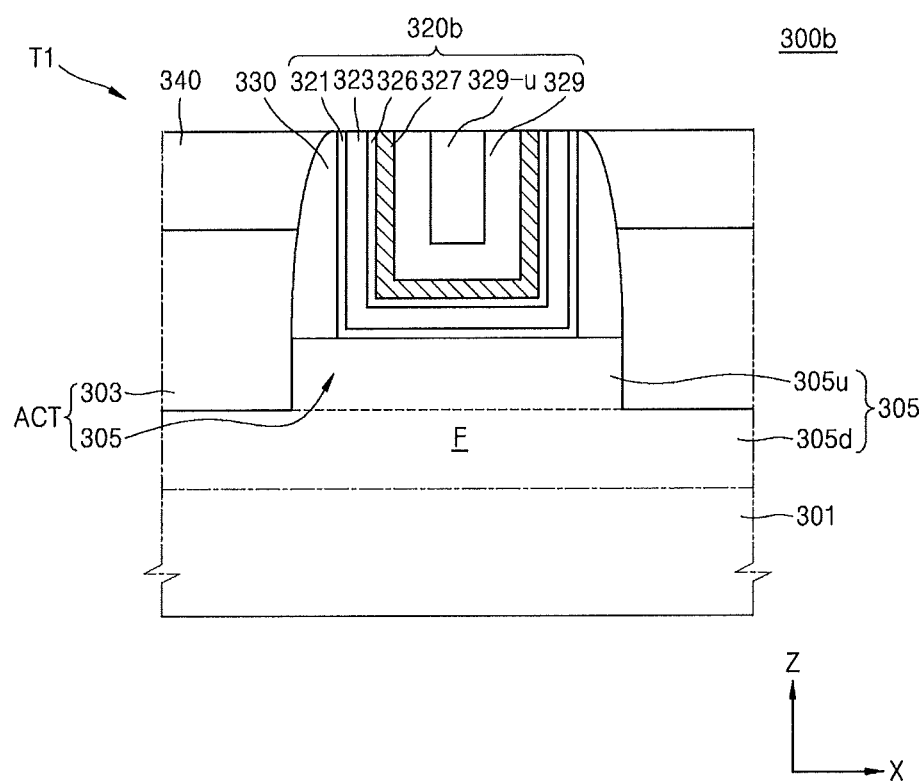
Figure 12:
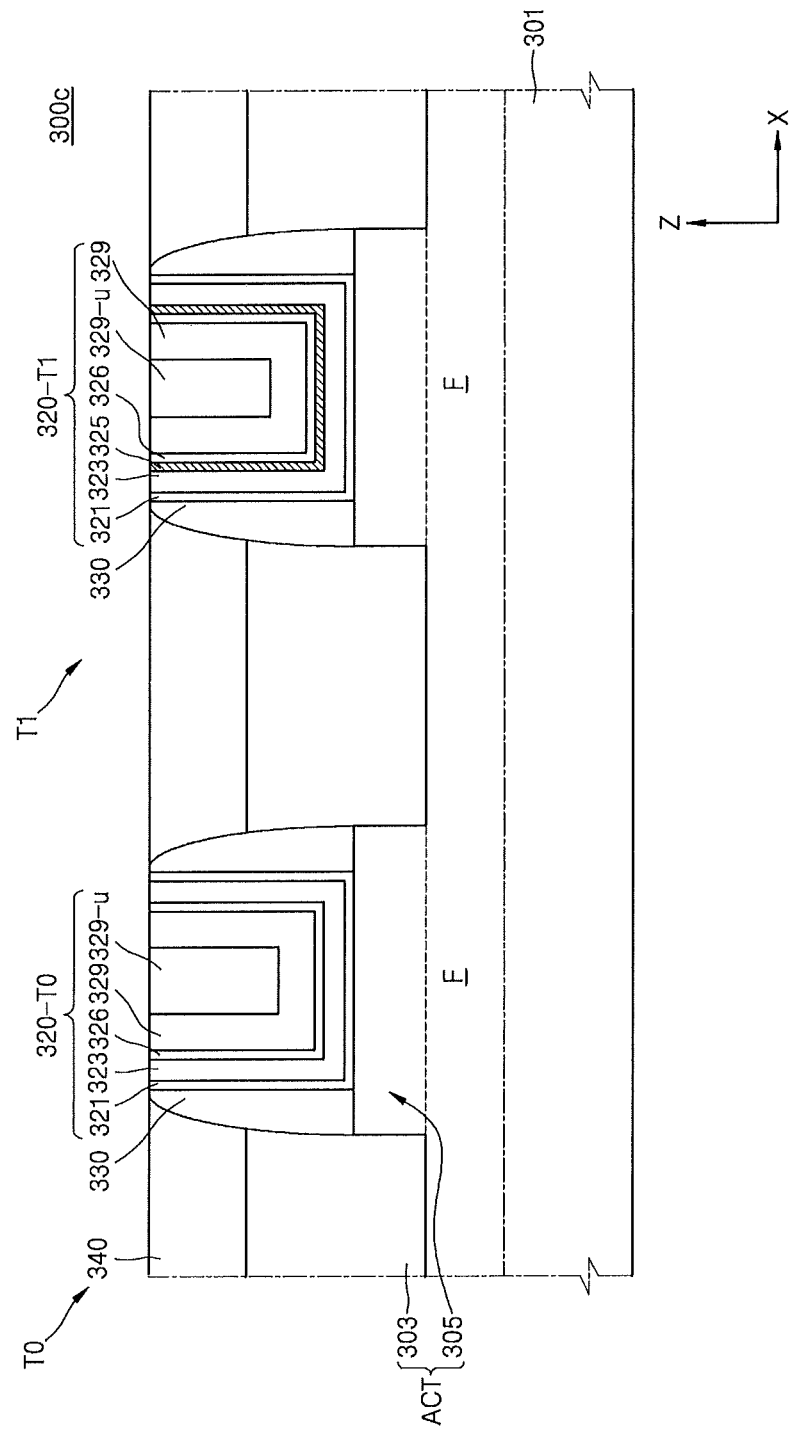

FIGS. 10 to 12 are cross-sectional views illustrating a transistor structure of an OTP memory device according to an embodiment.

Referring to FIG. 10, in an OTP memory device 300a according to the present embodiment, a gate structure 320a of a read transistor T1 may further include an RE supply layer 325, and for this reason, the OTP memory device 300a may differ from the OTP memory device 300 of FIG. 9A. That is, in the OTP memory device 300a according to the present embodiment, the gate structure 320a of the read transistor T1 may include the RE supply layer 325 on a high-k dielectric layer 323. Thus, except for a shape of a layered structure and a gap-fill metal layer 329-u, the gate structure 320a of the read transistor T1 may be similar to the first gate structure G1 of FIG. 4. Also, in the OTP memory device 300a according to the present embodiment, a gate structure of a program transistor T0 may be substantially the same as that of the gate structure 320a of the read transistor T1.

Referring to FIG. 11, in an OTP memory device 300b according to the present embodiment, a gate structure 320b of a read transistor T1 may further include a first metal layer 327, and for this reason, the OTP memory device 300b may differ from the OTP memory device 300 of FIG. 9A. That is, in the OTP memory device 300b according to the present embodiment, the gate structure 320b of the read transistor T1 may include the first metal layer 327 on a barrier metal layer 326. Thus, except for a shape of a layered structure and a gap-fill metal layer 329-u, the gate structure 320b of the read transistor T1 may be similar to the fourth gate structure G4 of FIG. 4. Also, in the OTP memory device 300b according to the present embodiment, a gate structure of a program transistor T0 may be substantially the same as that of the gate structure 320b of the read transistor T1.

Referring to FIG. 12, in an OTP memory device 300c according to the present embodiment, a gate structure 320-T0 of a program transistor T0 may have a structure different from that of a gate structure 320-T1 of a read transistor T1 unlike the OTP memory devices 300, 300a and 300b of FIGS. 9A to 11. In detail, the gate structure 320-T0 of the program transistor T0 may be similar to or the same as the gate structure 320 of the read transistor T1 illustrated in FIG. 9A. The gate structure 320-T1 of the read transistor T1 may be similar to or the same as the gate structure 320a of the read transistor T1 illustrated in FIG. 10.

In the OTP memory device 300c according to the present embodiment, for example, the program transistor T0 may include the gate structure 320-T0 which uses a minimum breakdown voltage. The read transistor T1 may use the gate structure 320-T1 having a low threshold voltage. As described above, in the OTP memory device 300c according to the present embodiment, the gate structures 320-T0 and 320-T1 may be formed to be suitable for characteristic of each of the program transistor T0 and the read transistor T1, thereby enhancing the performance and reliability of the OTP memory device 300c.

Figure 13:
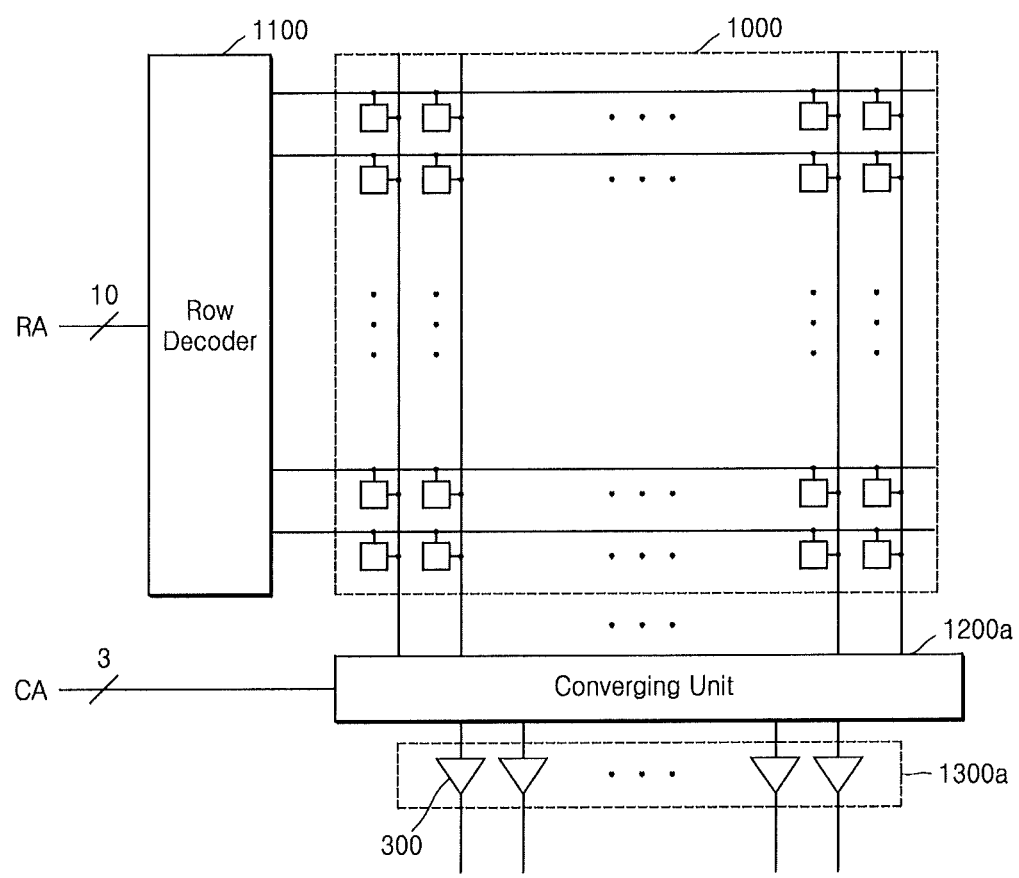
FIGS. 13 and 14 are circuit diagrams of OTP cell arrays where OTP memory devices are arranged as unit cells, according to embodiments.
Figure 14:
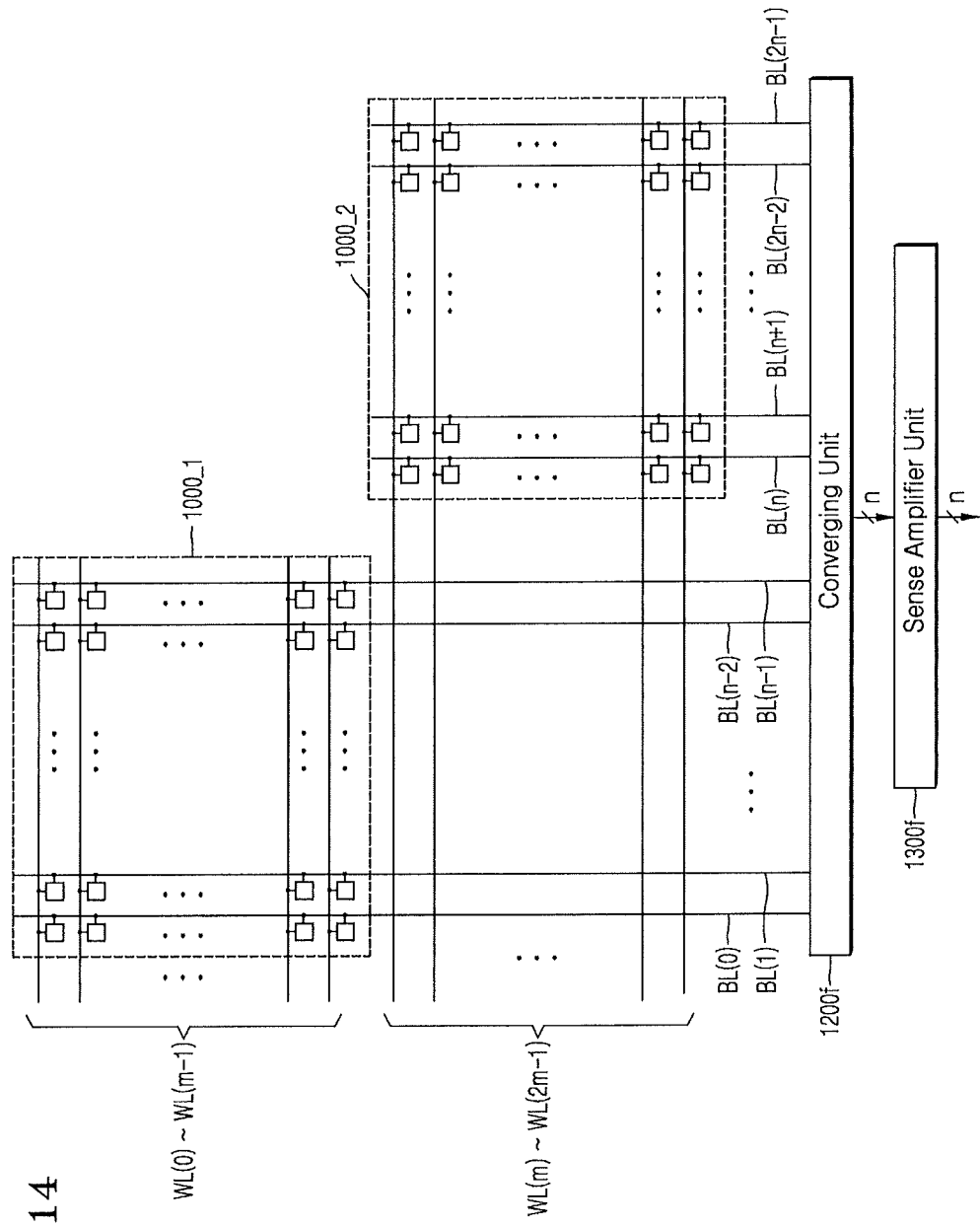

FIGS. 13 and 14 are circuit diagrams of OTP cell arrays where OTP memory devices are arranged as unit cells, according to embodiments.

Referring to FIG. 13, in an OTP cell array 1000, one of the OTP memory devices 100, 100a, 100b, 200, 200a, 200b, 200c, 300, 300a, 300b and 300c of FIGS. 5A to 7, 9A and 10 to 12 may be constructed and arranged as a unit cell. A plurality of unit cells may be arranged in an array structure, thereby forming the OTP cell array 1000. As illustrated, a row decoder 1100, a converging unit 1200a, and a sense amplifier unit 1300a may be disposed near the OTP cell array 1000. The OTP cell array 1000, the row decoder 1100, the converging unit 1200a, and the sense amplifier unit 1300a may configure a whole OTP memory device.

To briefly describe an operation of the OTP memory device, when a word line is activated, the OTP cell array 1000 may output a signal, corresponding to data stored in a unit cell, to a bit line. The row decoder 1100 may receive and decode a row address RA among addresses received from the outside, thereby activating one of a plurality of word lines. The OTP cell array 1000 may transfer the signal to the converging unit 1200a through the bit line. The converging unit 1200a may select some bit lines from among bit lines of the OTP cell array 1000 according to a column address CA and may output signals of the selected bit lines. The sense amplifier unit 1300a may include a plurality of sense amplifiers 300. Each of the sense amplifiers 300 may sense and amplify a current flowing through a corresponding bit line. The sense amplifier unit 300 may respectively connect corresponding sense amplifiers 300 to the bit lines selected by the converging unit 1200a. The corresponding sense amplifiers 300 may sense and amplify currents flowing through the selected bit lines, respectively.

Unlike the embodiment of FIG. 13, an OTP memory device may not include the converging unit 1200a. In this case, a plurality of sense amplifiers may be respectively connected to the bit lines of the OTP cell array 1000, and thus, the sense amplifier unit 1300a may include more sense amplifiers.

Referring to FIG. 14, an OTP memory device may include a first OTP cell array 1000_1, a second OTP cell array 1000_2, a converging unit 1200f, and a sensing amplifier unit 1300f. Each of the first OTP cell array 1000_1 and the second OTP cell array 1000_2 may correspond to the OTP cell array 1000 of FIG. 13. The converging unit 1200f may receive signals from the first OTP cell array 1000_1 and the second OTP cell array 1000_2 through 2n number of bit lines and may transfer signals of n bit lines of the 2n bit lines to the sense amplifier unit 1300f. The sense amplifier unit 1300f may include n number of sense amplifiers, and may receive signals from the converging unit 1200f through n signal lines to sense and amplify the received signals. In FIG. 14, a structure where the OTP memory device includes two OTP cell arrays is illustrated, but the present embodiment is not limited thereto. In other embodiments, the OTP memory device may include three or more OTP cell arrays.

To provide a detailed description, the number of word lines WL(0) to WL(2m−1) included in an OTP memory device in some embodiments may be a total of 2m number. Each of the first OTP cell array 1000_1 and the second OTP cell array 1000_2 may include different m word lines. Also, as described above, each of the first OTP cell array 1000_1 and the second OTP cell array 1000_2 may include n number of bit lines.

The converging unit 1200f may receive signals through bit lines BL(0) to BL(n−1) of the first OTP cell array 1000_1 and through bit lines BL(n) to BL(2n−1) of the second OTP cell array 1000_2 and may output n number of signals among signals received through 2n number of bit lines. The sense amplifier unit 1300f may sense and amplify the output signals of the converging unit 1200f through n number of sense amplifiers.

In the OTP memory device according to the present embodiment, since the first OTP cell array 1000_1 and the second OTP cell array 1000_2 do not share the same word line, bit lines BL(0) to BL(n−1) of the first OTP cell array 1000_1 and bit lines BL(n) to BL(2n−1) of the second OTP cell array 1000_2 cannot simultaneously output a signal corresponding to bit data stored in a unit cell. Accordingly, the converging unit 1200f may transfer signals of the bit lines BL(0) to BL(n−1) of the first OTP cell array 1000_1 or the bit lines BL(n) to BL(2n−1) of the second OTP cell array 1000_2 to the sense amplifier unit 1300f.

Figure 15:
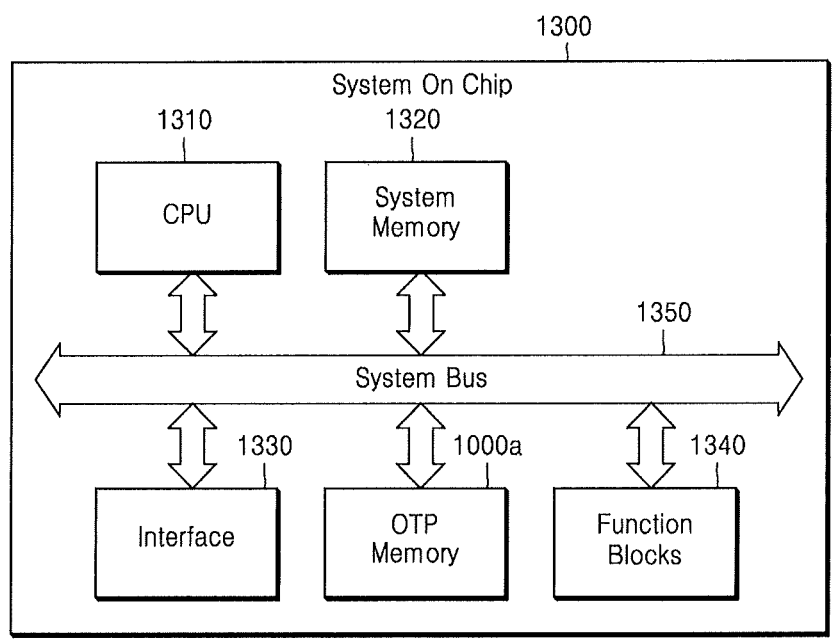
FIG. 15 is a block diagram illustrating a structure of a system-on chip (SoC) including an OTP memory device according to an embodiment.

FIG. 15 is a block diagram illustrating a structure of a system-on chip (SoC) 1300 including an OTP memory device according to an embodiment.

Referring to FIG. 15, the SoC 1300 may include a central processing unit (CPU) 1310, a system memory 1320, an interface 1330, an OTP memory device 1000a, a plurality of function blocks 1340, and a bus 1350 connecting the elements. The CPU 1310 may control an operation of the SoC 1300. The CPU 1310 may include a core and an L2 cache. For example, the CPU 1310 may include a multi-core. One or more cores of the multi-core may have the same performance or different performances. Also, one or more of the cores of the multi-core may be activated at the same time or at different times. The system memory 1320 may store a result of processing which is performed by each of the function blocks 1340 according to control by the CPU 1310. For example, when details stored in the L2 cache of the CPU 1310 are flushed, the processing result may be stored in the system memory 1320. The interface 1330 may perform an interface with external devices. For example, the interface 1330 may perform an interface with a camera, a liquid crystal display (LCD), a speaker, and/or the like.

The OTP memory device 1000a may store setting information about the SoC 1300. The OTP memory device 1000a may be implemented with one of the OTP memory devices 100, 100a, 100b, 200, 200a, 200b, 200c, 300, 300a, 300b and 300c of FIGS. 5A to 7, 9A and 10 to 12. For example, as illustrated in FIG. 13 or 14, the OTP memory device 1000a may be implemented with an OTP memory device including the OTP cell arrays 1000, 1000_1 and 1000_2. Accordingly, the OTP memory device 1000a enhances reliability of the SoC 1300. The function blocks 1340 may perform various functions desired by the SoC 1300. For example, the function blocks 1340 may perform video codec functions and/or may process three-dimensional (3D) graphic.

Figure 16:
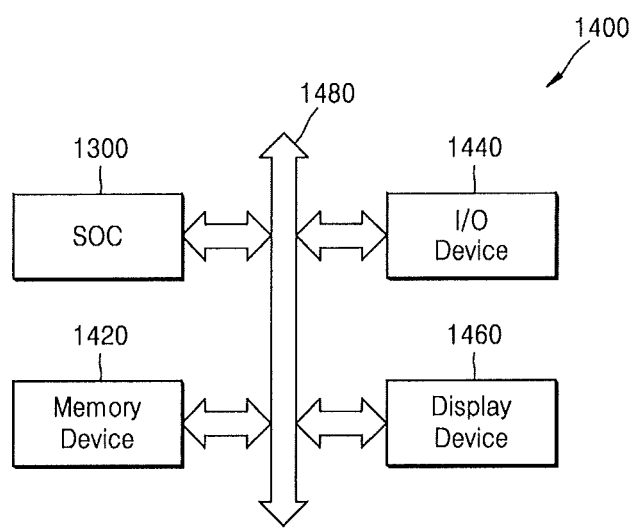
FIG. 16 is a block diagram illustrating a structure of an electronic system including an SoC according to an embodiment.

FIG. 16 is a block diagram illustrating a structure of an electronic system 1400 including an SoC according to an embodiment.

Referring to FIG. 16, the SoC 1300 illustrated in FIG. 15 may be equipped in the electronic system 1400 such as a mobile device, a desktop computer, a server, or the like. Also, the electronic system 1400 may further include a memory device 1420, an input/output (I/O) device 1440, and a display device 1460, and the elements may be electrically connected to a bus 1480. The electronic system 1400 may operate based on setting information stored in the OTP memory device 1000a of the SoC 1300.

Figure 17A:
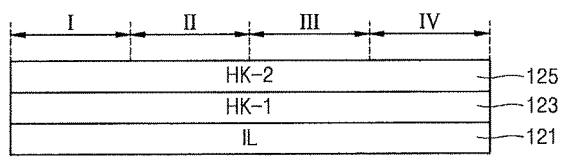
FIGS. 17A to 17E are cross-sectional views for describing the principle of a method of manufacturing an OTP memory device according to an embodiment.
Figure 17B:
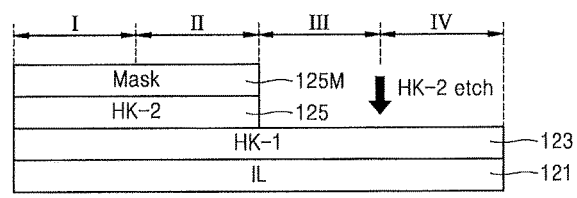
Figure 17C:
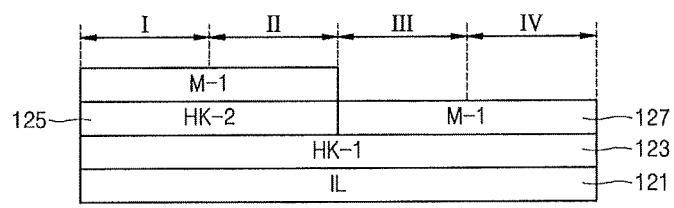

FIGS. 17A to 17C are cross-sectional views for describing the principle of a method of manufacturing an OTP memory device according to an embodiment.

Referring to FIG. 17A, an interface layer (IL) 121, a first high-k dielectric layer (HK-1) 123, and a second high-k dielectric layer (HK-2) 125 may be sequentially formed on a semiconductor substrate (not shown) where a first region I to a fourth region IV are defined. The interface layer (IL) 121 and the first high-k dielectric layer 123 are similar to the above description of the interface layer/high-k dielectric layer 121/123 of FIG. 4, and are not repeated due to brevity. The second high-k dielectric layer 125 may correspond to an RE supply layer and is similar to the above description of the RE supply layer 125 of FIG. 4. The RE supply layer formed of LaO, YO, and/or the like may also have a high dielectric constant (k), and thus may be referred to as a second high-k dielectric layer herein. As illustrated, the interface layer 121, the first high-k dielectric layer 123, and the second high-k dielectric layer 125 may be formed in each of the first region I to the fourth region IV.

For reference, at least one of the second region II to the fourth region IV may correspond to a region where an OTP memory device is provided. Also, at least one of the first region I to the fourth region IV may correspond to a region where a logic device is provided. In the first region I, only the logic device may be provided, and the OTP memory device may not be provided. For convenience, the first region I to the fourth region IV may be sequentially arranged in a direction from left to right. Positions of the first region I to the fourth region IV are not limited thereto. For example, the first region I to the fourth region IV may be disposed at various positions, and moreover, may be two-dimensionally disposed at various positions.

Referring to FIG. 17B, subsequently, a first mask 125M may be formed in each of the first region I and the second region II. For example, the first mask 125M may be formed of photoresist (PR). Depending on the case, the first mask 125M may be formed of a hard mask material having an etch selectivity with respect to the second high-k dielectric layer 125. Subsequently, the second high-k dielectric layer 125 in each of the third region III and the fourth region IV may be removed by performing an etching process with the first mask 125M. After the second high-k dielectric layer 125 in each of the third region III and the fourth region IV is removed, the first mask 125M may be removed.

Referring to FIG. 17C, after the first mask 125M is removed, a first metal layer (M-1) 127 may be formed in each of the first region I to the fourth region IV. The first metal layer 127 may be the same as or similar to the above description of the first metal layer 127 of FIG. 4. The first metal layer 127 may be a work function adjustment layer and may be formed as, for example, a p-type TiN layer. However, a material of the first metal layer 127 is not limited to a p-type TiN layer.

Figure 17D:
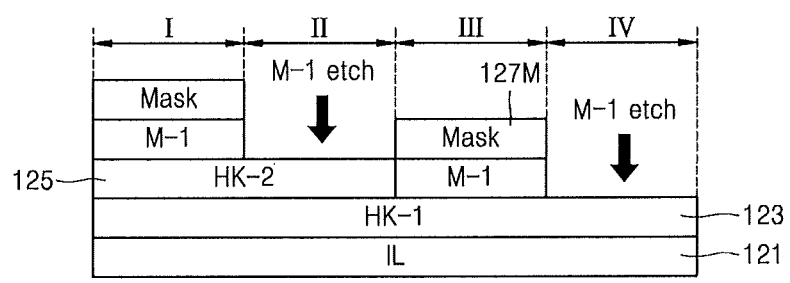

Referring to FIG. 17D, after the first metal layer 127 is formed, a second mask 127M may be formed in each of the first region I and the third region III. Subsequently, the first metal layer 127 in each of the second region II and the fourth region IV may be removed by performing an etching process with the second mask 127M. After the first metal layer 127 in each of the second region II and the fourth region IV is removed, the second mask 127M may be removed.

Figure 17E:
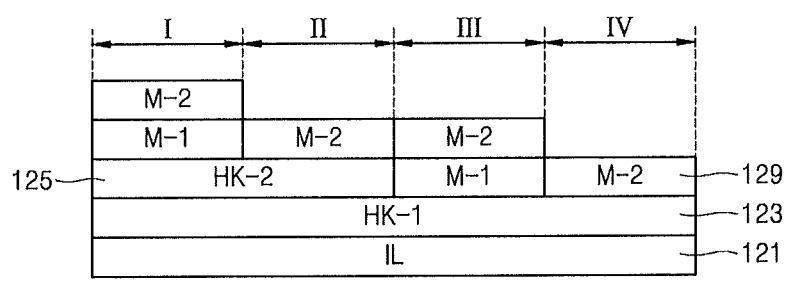

Referring to FIG. 17E, after the second mask 127M is removed, a second metal layer (M-2) 129 may be formed in each of the first region I to the fourth region IV. The second metal layer 129 may be similar to the above description of the second metal layer 129 of FIG. 4. The second metal layer 129 may be formed of n-type or p-type metal. For example, the second metal layer 129 may be n-type metal and may be formed as an n-type TiAlC layer. However, a material of the second metal layer 129 is not limited to the n-type TiAlC layer.

With respect to the formation of the second metal layer 129, gate structures of transistors having different threshold voltages may be finished. For reference, a material film material structure in the first region I may correspond to the third gate structure G3 of FIG. 4, a material film material structure in the second region II may correspond to the first gate structure G1 of FIG. 4, a material film material structure in the third region III may correspond to the fourth gate structure G4 of FIG. 4, and a material film material structure in the fourth region IV may correspond to the second gate structure G2 of FIG. 4. Therefore, when a transistor is implemented in a material film material structure in each of the first region I to the fourth region IV, a threshold voltage may increase in the order of the second region II, the fourth region IV, the first region I, and the third region III. Accordingly, a breakdown voltage may increase in the order of the fourth region IV, the second region II, the third region III, and the first region I.

As described above, material layers having various structures may be formed in each of the first region I to the fourth region IV through a two-time mask process and etching process, and a gate structure may be formed by using the material layers, thereby implementing transistors having different threshold voltages. Also, a logic device and an OTP memory device may be formed by using the transistors. For example, a gate structure of a program transistor T0 and a gate structure of a read transistor T1 may be formed by using material layers in one of the second region II to the fourth region IV, thereby forming the above-described OTP memory device having reliability, increasing reliability of peripheral I/O elements, and simplifying a design.

FIGS. 18A to 18F are cross-sectional views illustrating a process of manufacturing an OTP memory device. In the drawings, 'A' refers to an OTP memory device region where an OTP memory device is provided, and 'B' refers to a logic device region where a logic device is provided. The logic device may include a plurality of MOS transistors, for example, metal oxide semiconductor field effect transistors (MOSFETs) having various threshold voltages, but not limited thereto.

Figure 18A:
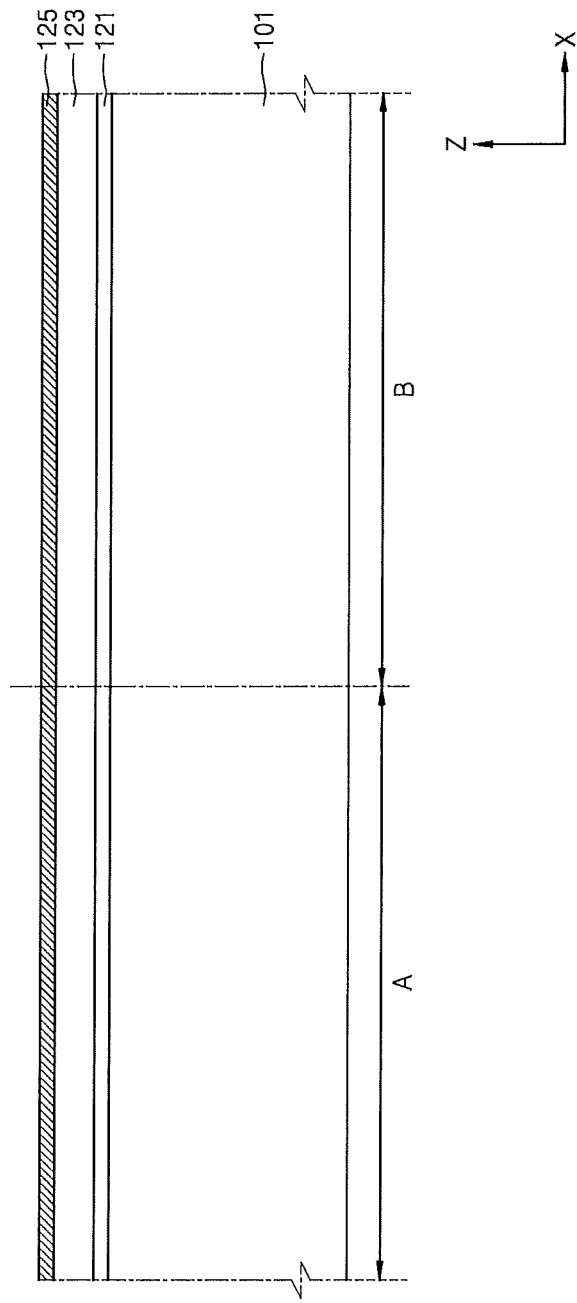
FIGS. 18A to 18F are cross-sectional views illustrating a process of manufacturing an OTP memory device.

Referring to FIG. 18A, an interface layer 121, a high-k dielectric layer 123, and an RE supply layer 125 may be sequentially formed on a semiconductor substrate 101 where an active region is defined by an isolation layer (110 of FIG. 1). Materials of the substrate 101, the interface layer 121, the high-k dielectric layer 123, and the RE supply layer 125 are as describe above with reference to FIGS. 1, 4 and 5A. The interface layer 121, the high-k dielectric layer 123, and the RE supply layer 125 may be formed through various deposition methods such as the ALD method, the CVD method, the PVD method, and so on.

In order to appropriately adjust the number of REs diffused from the RE supply layer 125, a film material structure and a layer thickness may be adjusted by controlling a process condition in forming the high-k dielectric layer 123. The film material structure and layer thickness of the high-k dielectric layer 123 may be adjusted according to control such as an appropriate selection of a process temperature, a process duration, and source materials. For example, the film material structure of the high-k dielectric layer 123 may be formed as a columnar grain boundary structure by controlling the process condition. In the columnar grain boundary structure, since REs are easily diffused, many REs may be injected into an interface between the interface layer 121 and the high-k dielectric layer 123.

The RE supply layer 125 may include various kinds of REs. For example, in a method of manufacturing the OTP memory device 100 according to the present embodiment, the RE supply layer 125 may include LaO. After the RE supply layer 125 is formed, preliminary thermal treatment may be performed. More REs may be injected into the interface between the interface layer 121 and the high-k dielectric layer 123 through the preliminary thermal treatment. However, the preliminary thermal treatment may be omitted. In this case, REs may be diffused and injected into the interface between the interface layer 121 and the high-k dielectric layer 123, based on the film material structure and layer thickness of the high-k dielectric layer 123.

Figure 18B:
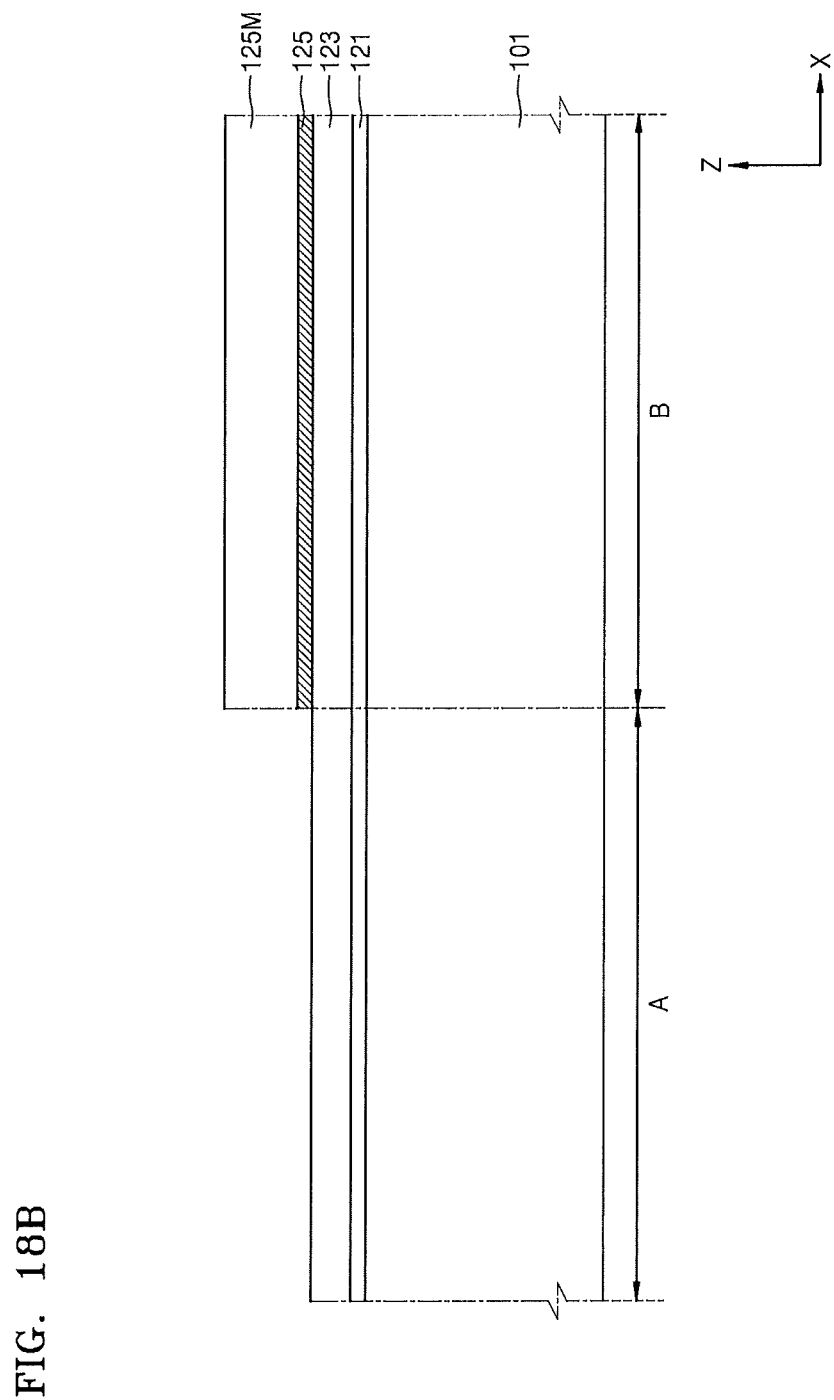

Referring to FIG. 18B, after the RE supply layer is formed, a first mask 125M may be formed at the logic device region B. The first mask 125M may be formed of, for example, PR through a photolithography process. Subsequently, the RE supply layer 125 in the OTP memory device region A may be removed by performing an etching process with the first mask 125M. A top of the high-k dielectric layer 123 may be exposed in the OTP memory device region A. Depending on the case, only a portion of the RE supply layer 125 may be removed. Thus, the RE supply layer 125 may be thinly maintained. Also, a portion of the top of the high-k dielectric layer 123 may be removed due to over-etching. After the RE supply layer 125 in the OTP memory device region A is removed, the first mask 125M may likewise be removed.

Figure 18C:
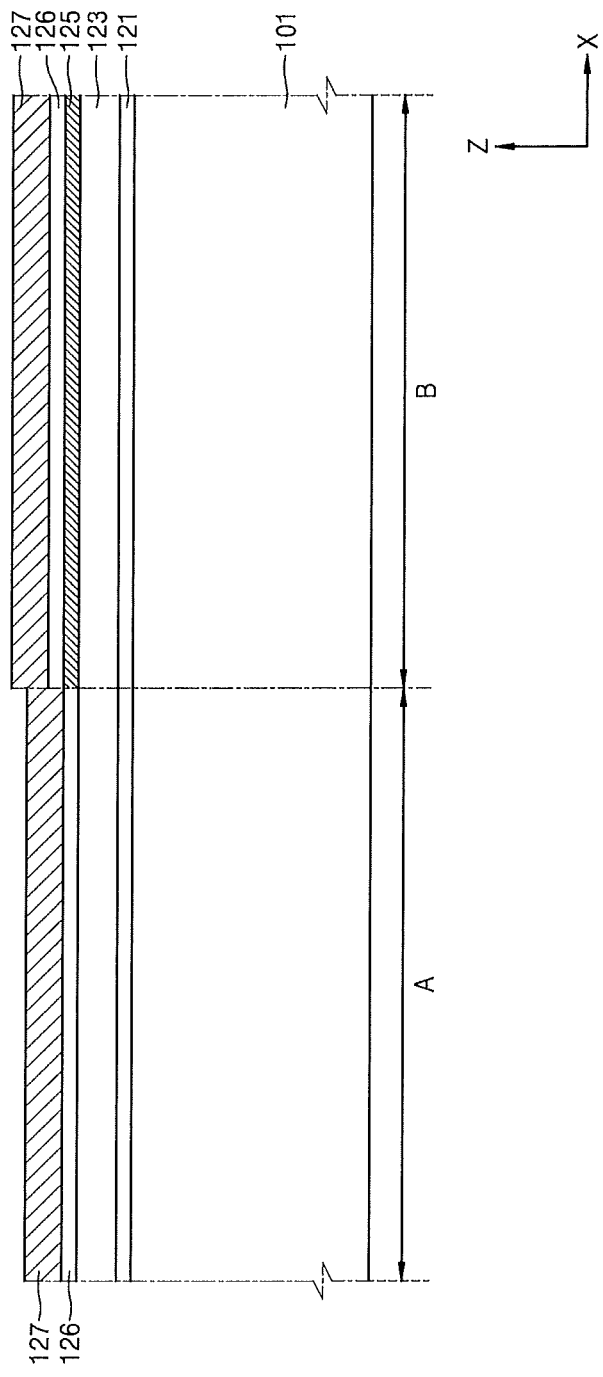

Referring to FIG. 18C, after the first mask 125M is removed, a barrier metal layer 126 and a first metal layer 127 may be sequentially formed on a resultant material on the semiconductor substrate 110. The functions or materials of the barrier metal layer 126 and the first metal layer 127 are as described above with reference to FIG. 4 or 5A. Also, REs may be diffused from the RE supply layer 125 to the first metal layer 127 by thinly adjusting a thickness of the barrier metal layer 126 or omitting the barrier metal layer 126 itself. Also, in order to adjust the number of REs diffused to the first metal layer 127, the film material structure, metal composition, thickness, process temperature, and process duration of the first metal layer 127 may be controlled in forming the first metal layer 127.

Figure 18D:
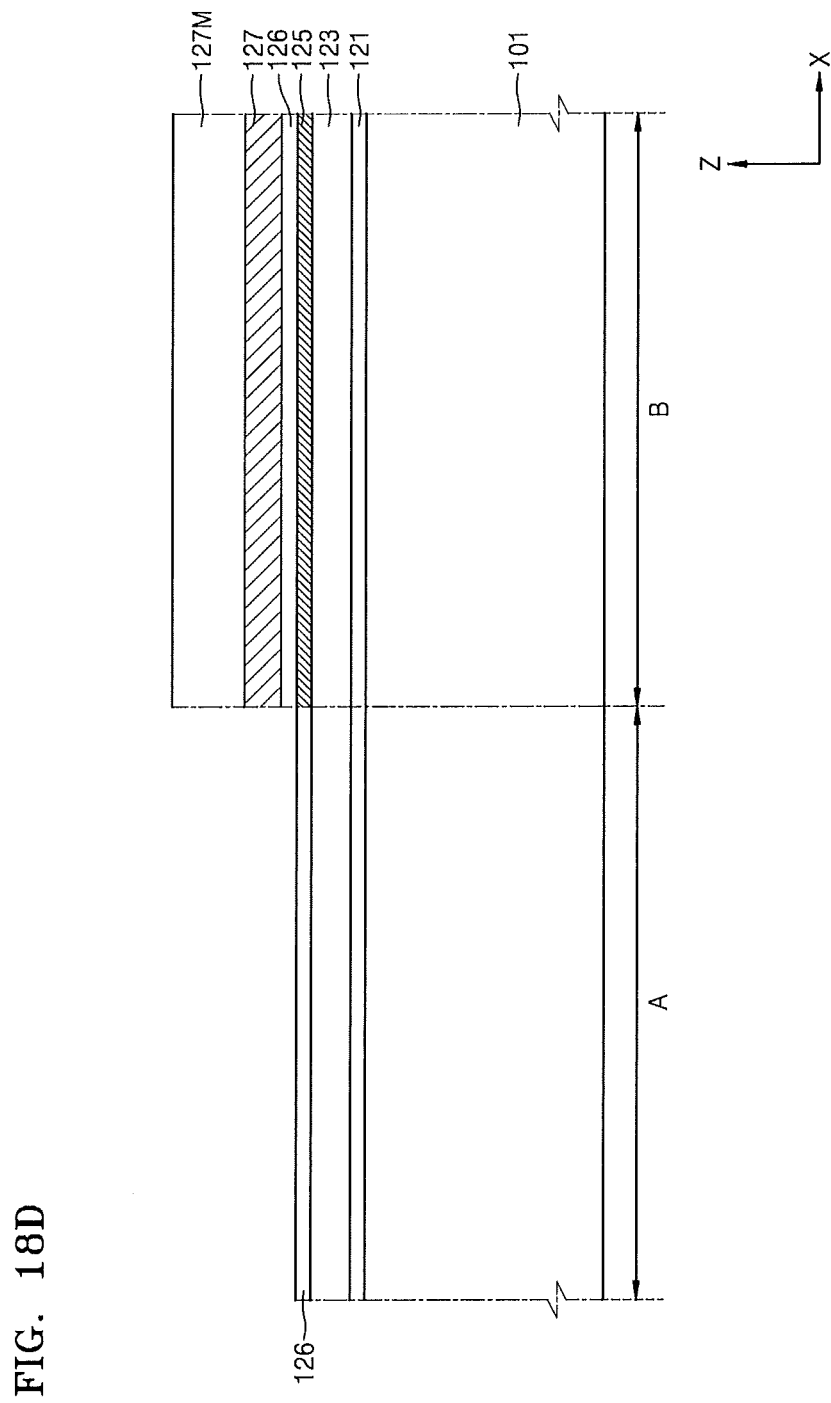

Referring to FIG. 18D, after the first metal layer 127 is formed, a second mask 127M may be formed at the logic device region B. The second mask 127M may be formed of, for example, PR or a hard mask through the photolithography process. Subsequently, the first metal layer 127 in the OTP memory device region A may be removed by performing an etching process with the second mask 127M. Therefore, the barrier metal layer 126 may be exposed in the OTP memory device region A. Depending on the case, only a portion of the first metal layer 127 may be removed. Thus, the first metal layer 127 may be thinly maintained. In other words, a thin portion of the original first metal layer 127 may be present on the barrier metal layer 126. In some cases, the barrier metal layer 126 may be removed due to over-etching. After the first metal layer 127 in the OTP memory device region A is removed, the second mask 127M may be removed.

Figure 18E:
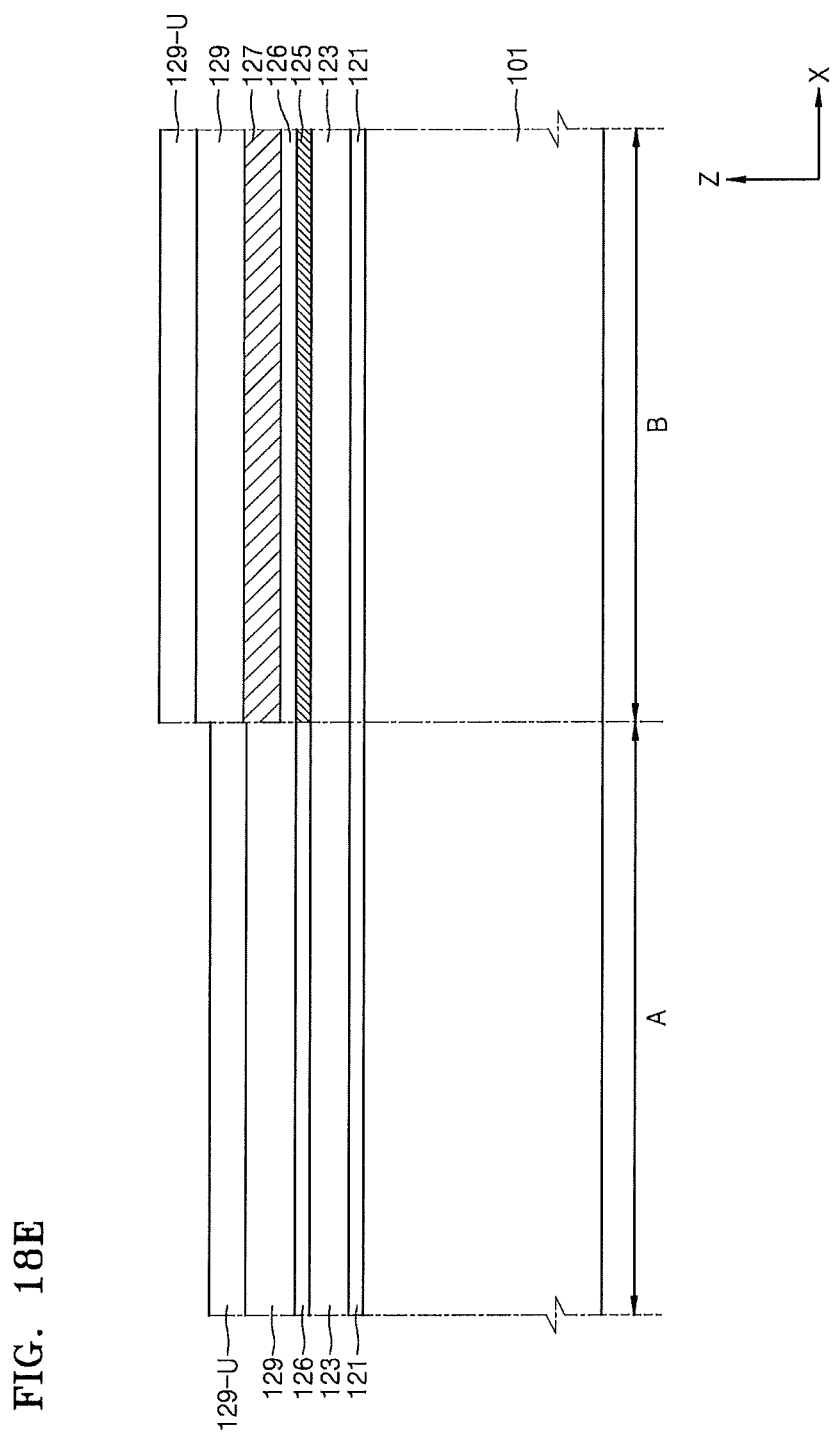

Referring to FIG. 18E, after the second mask 127M is removed, a second metal layer 129 and a gap-fill metal layer 129-u may be sequentially formed on the resultant material on the semiconductor substrate 110. The functions or materials of the second metal layer 129 and the gap-fill metal layer 129-u are as described above with reference to FIG. 4 or 5A. Also, a barrier metal layer may be further formed before the gap-fill metal layer 129-u is formed. Also, the gap-fill metal layer 129-u may be omitted without being formed.

Figure 18F:
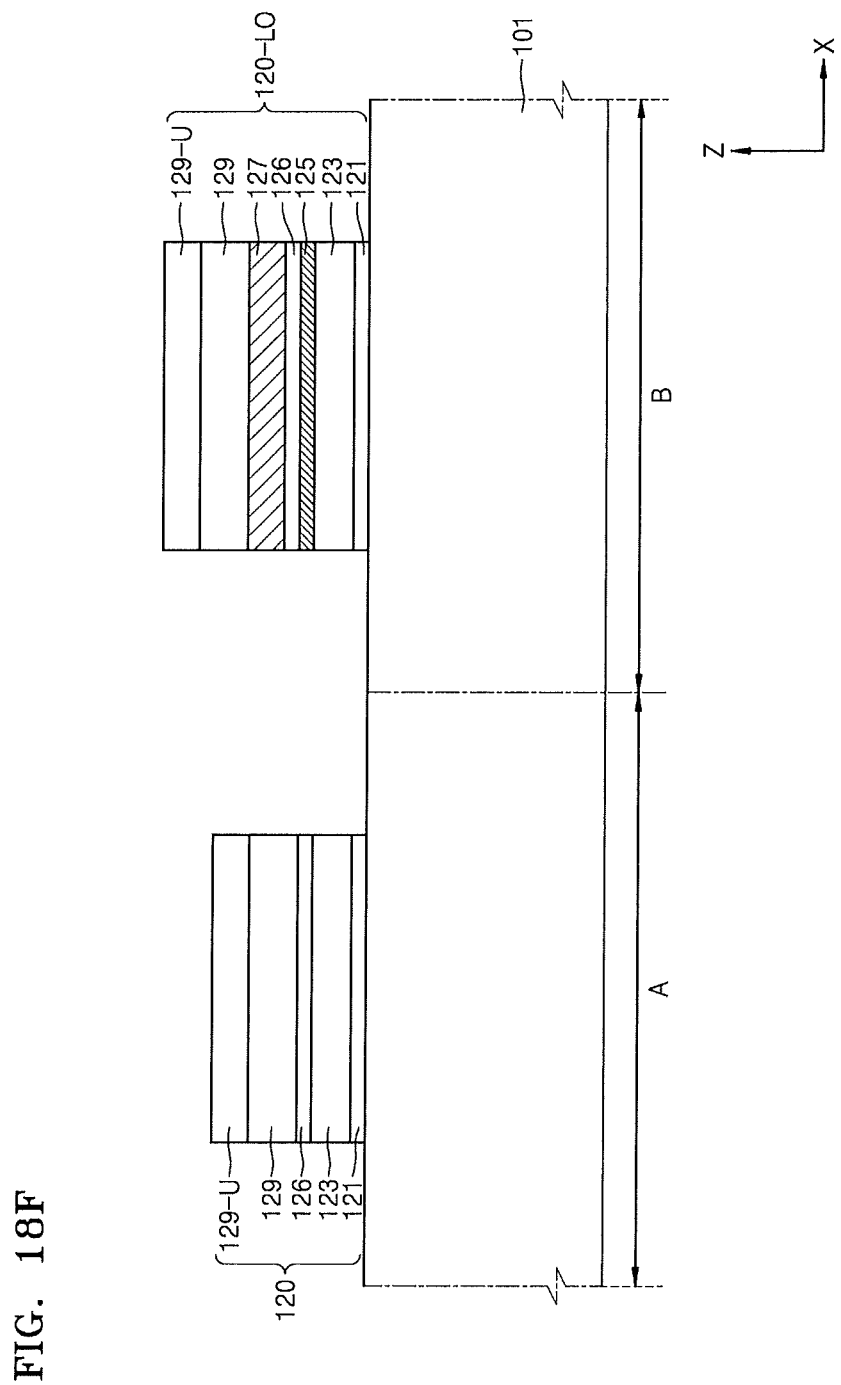

Referring to FIG. 18F, after the gap-fill metal layer 129-u is formed, a patterning process may be performed for material layers. Through a patterning process, the gate structure 120 of the OTP memory device 100 of FIG. 5A may be formed in the OTP memory device region A, and a gate structure 120-LO similar to the third gate structure G3 of FIG. 4 may be formed at the logic device region B.

After the gate structures 120 and 120-LO are formed at the OTP memory device region A and logic device region B, respectively, a spacer (130 of FIG. 5A) may be formed, and a source/drain region 103 may be formed through an ion injection process, thereby forming the read transistor T1 of the OTP memory device 100 of FIG. 5A in the OTP memory device region A. Also, a MOS transistor having a desired threshold voltage may be formed at the logic device region B.

As described above with reference to FIGS. 17A to 17E, a mask process and an etching process may be appropriately applied to the OTP memory device region A, thereby forming the gate structure 120a of the OTP memory device 100a of FIG. 5B or the gate structure 120b of the OTP memory device 100b of FIG. 5C. Also, a mask process and an etching process may be applied to the logic device region B to form a gate structure similar to at least one of the first gate structure G1, the second gate structure G2, and the fourth gate structure G4 other than the third gate structure G3.

FIGS. 19A to 19H are cross-sectional views illustrating a process of manufacturing the OTP memory device of FIG. 6A. In the drawings, 'A' refers to an OTP memory device region, and 'B' refers to a logic device region.

Figure 19A:
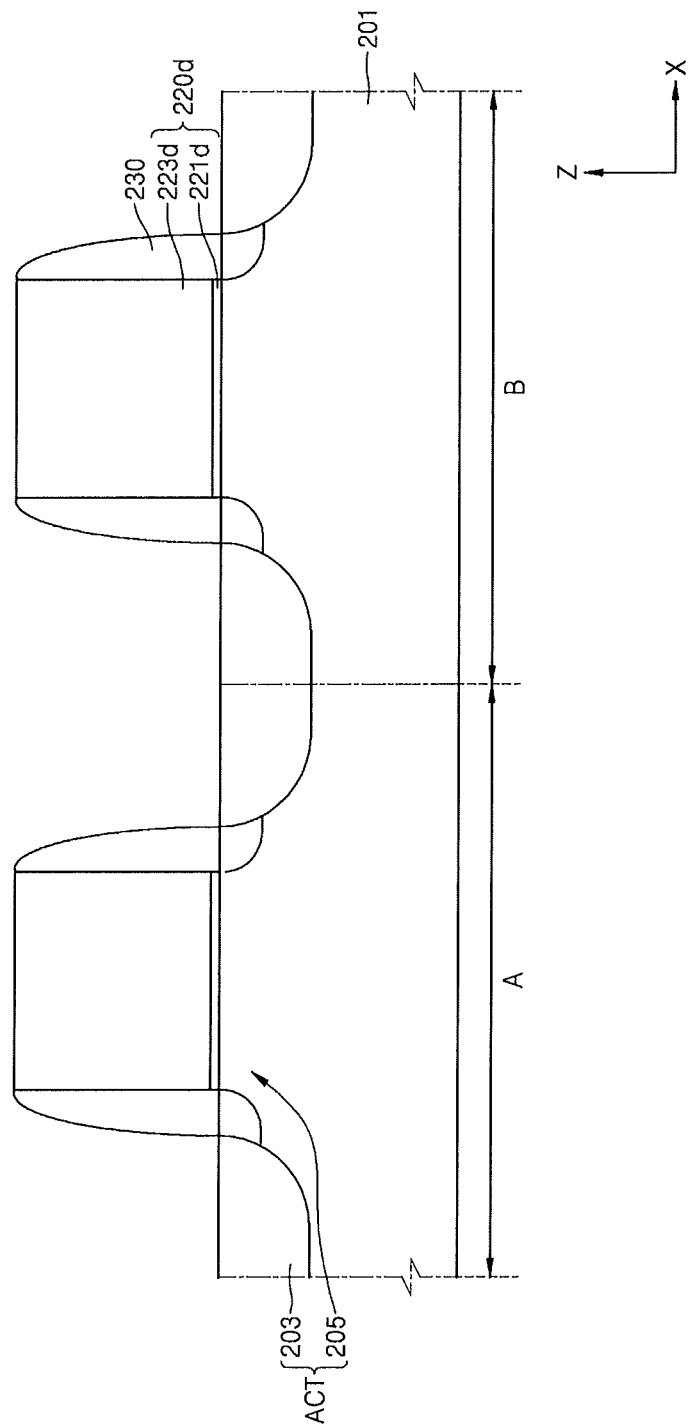

Referring to FIG. 19A, a dummy gate structure 220d and a spacer 230 may be formed on a semiconductor substrate 201 in each of an OTP memory device region A and a logic device region B. To provide a detailed description, a sacrificial insulation layer and a sacrificial gate layer may be formed on the semiconductor substrate 201. The dummy gate structure 220d may be formed by patterning the sacrificial insulation layer and the sacrificial gate layer through a photolithography process. The dummy gate structure 220d may be formed in a structure which extends in a second direction (a direction entering the paper or a direction out from the paper in the drawing). The dummy gate structure 220d may include a dummy gate insulation layer 221d and a dummy gate electrode 223d. The dummy gate insulation layer 221d may perform, for example, a function of an etch stopper in removing the dummy gate electrode 223d.

After the dummy gate structure 220d is formed, the spacer 230 may be formed on both side walls of the dummy gate structure 220d. An insulation layer which uniformly covers a resultant material on the semiconductor substrate 201 may be formed, and then, the insulation layer on a top of the dummy gate electrode 223d and a top of the semiconductor substrate 201 may be removed through dry etching and/or etch back, and the insulation layer on both side walls of the dummy gate electrode 223d may remain, thereby forming the spacer 230. The spacer 230 may be formed of an insulating material such as nitride, oxynitride, or the like. For example, the spacer 230 may be formed of silicon nitride, silicon oxynitride, and/or the like.

After the spacer 230 is formed, an impurity region, for example, the source/drain region 203 which may be part of an active region ACT, may be formed in an upper region of the semiconductor substrate 201 by performing an ion injection process with the dummy gate structure 220d and the spacer 230 as masks. Also, an LDD region (1301 of FIG. 5A) may be formed by performing the ion injection process before the spacer 230 is formed.

Figure 19B:
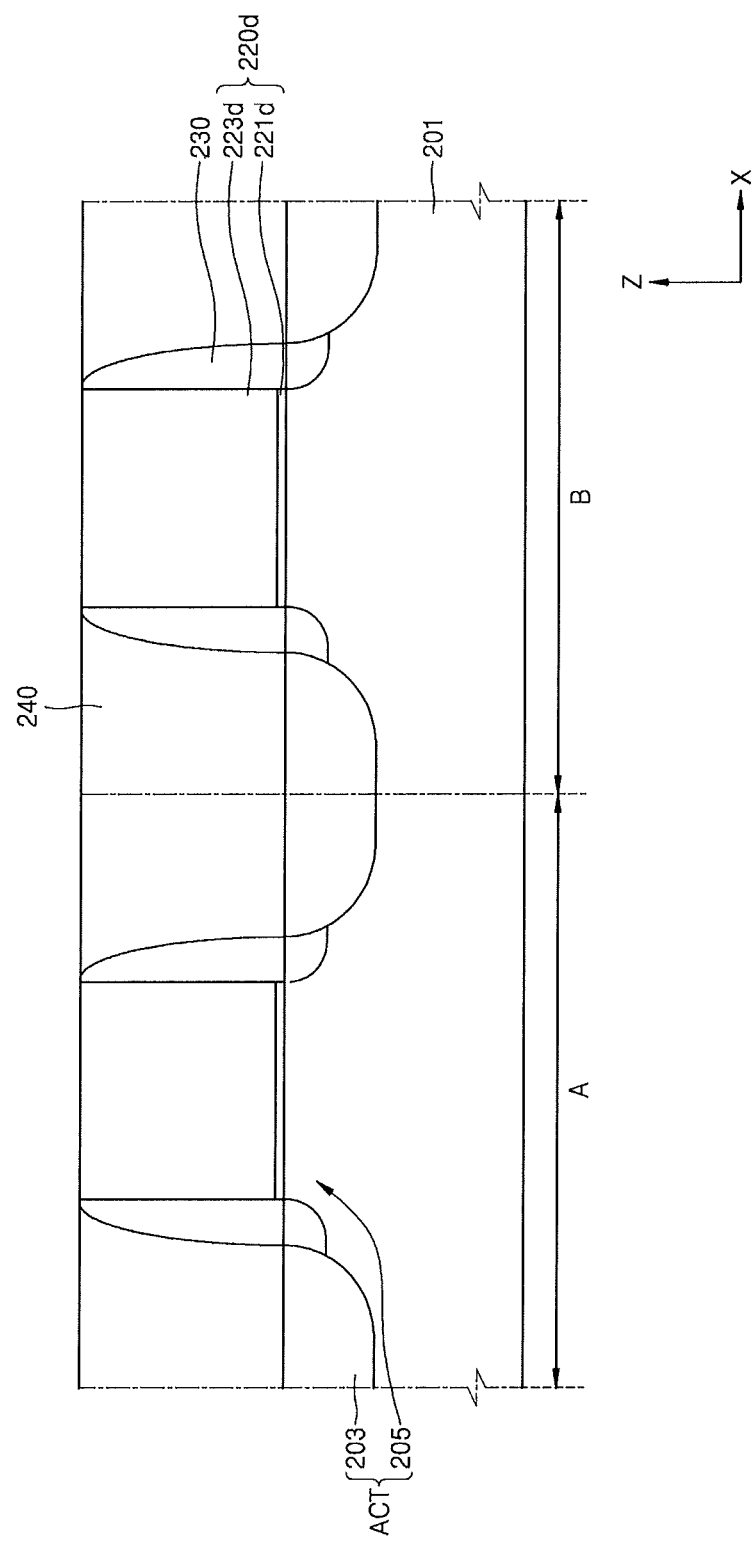

Referring to FIG. 19B, the insulation layer covering the resultant material on the semiconductor substrate 201 may be formed. An interlayer insulation layer 240 may be formed by planarizing the insulation layer. The planarization of the insulation layer may be performed by the CMOS process. A top of the dummy gate structure 220d may be exposed through the planarization of the insulation layer. The interlayer insulation layer 240 may include, for example, at least one of silicon oxide, silicon nitride, silicon oxynitride, and a combination thereof and may be formed of a material having an etch selectivity different from that of spacer 230.

Figure 19C:
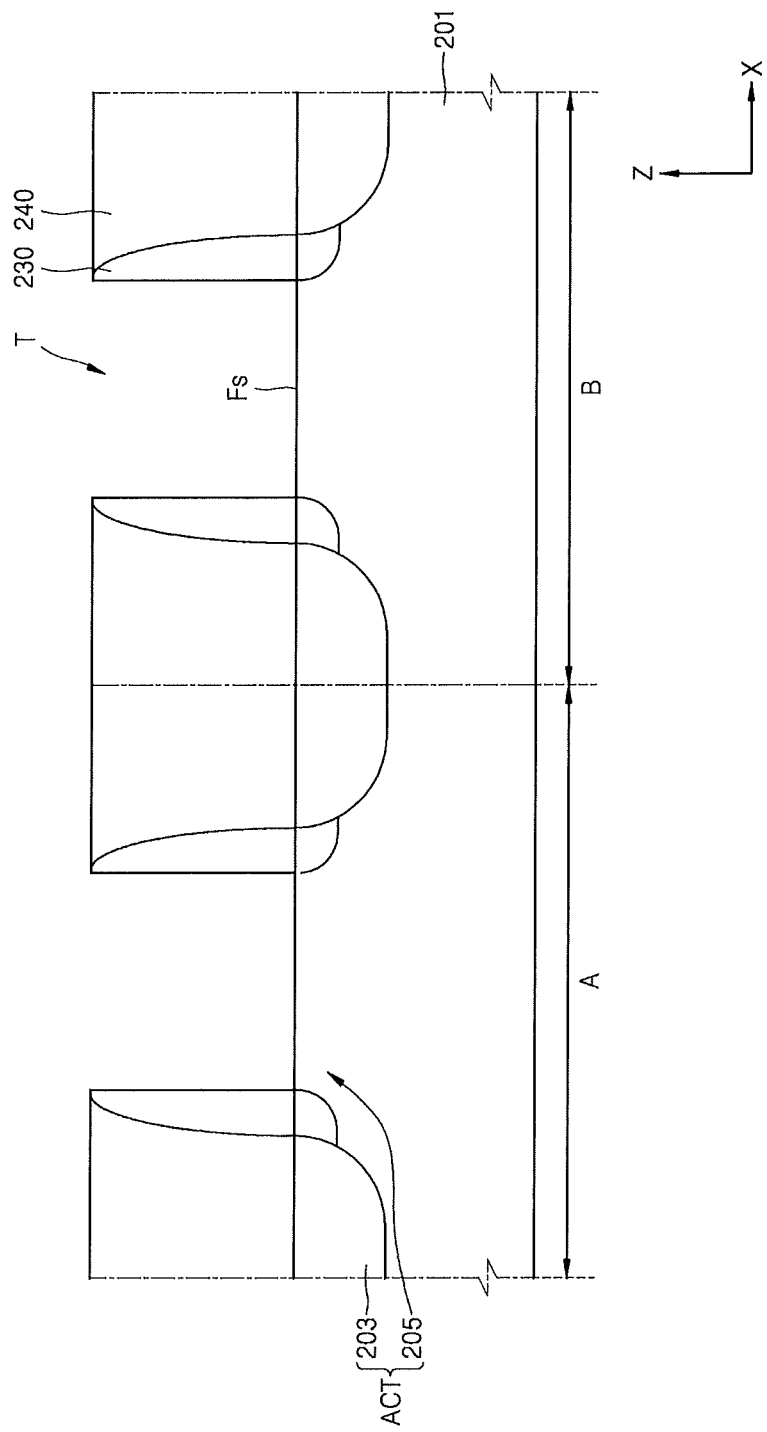

Referring to FIG. 19C, after the interlayer insulation layer 240 is formed, the dummy gate structure 220d may be removed. A top surface Fs of the semiconductor substrate 201 may be exposed by a trench T which is formed by removing the dummy gate structure 220d between spacers 230. The spacers 230 and the interlayer insulation layer 240 may each have an etch selectivity with respect to the dummy gate structure 220d. Therefore, the dummy gate structure 220d may be removed through, for example, wet etching. Also, the dummy gate electrode 223d and the dummy gate insulation layer 221d may be sequentially removed. Subsequently, the dummy gate structure 220d may be removed.

Figure 19D:
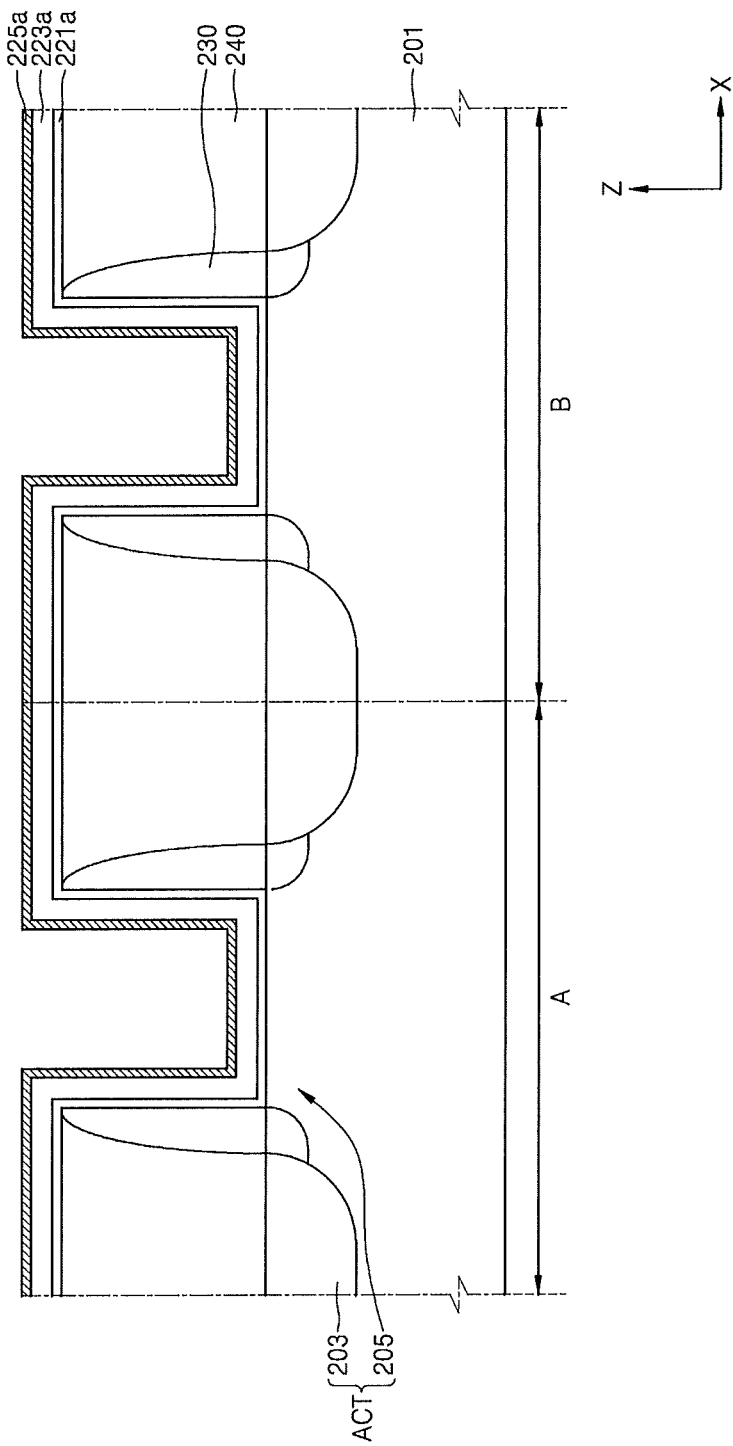

Referring to FIG. 19D, an interface layer 221a, a high-k dielectric layer 223a, and an RE supply layer 225a may be sequentially and conformally formed on the resultant material on the semiconductor substrate 201. The functions, materials, or formation methods of the interface layer 221a, the high-k dielectric layer 223a, and the RE supply layer 225a are as described above with reference to FIGS. 4, 6A and 18A.

Figure 19E:
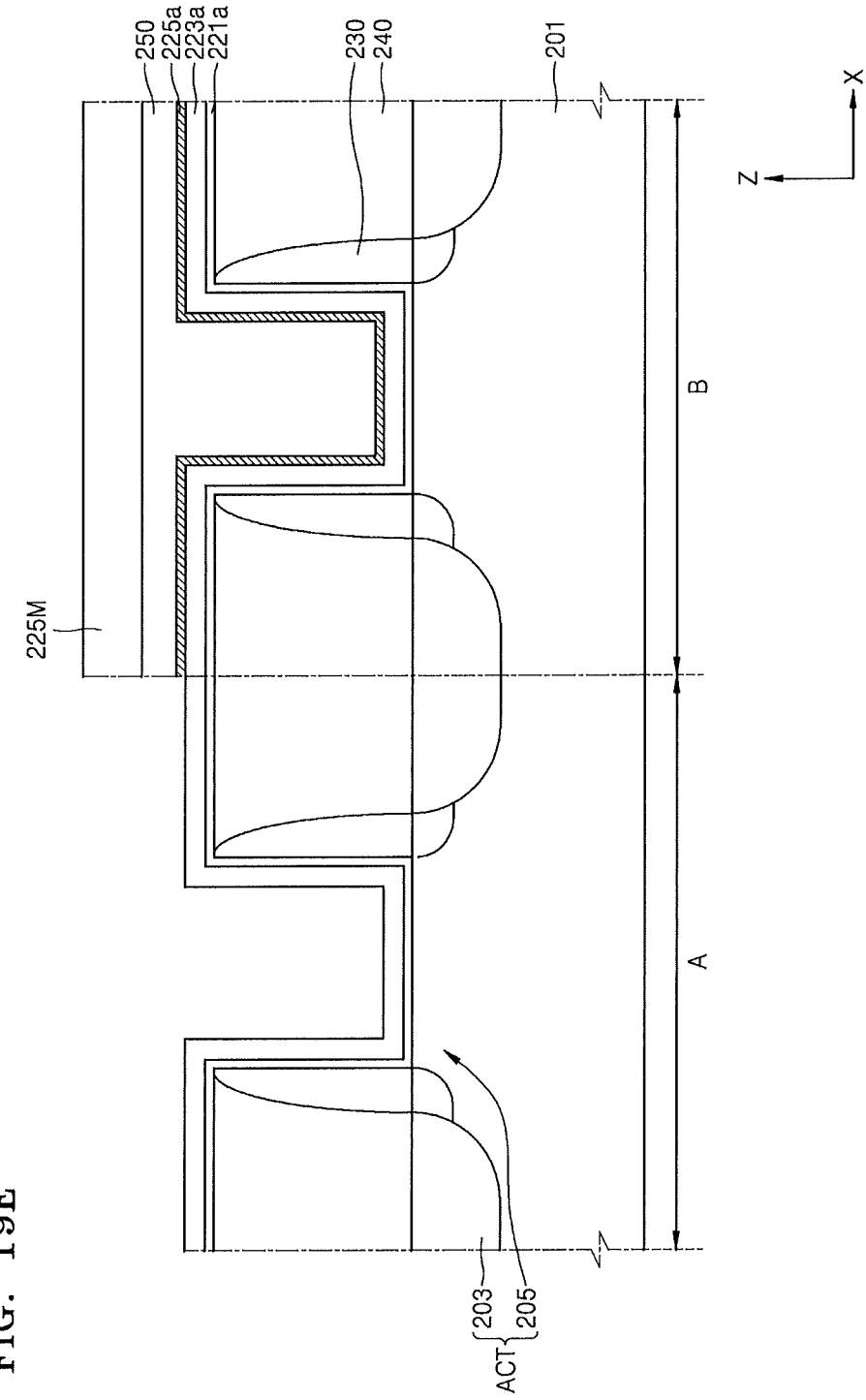

Referring to FIG. 19E, a sacrificial layer 250 may be formed on the RE supply layer 225a. The sacrificial layer may be formed to a thickness which sufficiently fills a gap remaining after the RE supply layer 225a is formed. When a width of the remaining gap is narrow, the sacrificial layer 250 may be omitted. After the sacrificial layer 250 is formed, a planarizing process such as a chemical mechanical polishing (CMP) process may be optionally performed. After the sacrificial layer 250 is formed, a first mask 225M may be formed at the logic device region B.

Subsequently, the sacrificial layer 250 and the RE supply layer 225a in the OTP memory device region A may be removed by performing an etching process using the first mask 225M. By removing the RE supply layer 225a, as illustrated, a top of the high-k dielectric layer 223a may be exposed in the OTP memory device region A. Depending on the case, at least a portion of the RE supply layer 225a may remain at the OTP memory device region A. After the RE supply layer 225a is removed, the first mask 225M and the sacrificial layer 250 at the logic device region B may be removed.

Referring to FIG. 19F, after the first mask 225M is removed, a barrier metal layer 226a and a first metal layer 227a may be sequentially formed on a resultant material on the semiconductor substrate 201. The functions, materials, or formation methods of the barrier metal layer 226a and the first metal layer 227a are as described above with reference to FIG. 4, 6A or 18C. Also, REs may be diffused from the RE supply layer 225a to the first metal layer 227a by thinly adjusting a thickness or related dimension of the barrier metal layer 226a or omitting the barrier metal layer 226a itself.

Figure 19G:
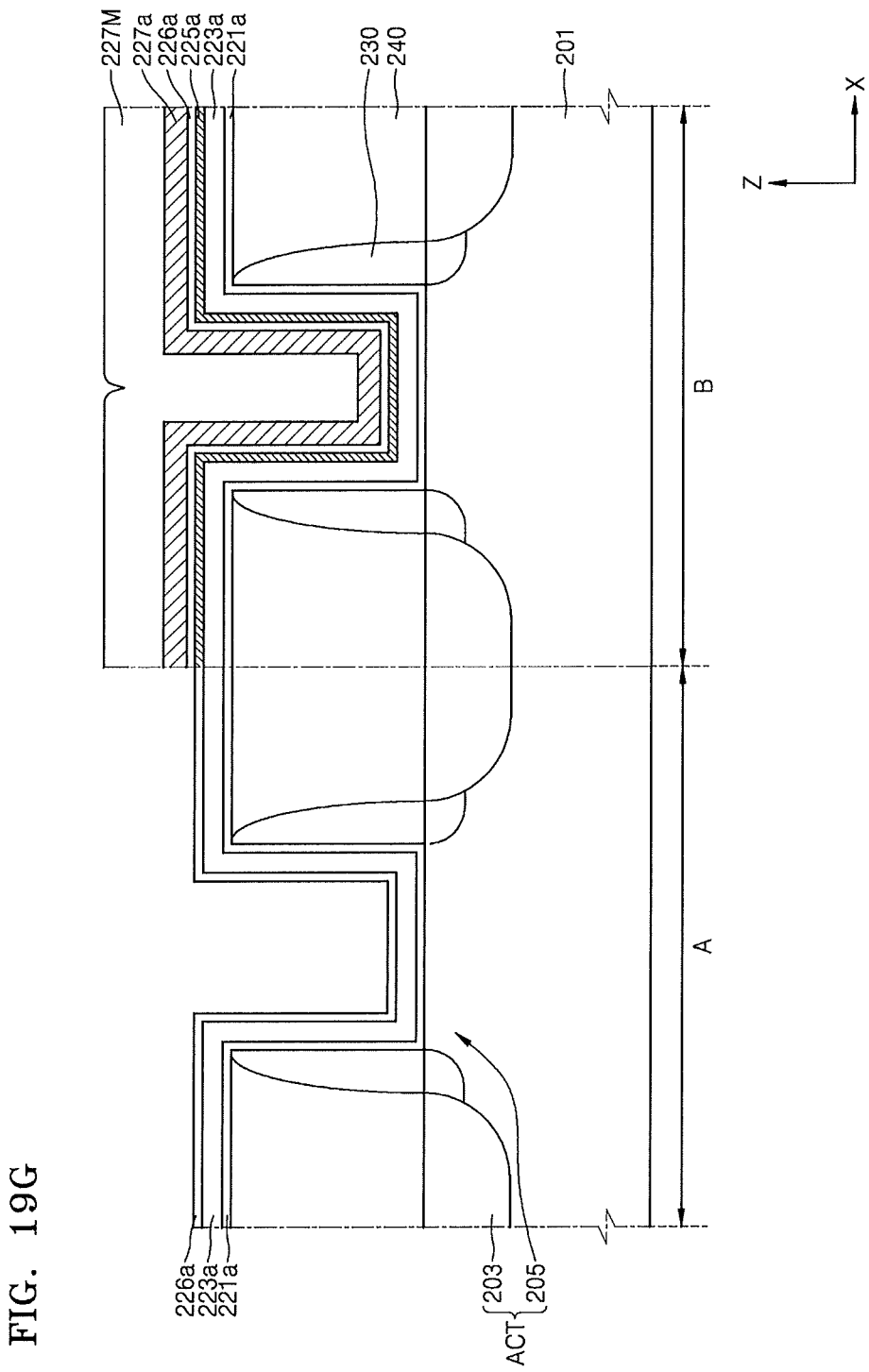

Referring to FIG. 19G, after the first metal layer 227a is formed, a second mask 227M may be formed at the logic device region B. The second mask 227M may be formed of, for example, PR or a hard mask through the photolithography process. Also, when a width of a gap remaining after the first metal layer 227a is formed is broad, a sacrificial layer may be further formed before the second mask 227M is formed. Subsequently, the first metal layer 227a in the OTP memory device region A may be removed by performing an etching process with the second mask 227M. Therefore, the barrier metal layer 226a may be exposed at the OTP memory device region A. Depending on the case, the first metal layer 227a may be thinly maintained in the OTP memory device region A. In other words, a thin portion of the metal layer 127a may be present on the barrier metal layer 126a. Also, the barrier metal layer 226a may be may be removed due to over-etching. After the first metal layer 227a in the OTP memory device region A is removed, the second mask 227M may be removed.

Referring to FIG. 19H, after the second mask 227M is removed, a second metal layer 229a and a gap-fill metal layer 229-ua may be sequentially formed on a resultant material on the semiconductor substrate 210. The gap-fill metal layer 229-ua on the OTP memory device region A may be a different height or level than the portion of the gap-fill metal layer 229-ua on the OTP memory device region B due to the presence of the first metal layer 227a in the OTP memory device region B. The functions or materials of the second metal layer 229a and the gap-fill metal layer 229-ua are as described above with reference to FIG. 4, 6A or 18F. Also, a barrier metal layer may be further formed before the gap-fill metal layer 229-ua is formed. Also, the gap-fill metal layer 229-ua may be omitted without being formed.

After the gap-fill metal layer 229-ua is formed, a planarizing process may be performed. The planarizing process, for example, may be performed by a CMP process. The planarizing process may be performed to expose a top of the interlayer insulation layer 240. By performing the planarizing process, the gate structure 220 of the OTP memory device 200 of FIG. 6A may be formed in the OTP memory device region A, and a U-shaped gate structure having a layered structure similar to the third gate structure G3 of FIG. 4 may be formed at the logic device region B. The read transistor T1 of the OTP memory device 200 of FIG. 6A may be formed in the OTP memory device region A by forming the gate structure. Also, a MOS transistor having a desired threshold voltage may be formed at the logic device region B.

As described above with reference to FIGS. 17A to 17E, a mask process and an etching process may be applied to the OTP memory device region A, thereby forming the gate structure 220a of the OTP memory device 200a of FIG. 6B or the gate structure 220b of the OTP memory device 200b of FIG. 6C. Also, a mask process and an etching process may be applied to the logic device region B, thereby forming a gate structure similar to at least one of the first gate structure G1, the second gate structure G2, and the fourth gate structure G4 other than the third gate structure G3.

FIGS. 20A to 29C are perspective views and cross-sectional views illustrating a process of manufacturing the OTP memory device of FIG. 9A. FIGS. 20B, 21B, 22B, 23B, 24B, 25B, 26B, 27B, 28B and 29B are cross-sectional views taken along lines I-I' of FIGS. 20A, 21A, 22A, 23A, 24A, 25A, 26A, 27A, 28A and 29A. FIGS. 20C, 21C, 22C, 23C, 24C, 25C, 26C, 27C, 28C and 29C are cross-sectional views taken along lines II-II' and III-III' of FIGS. 20A, 21A, 22A, 23A, 24A, 25A, 26A, 27A, 28A and 29A. In the drawings, 'A' refers to an OTP memory device region, and 'B' refers to a logic device region.

Figure 20A:
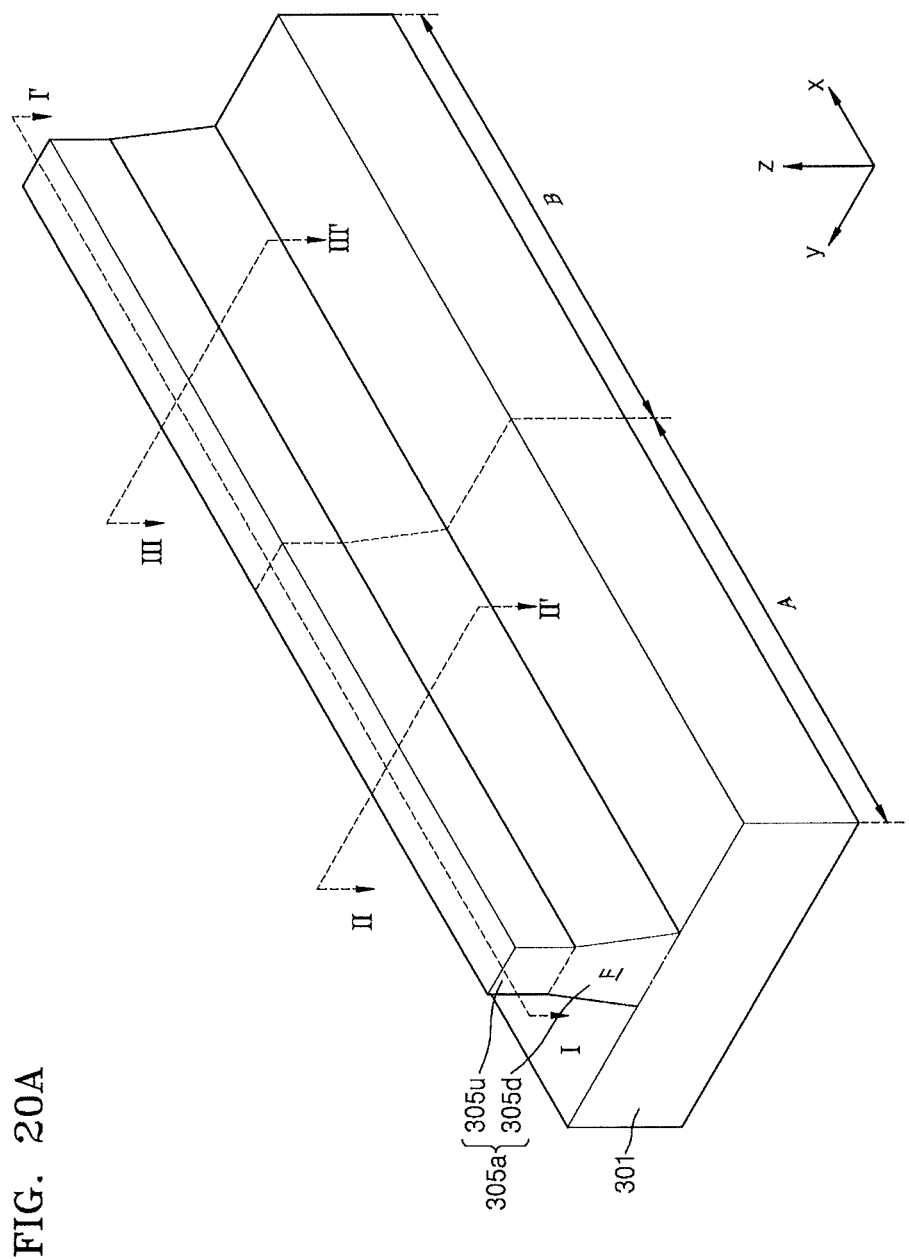
FIGS. 20A to 20C, 21A to 21C, 22A to 22C, 23A to 23C, 24A to 24C, 25A to 25C, 26A to 26C, 27A to 27C, 28A to 29A to 29C are perspective views and cross-sectional views illustrating a process of manufacturing the OTP memory device of FIG. 9A.
Figure 20B:
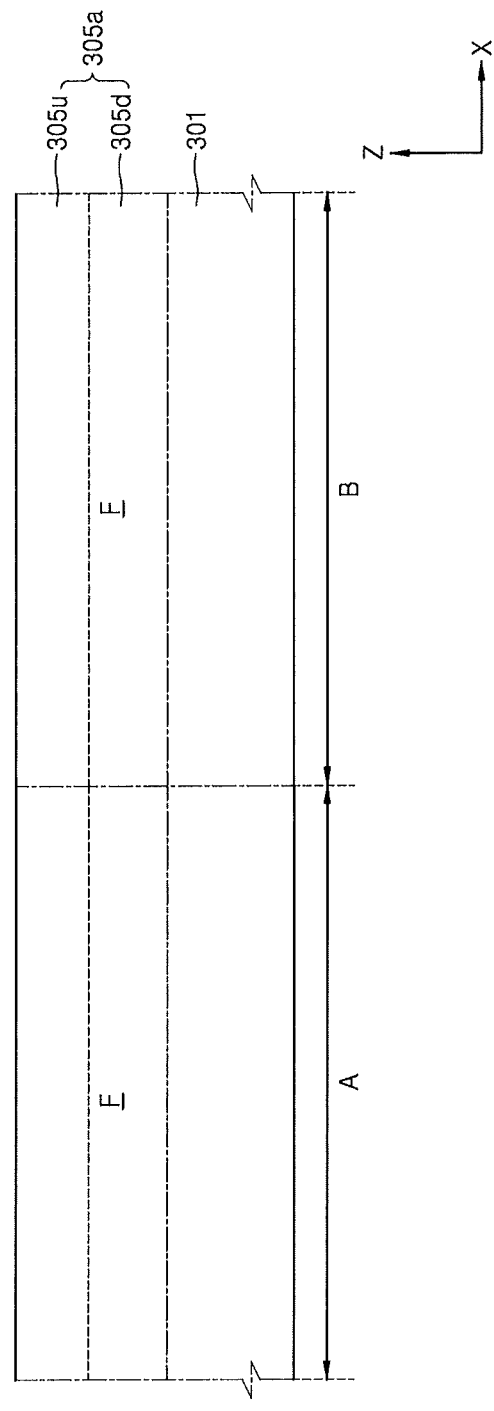
Figure 20C:
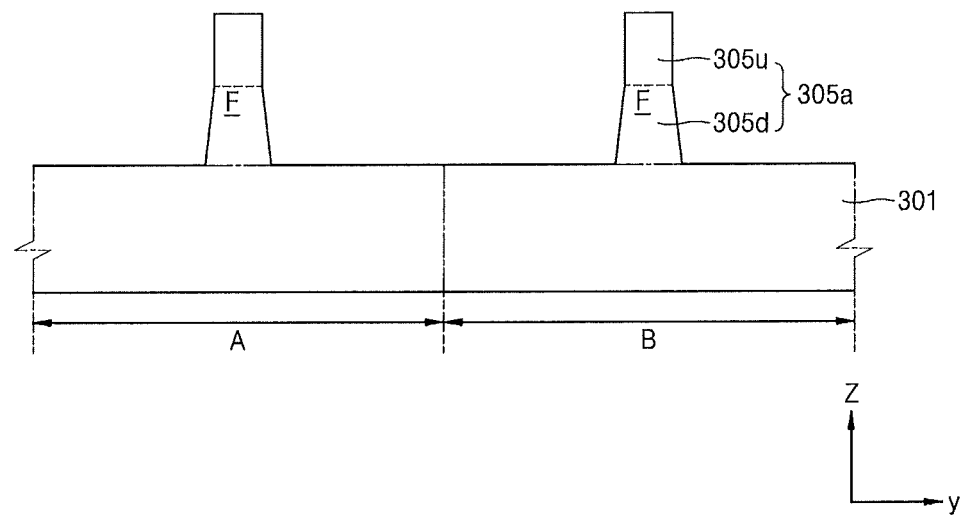

Referring to FIGS. 20A to 20C, a fin 305a having a structure which protrudes from a semiconductor substrate 301 may be formed by etching an upper portion of the semiconductor substrate 301 in each of an OTP memory device region A and a logic device region B. The fin 305a may be formed in a structure extending in a first direction (e.g., along an x-axis) on the semiconductor substrate 301. As illustrated, the tin 305a may include a lower fin portion 305d and an upper fin portion 305u.

Details of the structures or materials of the semiconductor substrate 301 and the fin 305a are as described above with reference to FIGS. 1 and 9A to 9C. Also, the OTP memory device 300 of FIG. 9A may correspond to the OTP memory device 300 of FIG. 8. Therefore, three fins may be formed for configuring a unit cell, but for convenience, only one the fin 305a is illustrated but not limited thereto. Also, as described above, one fin 305a may configure the unit cell.

Figure 21A:
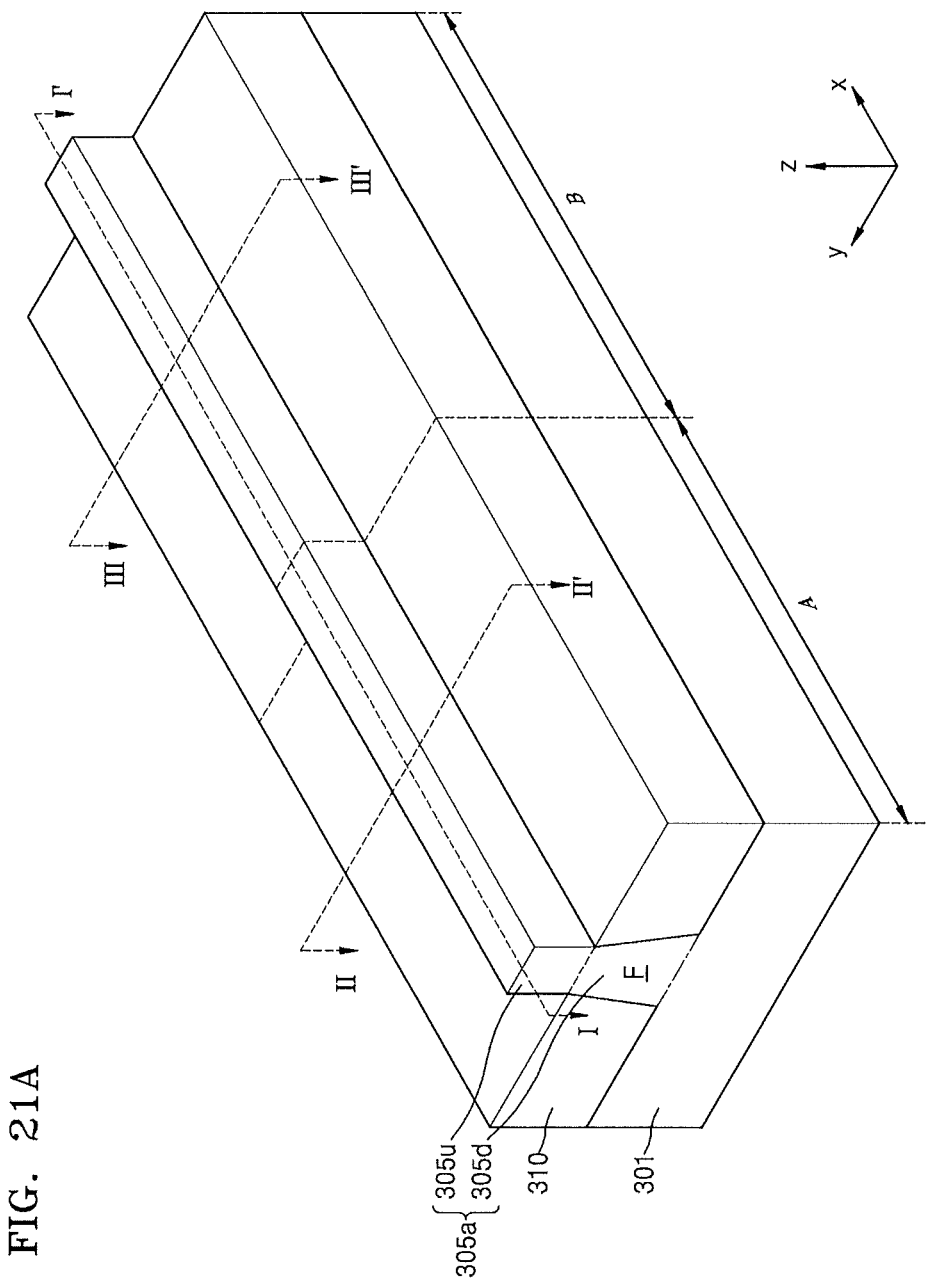
Figure 21B:
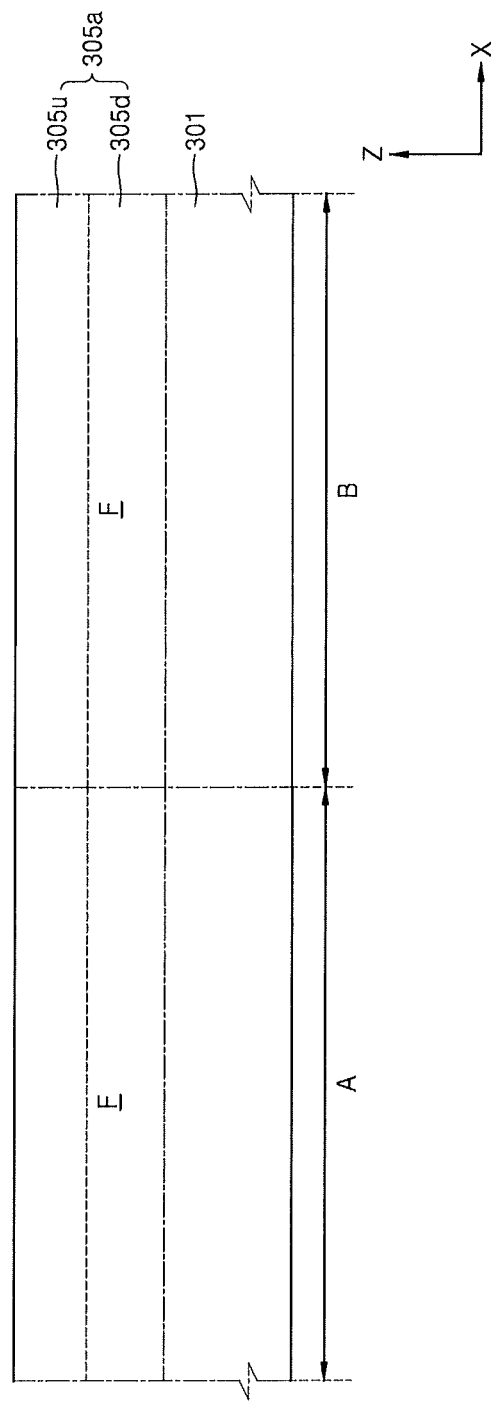
Figure 21C:
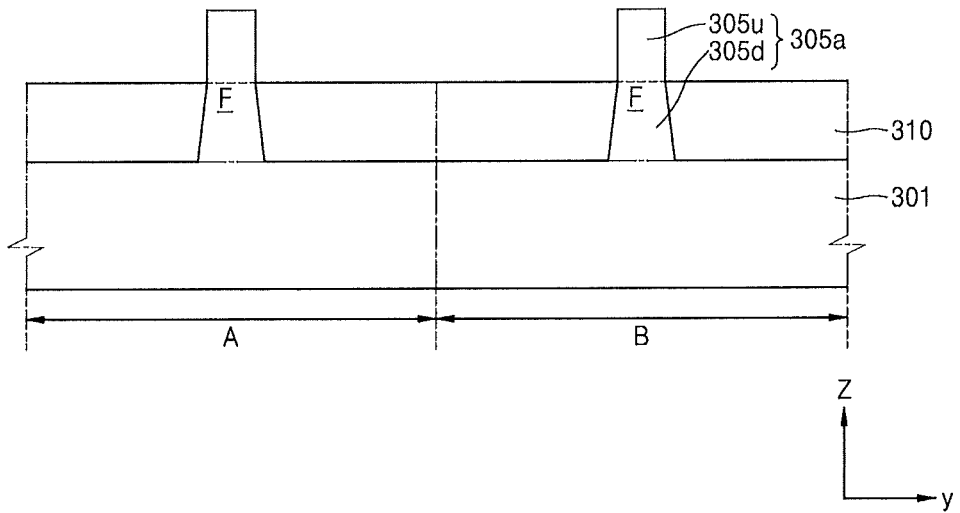

Referring to FIGS. 21A to 21C, after the fin 305a is formed, an isolation layer 310 which covers lower portions of both sides of the fin 305a may be formed. Since the isolation layer 310 is formed, an upper portion (i.e., the upper fin portion 305u) of the fin 305a may have a structure which protrudes from the isolation layer 310.

An insulation layer covering a resultant material on the semiconductor substrate 301 may be formed and planarized. Subsequently, an upper portion of the isolation layer 310 may be removed in order for the upper portion of the fin 305a to protrude, thereby forming the isolation layer 310. In addition, details of a material of the isolation layer 310 are as described above with reference to FIGS. 9A to 9C.

Figure 22A:
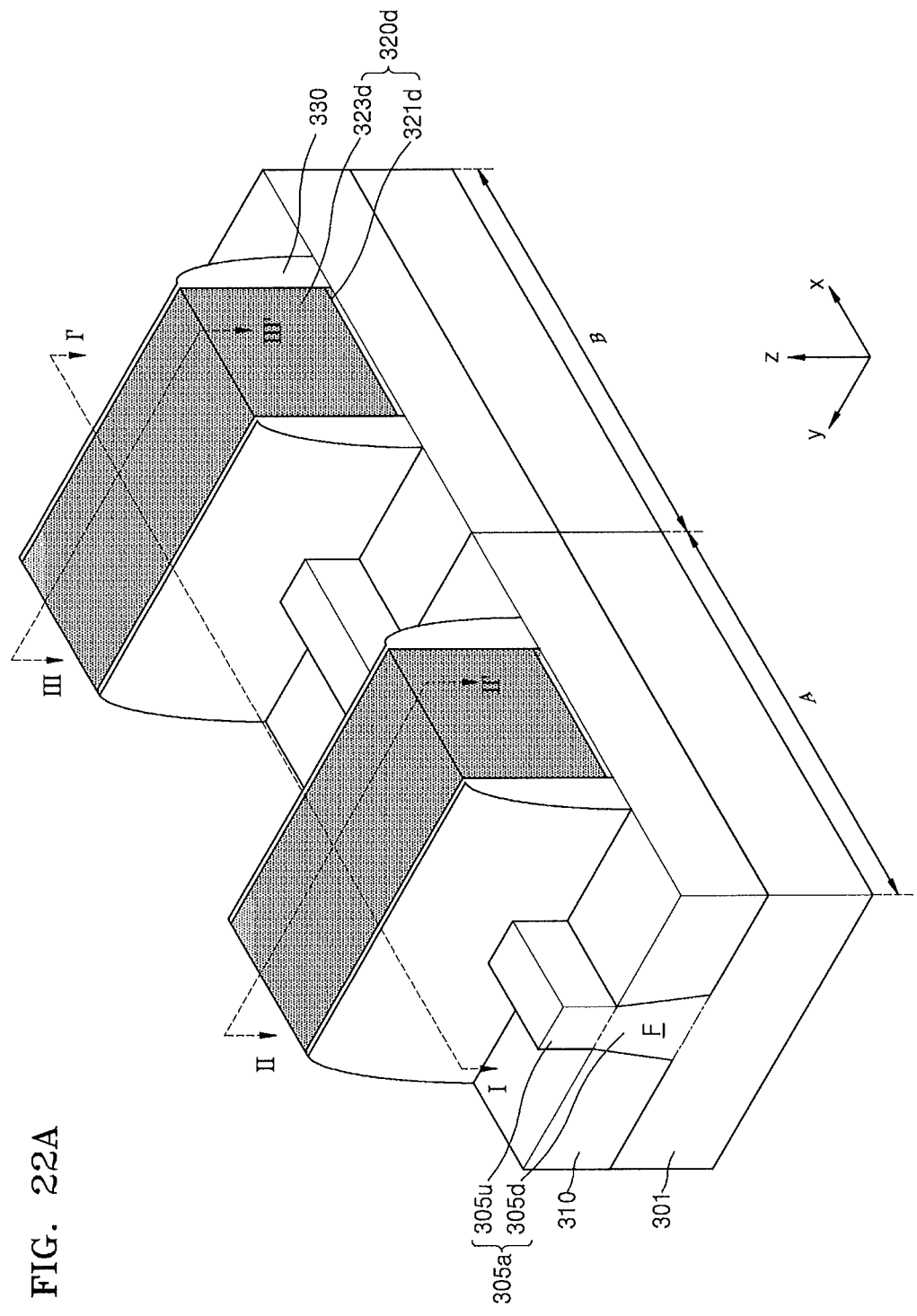
Figure 22B:
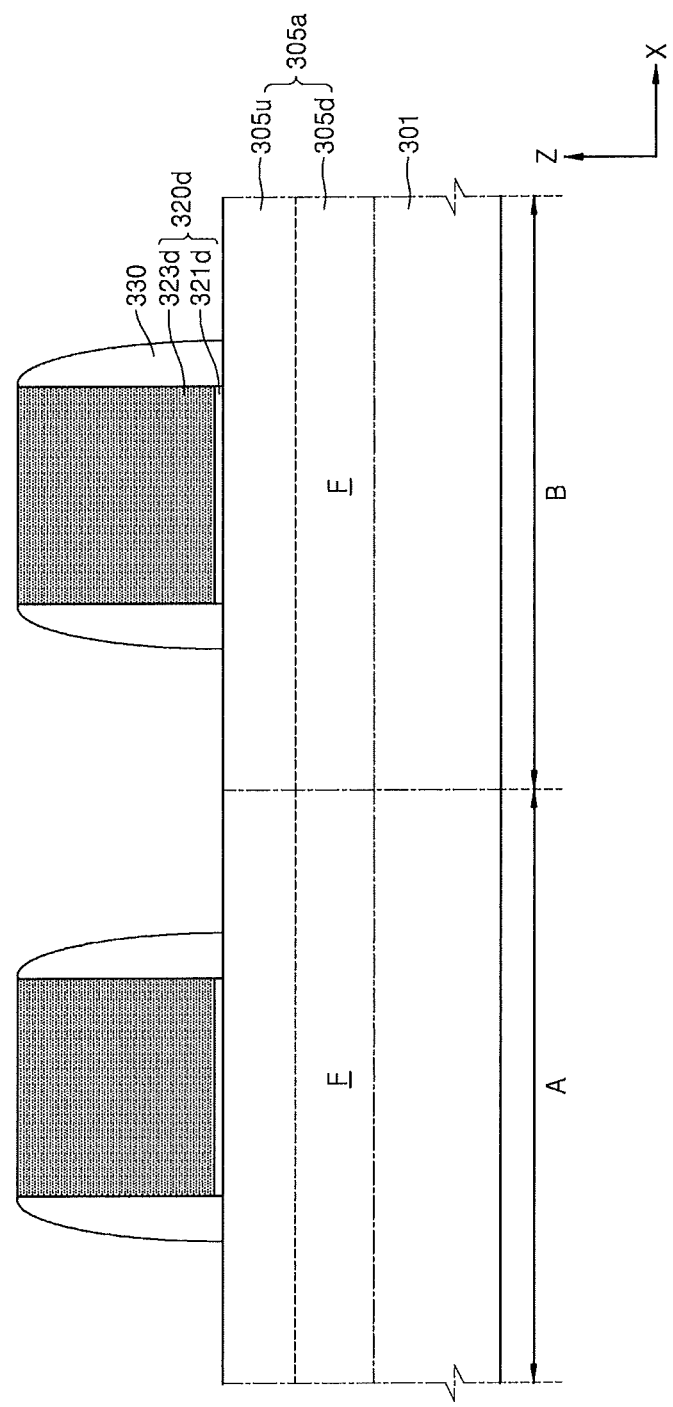
Figure 22C:
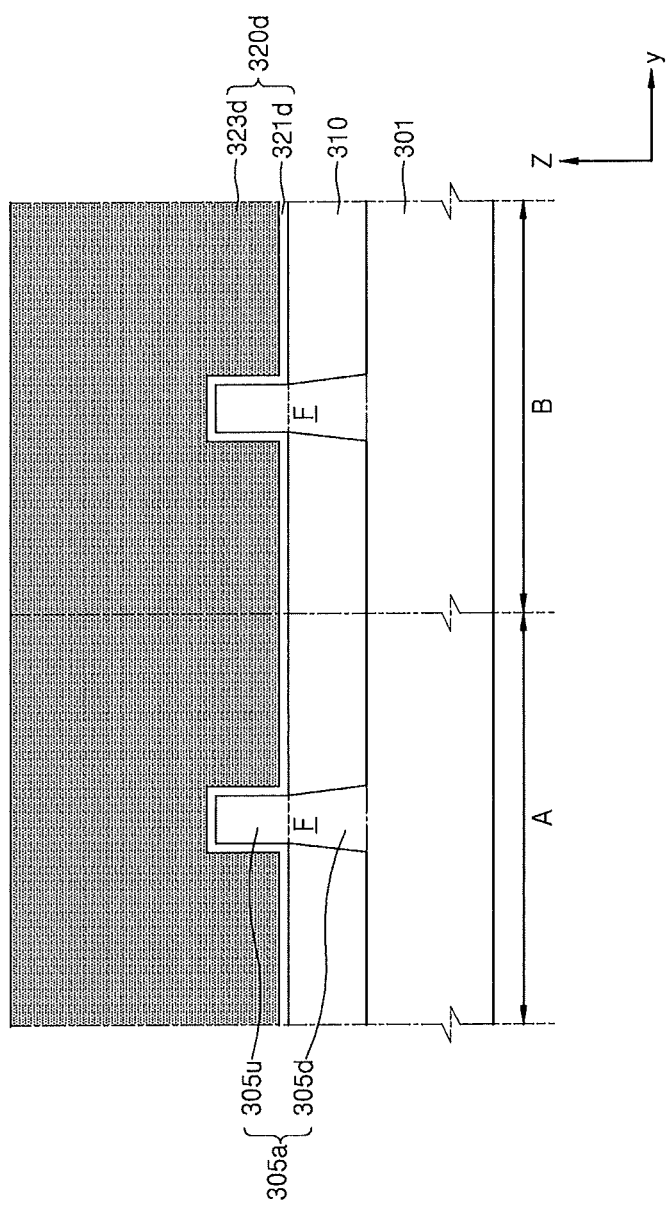

Referring to FIGS. 22A to 22C, after the isolation layer 310 is formed, a dummy gate structure 320d which includes a dummy gate insulation layer 321d and a dummy gate electrode 323d may be formed. A spacer 330 may be formed on both sides of the dummy gate structure 320d. The dummy gate structure 320d, for example, may be formed in a structure which extends in a second direction (e.g., along a y-axis). A process of forming the dummy gate structure 320 and the spacer 330 similar to that described above with reference to FIG. 19A. However, the fin 305a may be formed on the semiconductor substrate 301, and the isolation layer 310 which surrounds lower portions of both sides of the lower fin portion 305d of the fin 305a may be formed, whereby the dummy gate structure 320d and the spacer 330 may be formed in a structure, which surrounds a top and a side of the upper fin portion 305u of the fin 305a, on the isolation layer 310.

Figure 23A:
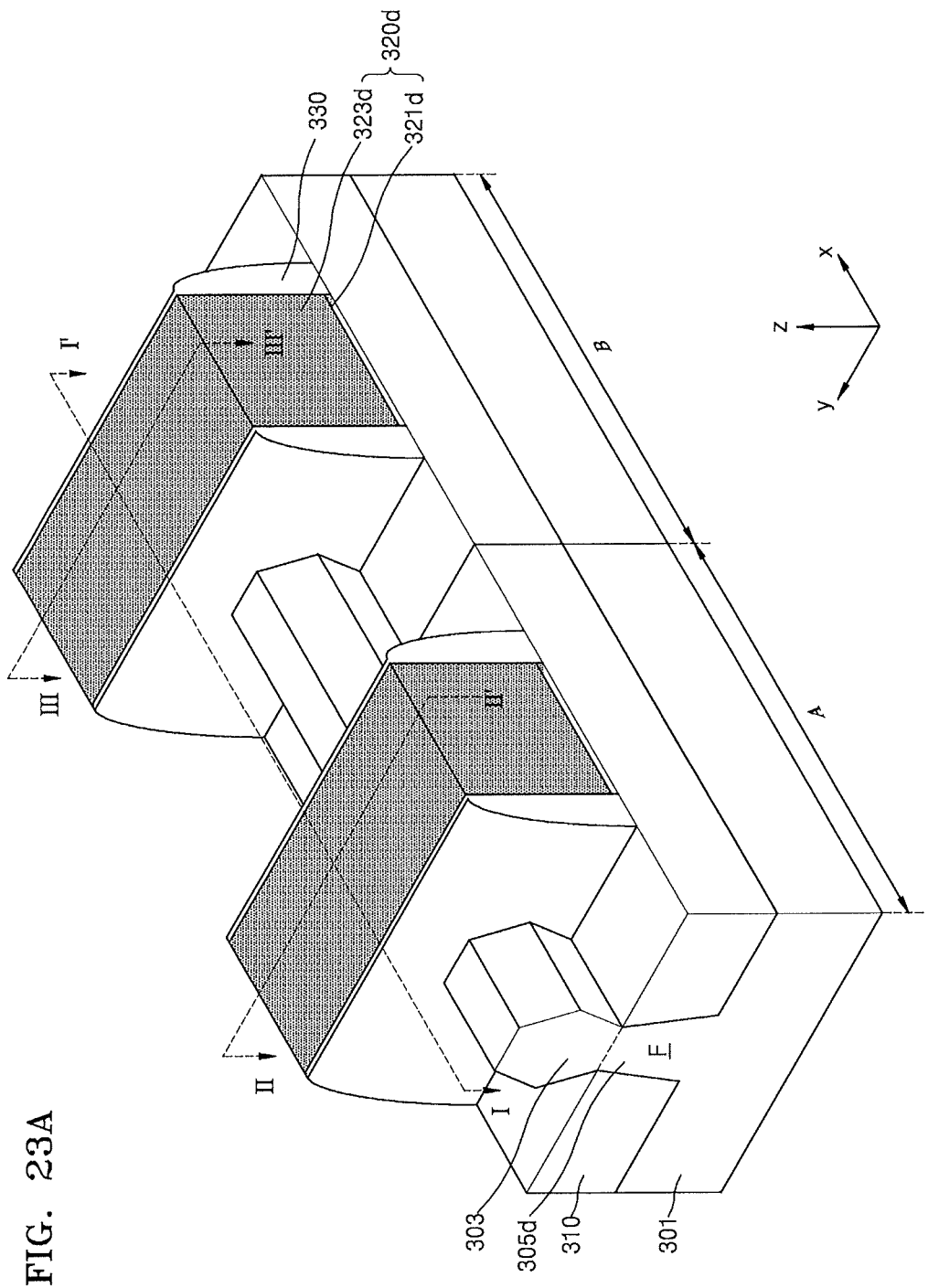
Figure 23B:
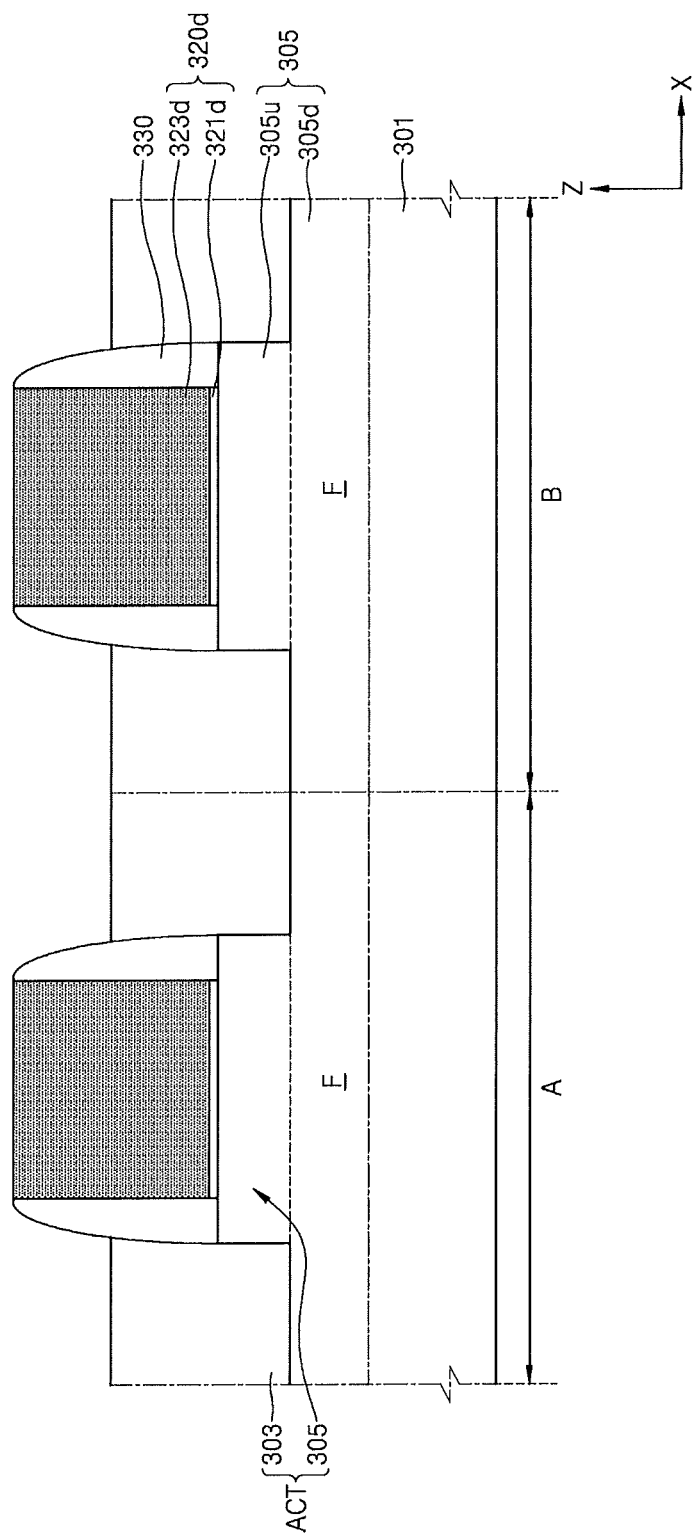
Figure 23C:
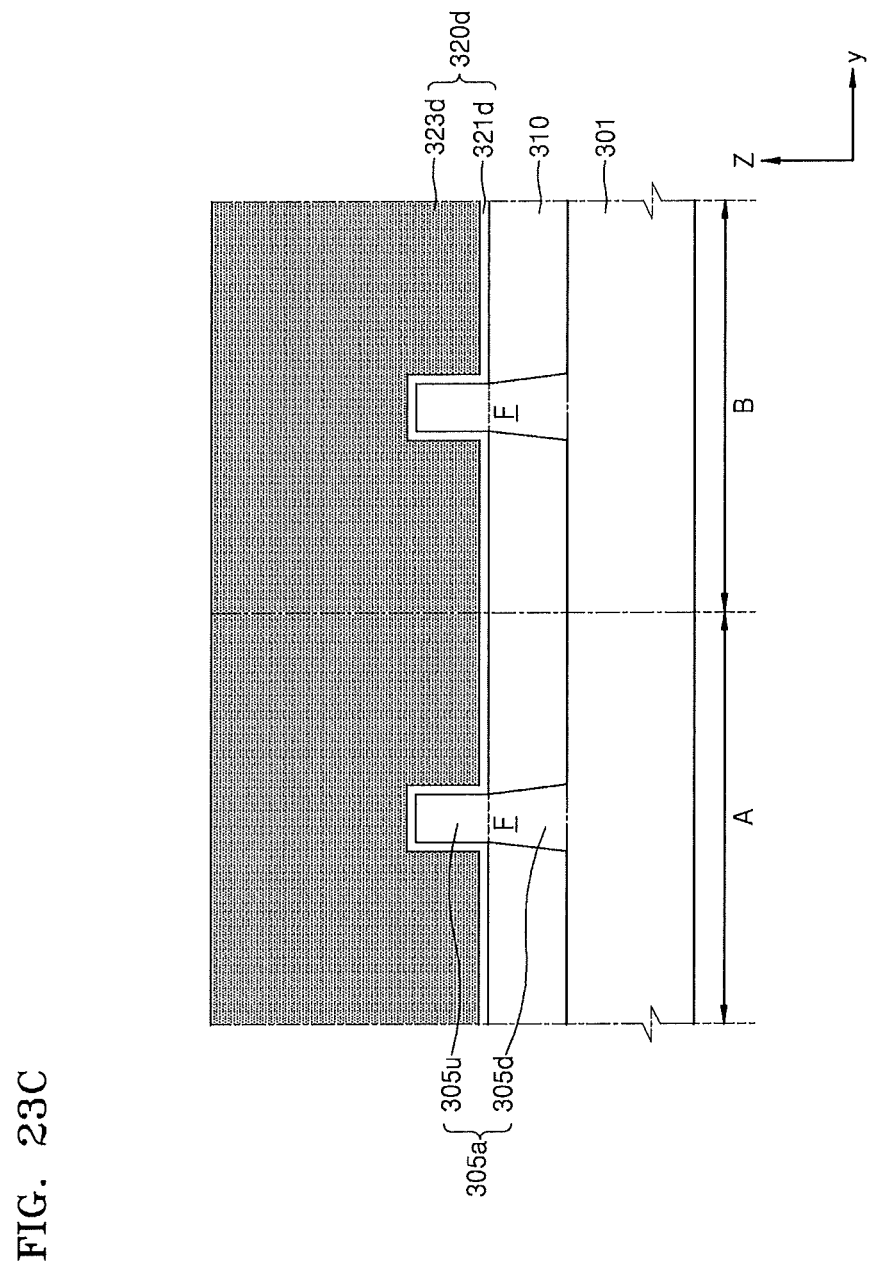

Referring to FIGS. 23A to 23C, the upper fin portion 305u protrudes to both sides of the dummy gate structure 320d and from the isolation layer 310, and may be removed. A source/drain region 303 may be formed. In detail, the source/drain region 303 may be formed by removing the upper fin portion 305u which protrudes from the isolation layer 310 and growing an epi-layer in the lower fin portion 305d. For example, the source/drain region 303 may include at least one of SiGe, Ge, Si, and SiC which have epitaxially grown in the lower fin portion 305d. Also, impurities may be doped in the source/drain region 303 at the same time with or after an epi-layer growing process.

As illustrated in FIG. 23B, a top of the source/drain region 303 may be higher in position than a top region or surface of the upper fin portion 305u under the dummy gate structure 320d. Also, the source/drain region 303 may partially cover a lower portion of the spacer 330. Depending on the case, the upper fin portion 305u may not be removed, and the source/drain region 303 may be formed based on the upper fin portion 305u. The source/drain region 303 may maintain an initial shape of the upper fin portion 305u or may have a shape different from the initial shape of the upper fin portion 305u though a growth of an epi-layer.

In a program transistor T0 formed in the OTP memory device region A, as described above, a separate source/drain region 303 may not be formed on one side of the dummy gate structure 320d depending on the kind of an OTP memory device.

Figure 24A:
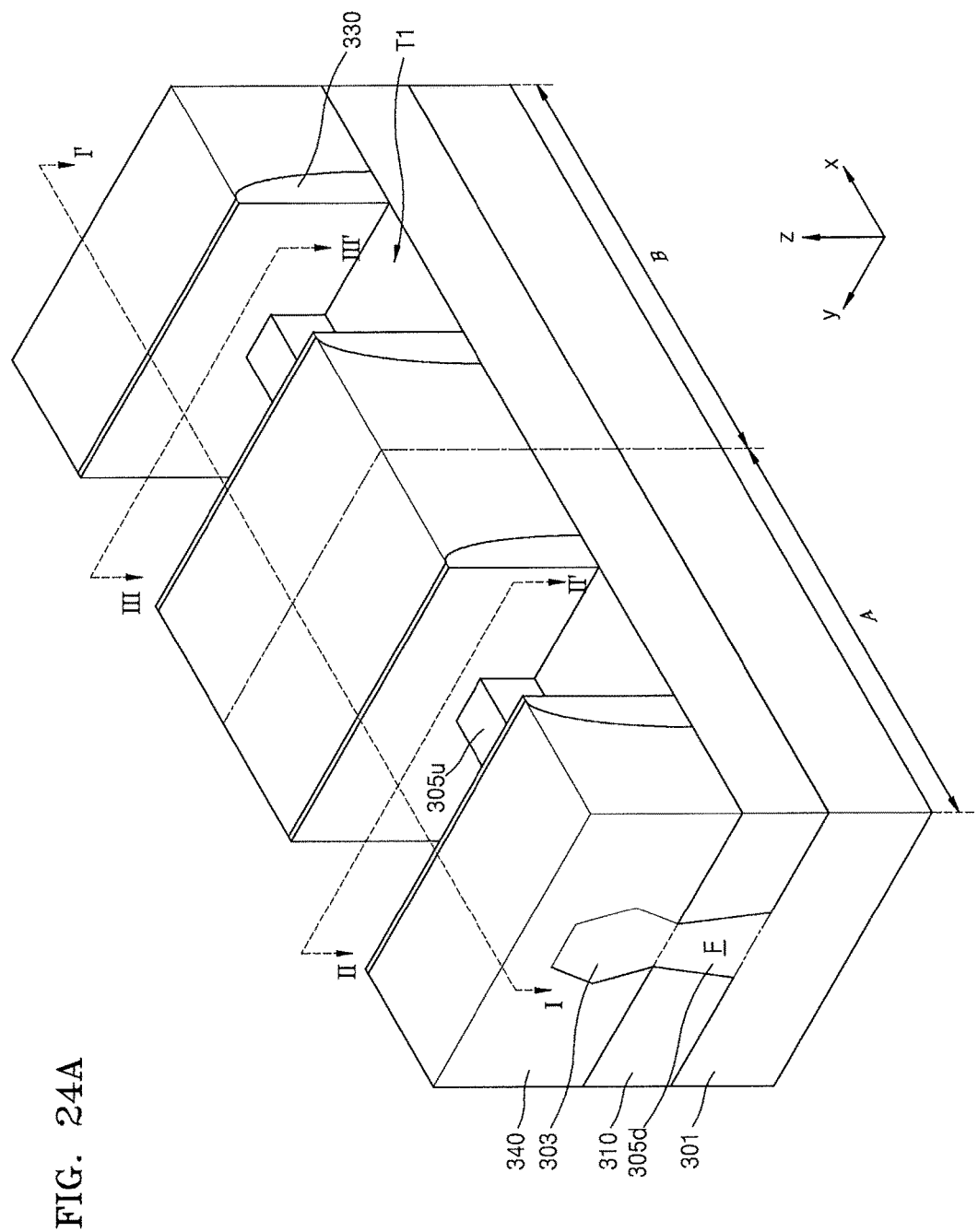
Figure 24B:
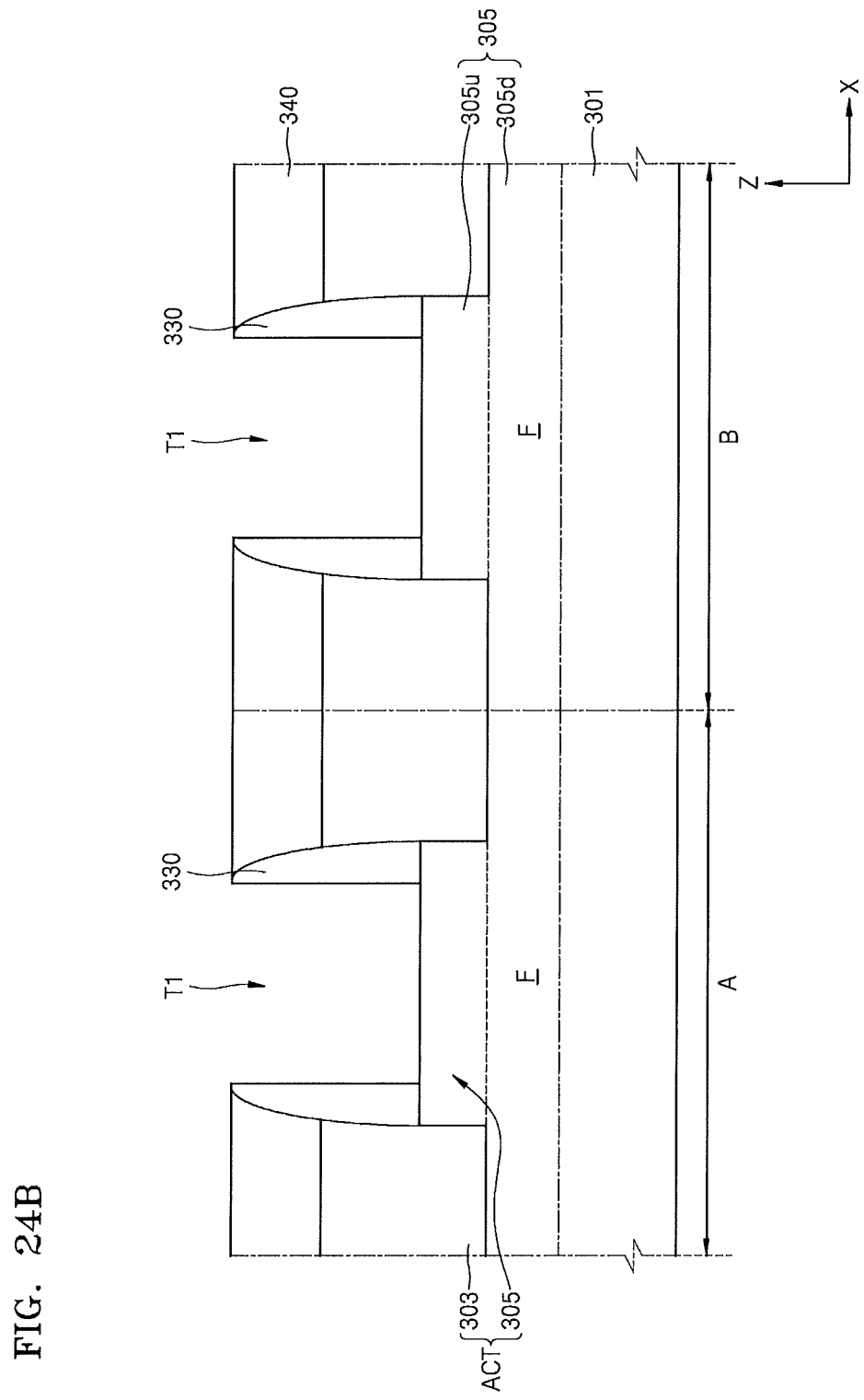
Figure 24C:
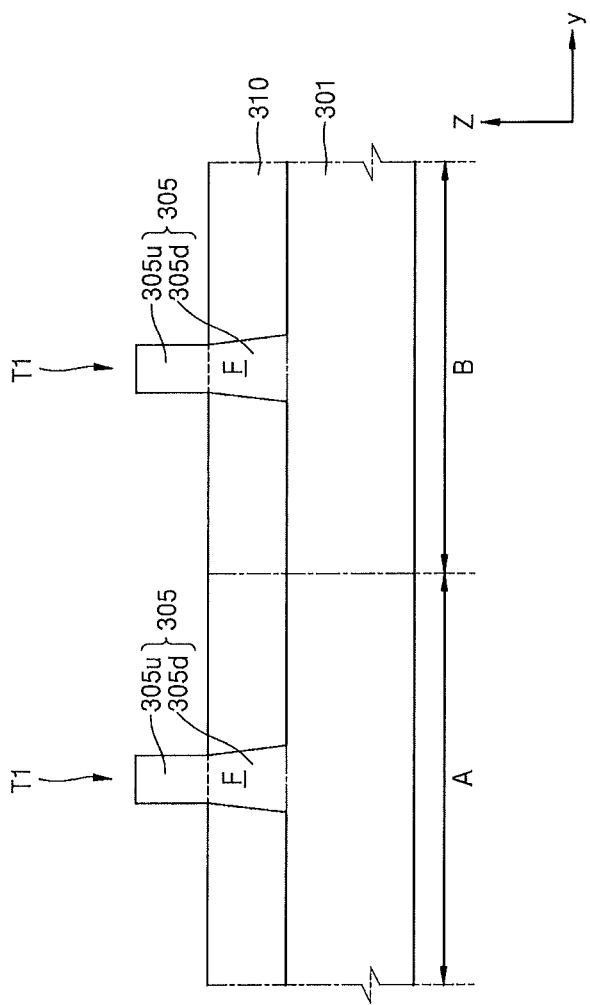

Referring to FIGS. 24A to 24C, after the source/drain region 303 is formed, an insulation layer covering a resultant material on the semiconductor substrate 301 may be formed. An interlayer insulation layer 340 may be formed by planarizing the insulation layer. Details of a material of the interlayer insulation layer 340 are as described above by way of example with reference to FIGS. 9A to 9C.

After the interlayer insulation layer 340 is formed, the dummy gate structure 320d may be removed. The removal or the dummy gate structure 320d is as described above with reference to FIG. 19C. As illustrated in FIG. 24C, a top and a side of the upper fin portion 305u may be exposed through a trench T1 which is formed by removing the dummy gate structure 320d.

In addition, although not shown in FIG. 24C, in a cross-sectional structure taken along line III-III', after the dummy gate structure 320d is removed, the spacer 330 may be externally seen with respect to the top and side of the upper fin portion 305u, but is not illustrated.

Figure 25A:
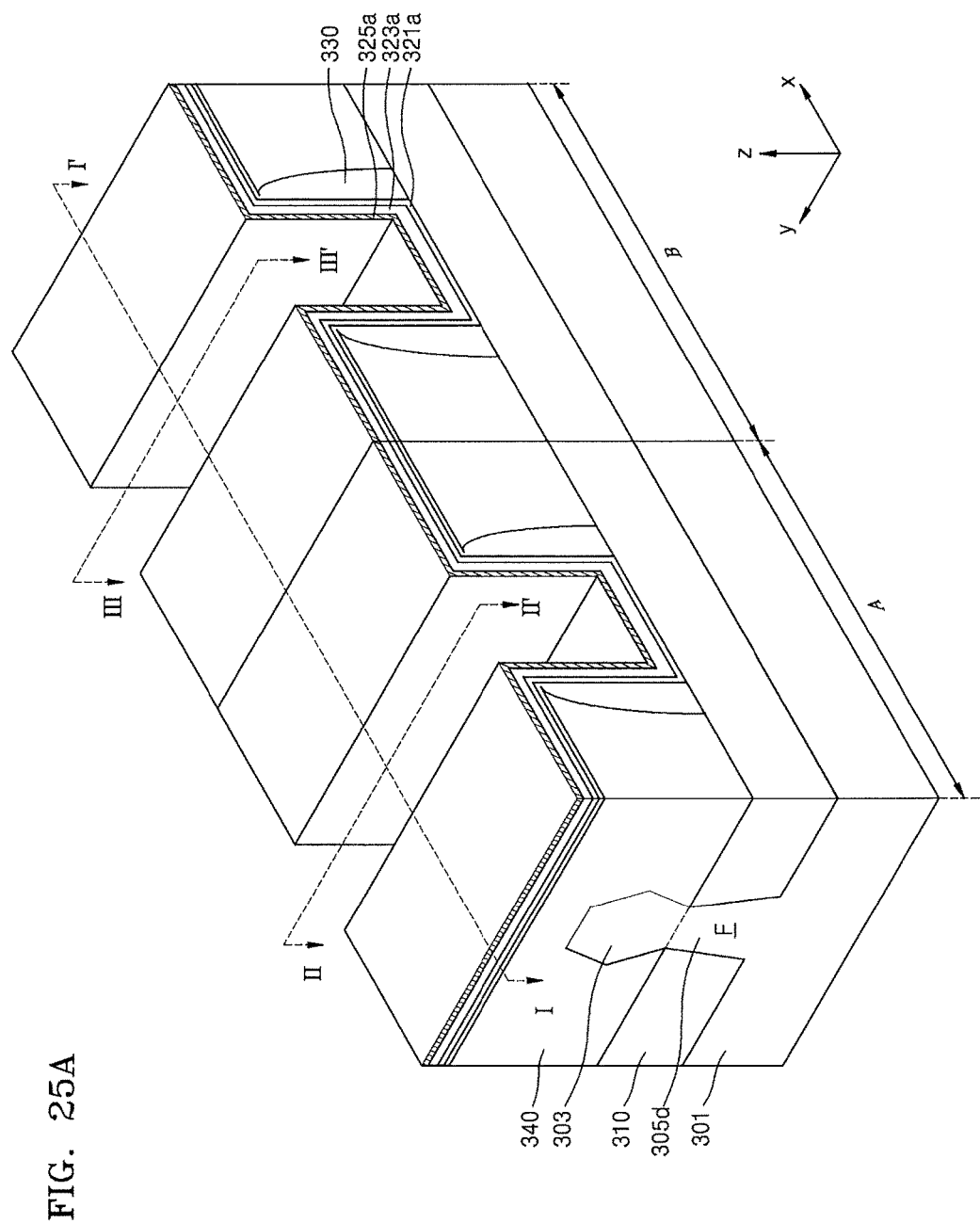
Figure 25B:
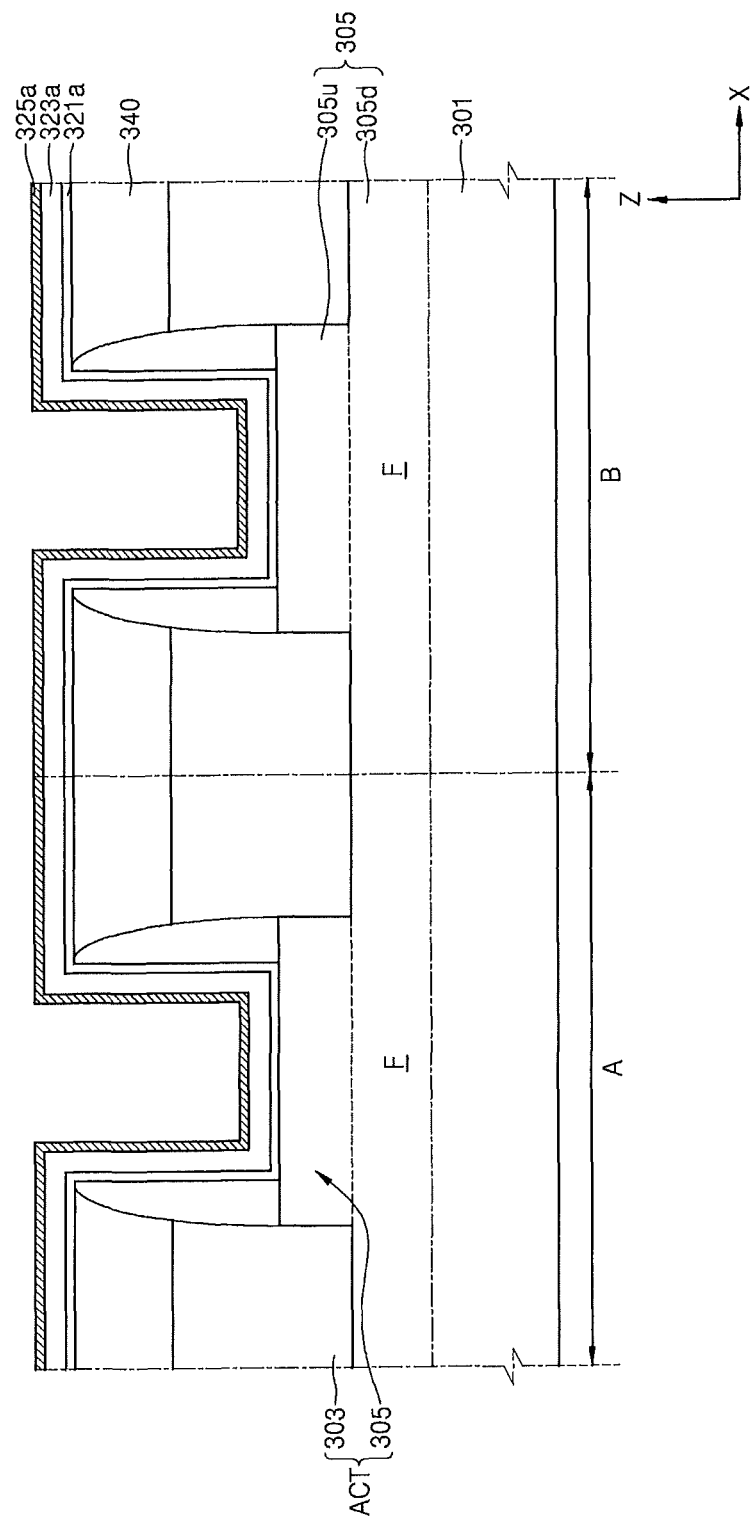
Figure 25C:
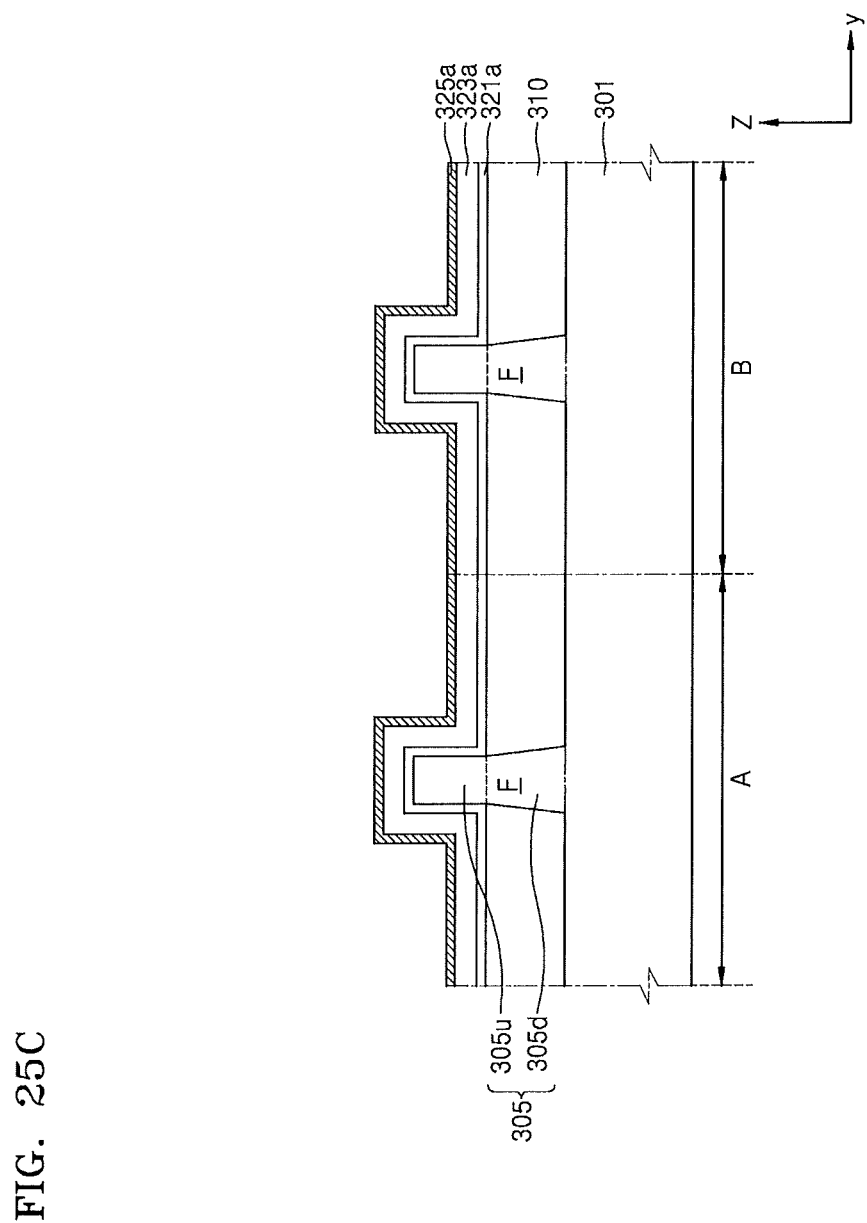

Referring to FIGS. 25A to 25C, an interface layer 321a, a high-k dielectric layer 323a, and an RE supply layer 325a may be sequentially and conformally formed on the resultant material on the semiconductor substrate 301. The functions, materials, or formation methods of the interface layer 321a, the high-k dielectric layer 323a, and the RE supply layer 325a are as described above with reference to FIG. 19D.

In FIG. 25C, a side portion of the RE supply layer 325a may be externally viewed, but is not illustrated.

Figure 26A:
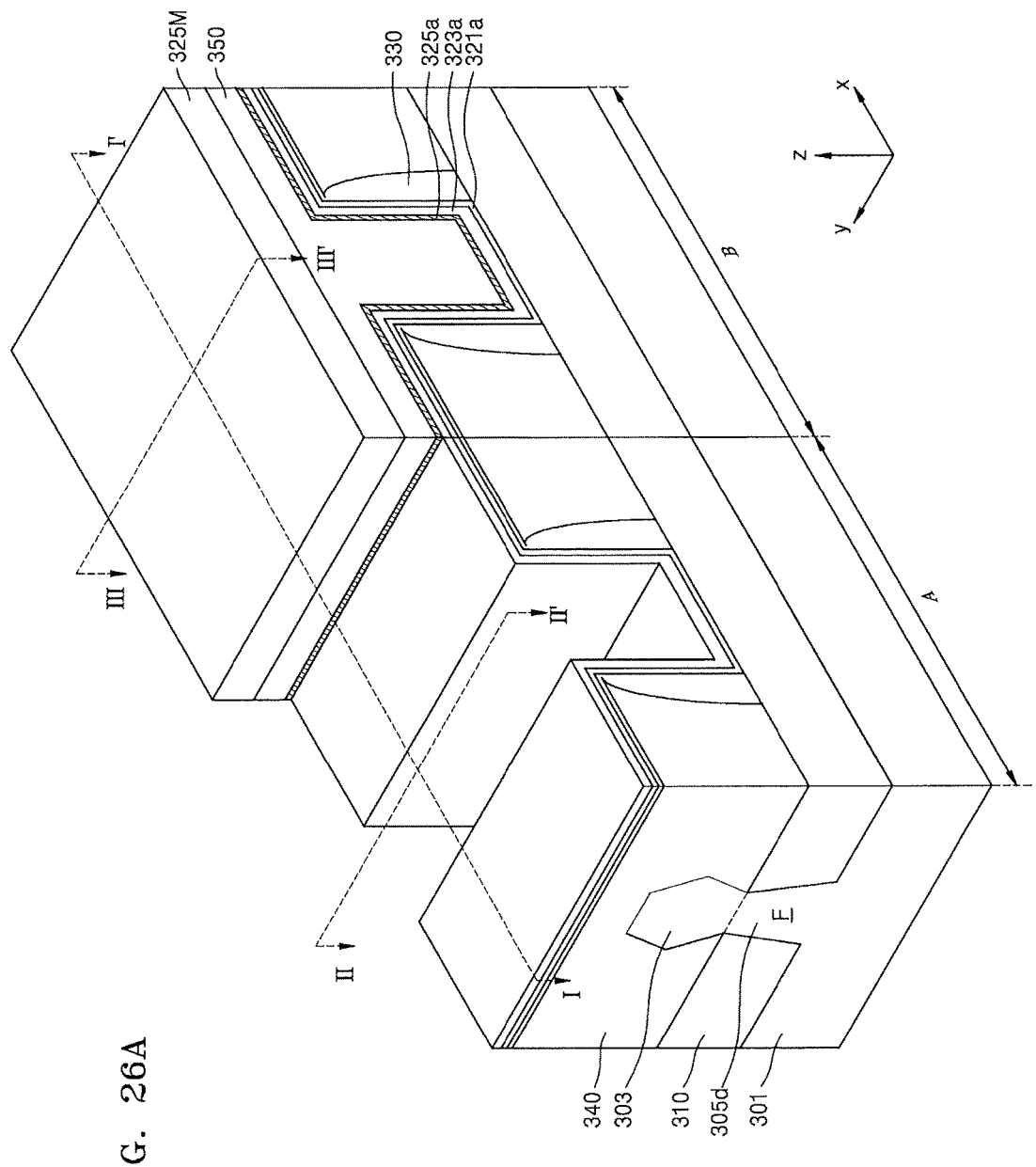
Figure 26B:
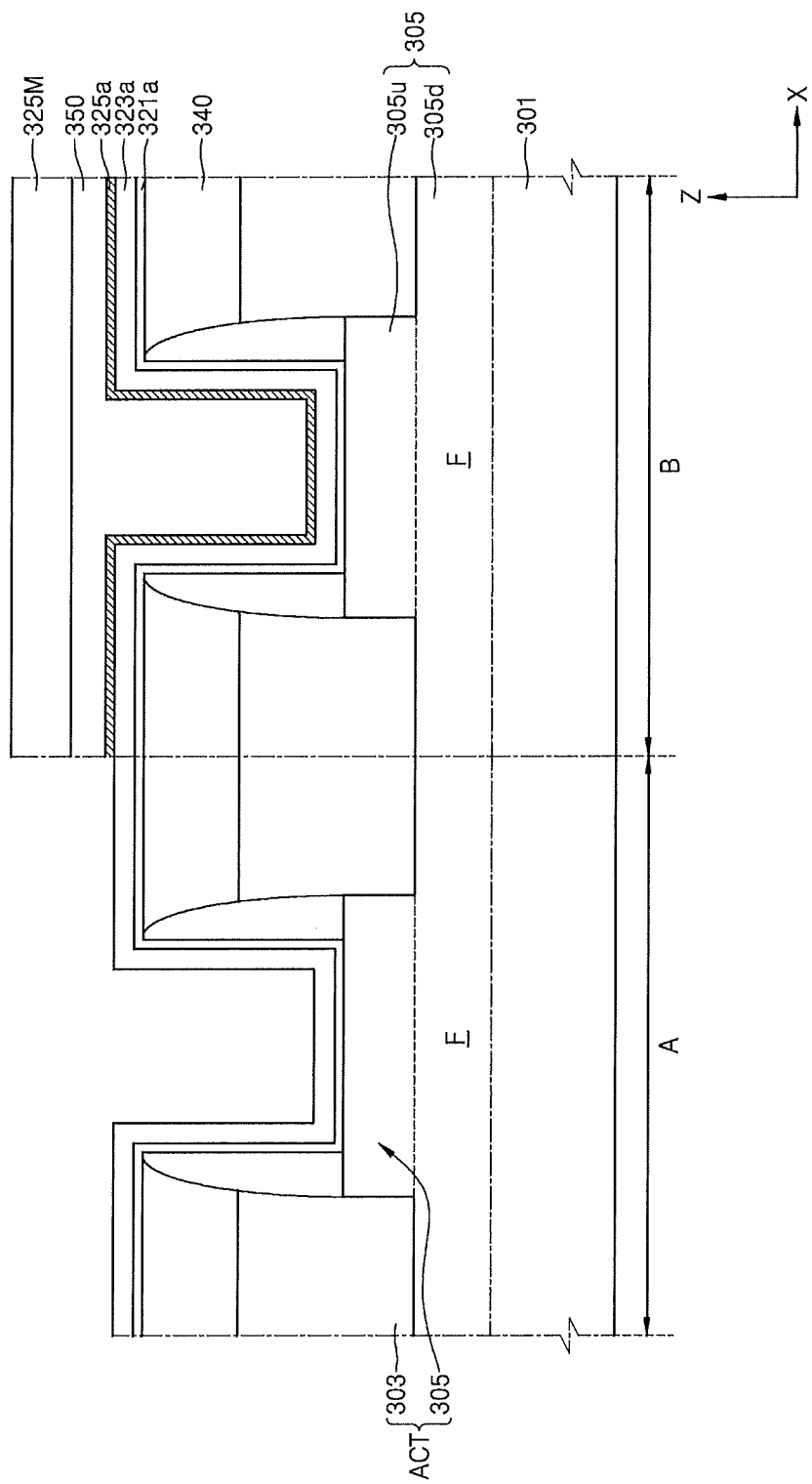
Figure 26C:
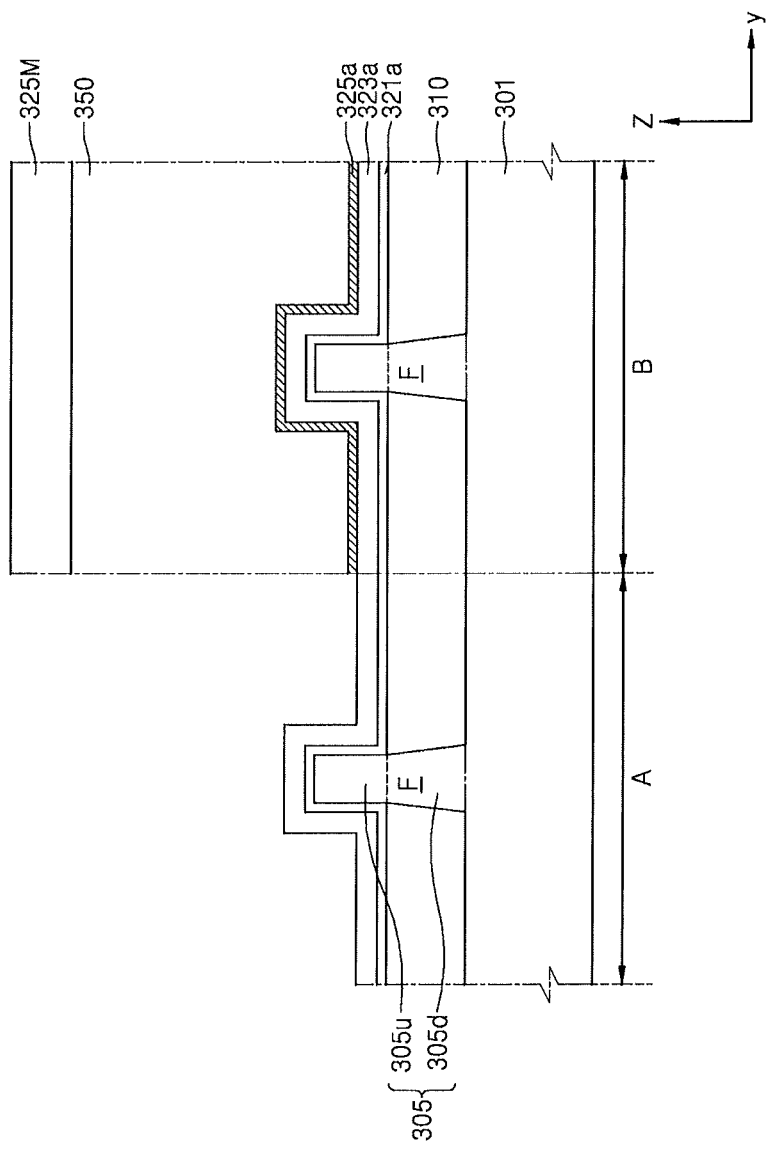

Referring to FIGS. 26A to 26C, a sacrificial layer 350 may be formed on the RE supply layer 325a. The sacrificial layer may be formed to a thickness which sufficiently fills a gap remaining after the RE supply layer 325a is formed. When a width of the remaining gap is narrow, the sacrificial layer 350 may be omitted. After the sacrificial layer 350 is formed, a planarizing process such as the CMP process may be optionally performed. After the sacrificial layer 350 is formed, a first mask 325M may be formed at the logic device region B.

Subsequently, the sacrificial layer 350 and the RE supply layer 325a in the OTP memory device region A may be removed by performing an etching process using the first mask 325M. By removing the RE supply layer 325a, as illustrated, a top of the high-k dielectric layer 323a may be exposed in the OTP memory device region A. Depending on the case, a portion of the RE supply layer 325a may remain in the OTP memory device region A. After the RE supply layer 325a is removed, the first mask 325M and the sacrificial layer 350 at the logic device region B may be removed.

Similarly to FIG. 24C, in the OTP memory device region A of FIG. 26C, a side portion of the high-k dielectric layer 323a may be externally seen, but is not illustrated.

Figure 27A:
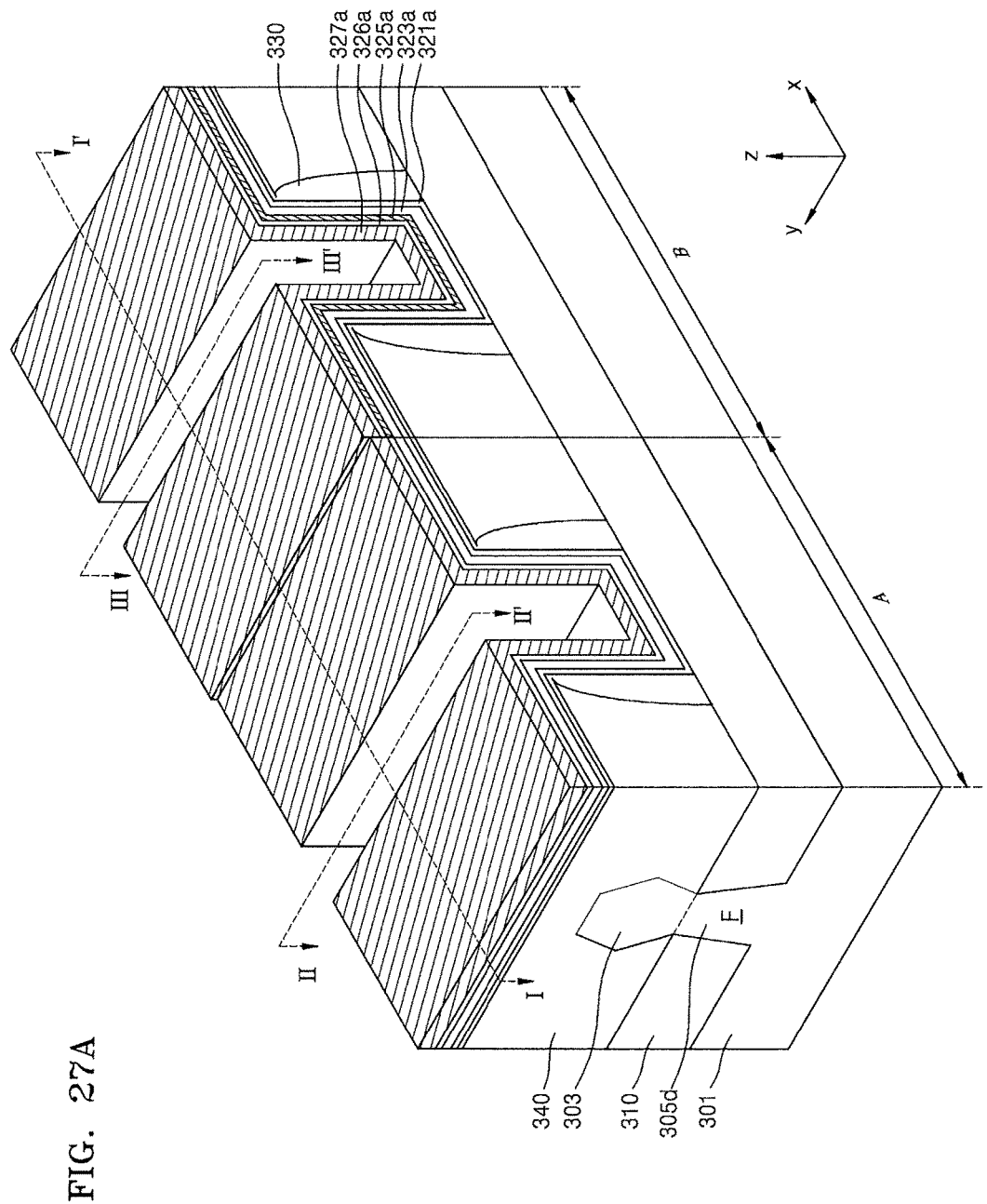
Figure 27B:
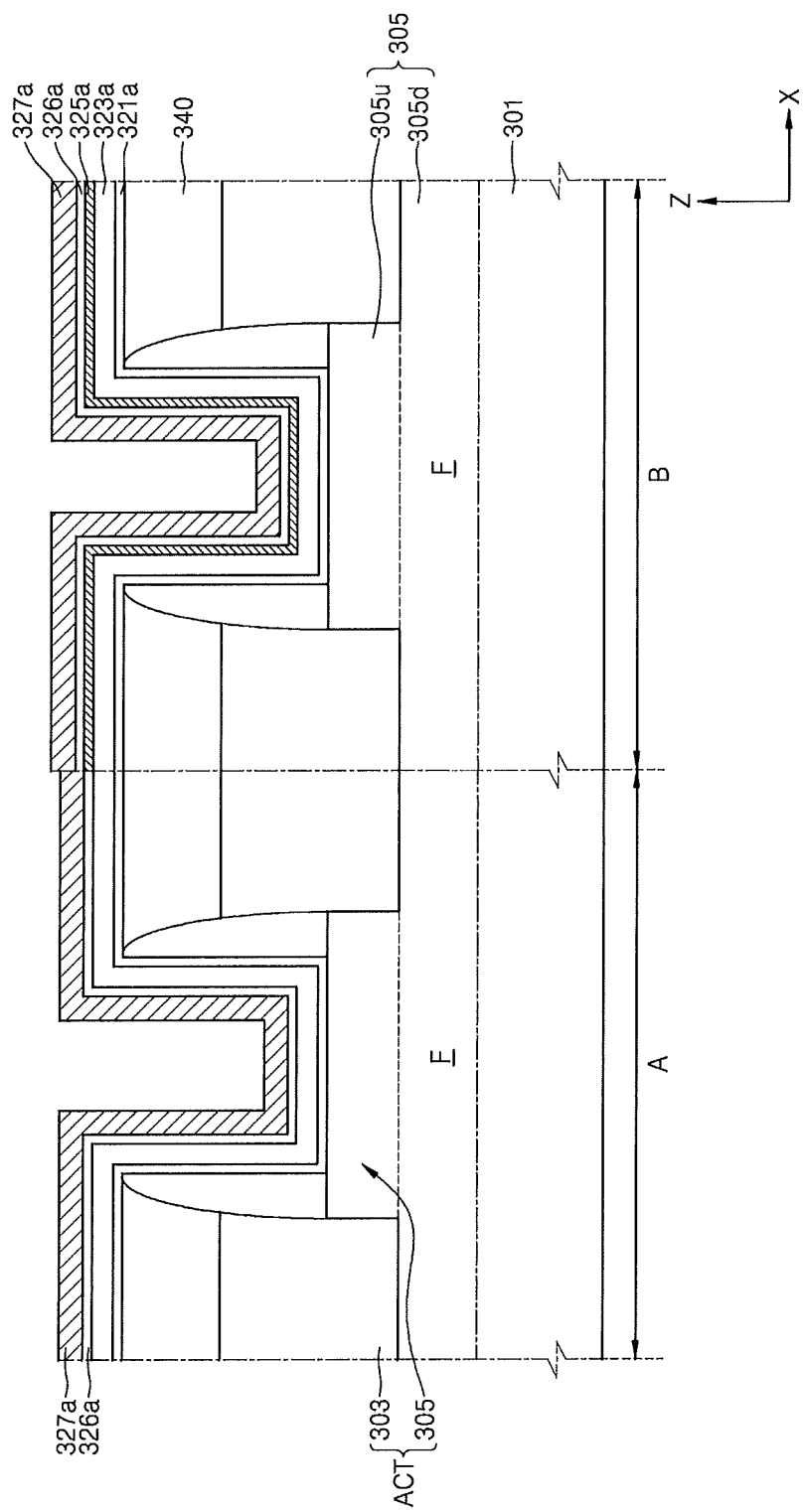
Figure 27C:
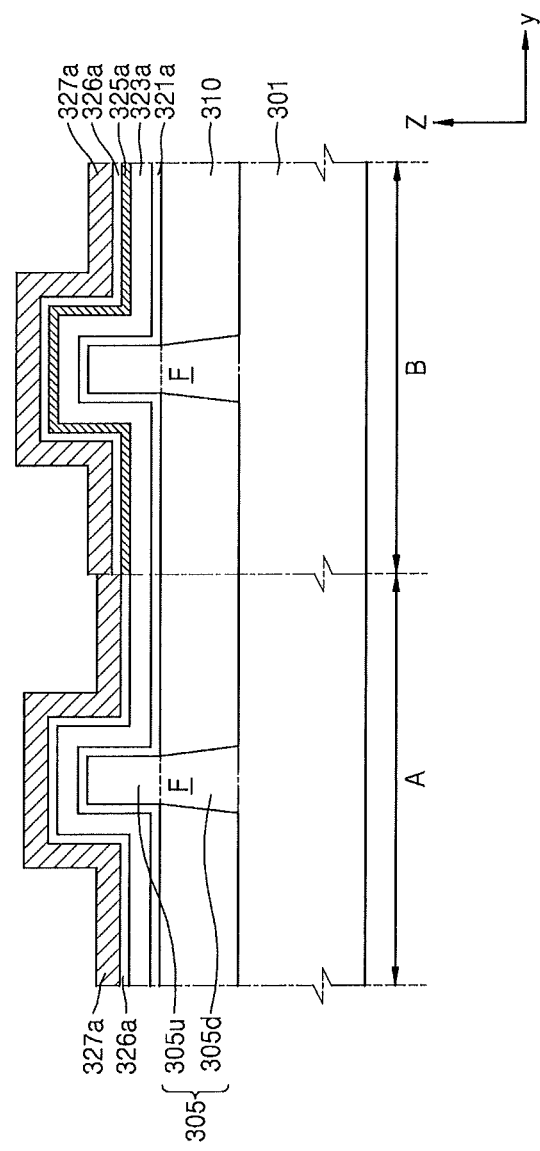

Referring to FIGS. 27A to 27C, after the first mask 325M is removed, a barrier metal layer 326a and a first metal layer 327a may be sequentially formed on the resultant material on the semiconductor substrate 301. The functions, materials, or formation methods of the barrier metal layer 326a and the first metal layer 327a are as described above with reference to FIG. 19F. Also, REs may be diffused from the RE supply layer 325a to the first metal layer 327a by thinly adjusting a thickness of the barrier metal layer 326a or omitting the barrier metal layer 326a itself.

Figure 28A:
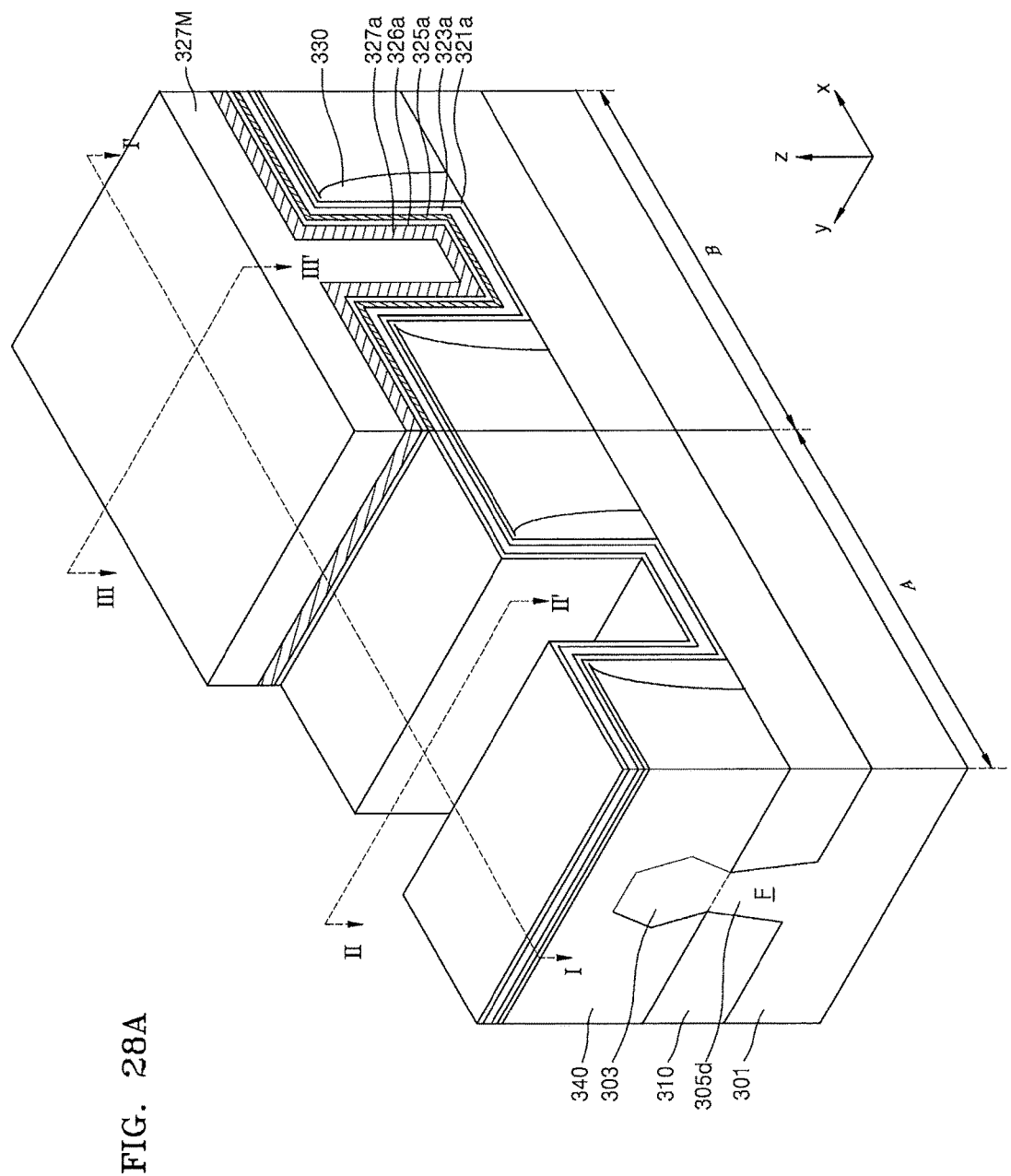
Figure 28B:
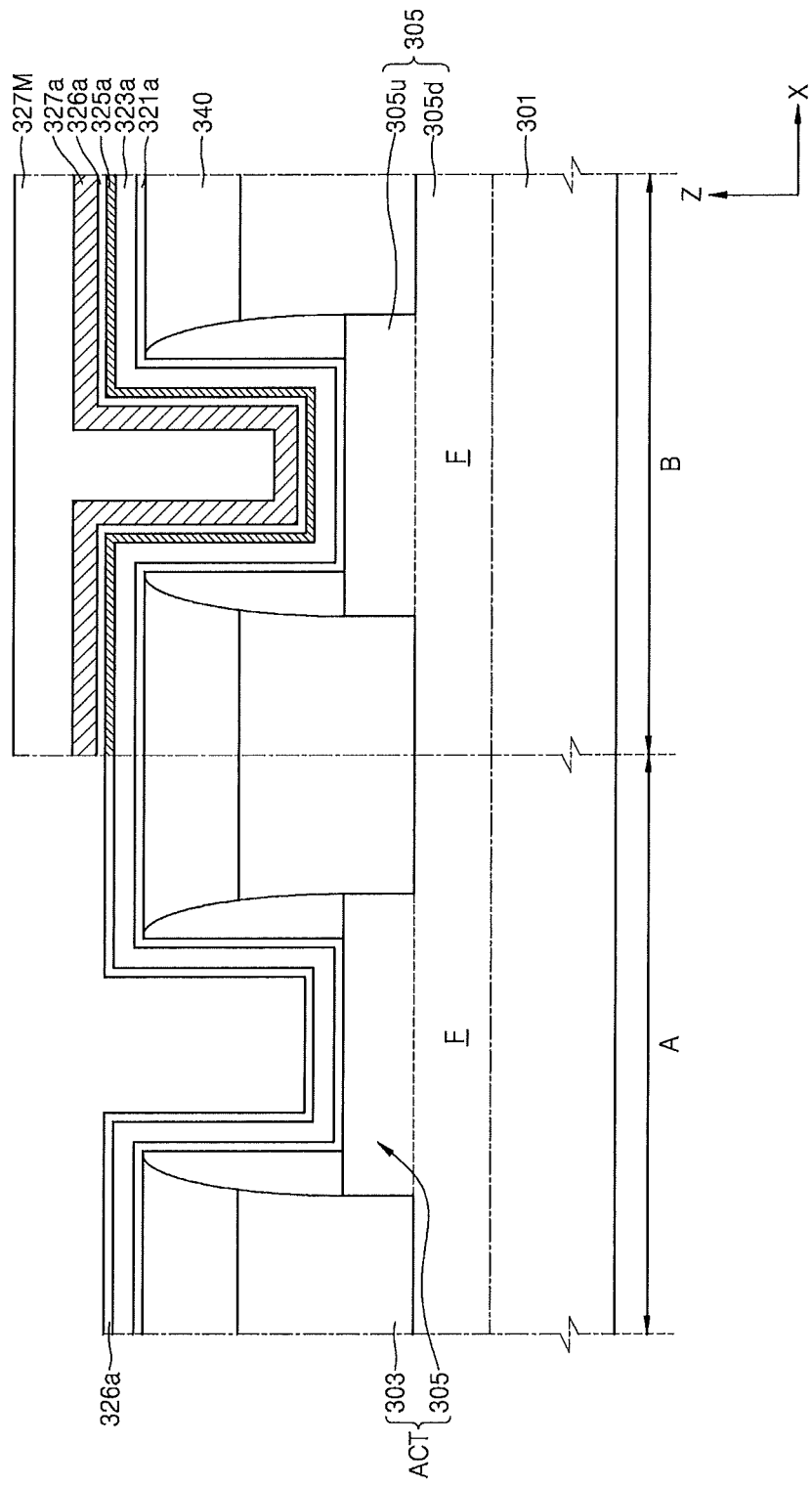
Figure 28C:
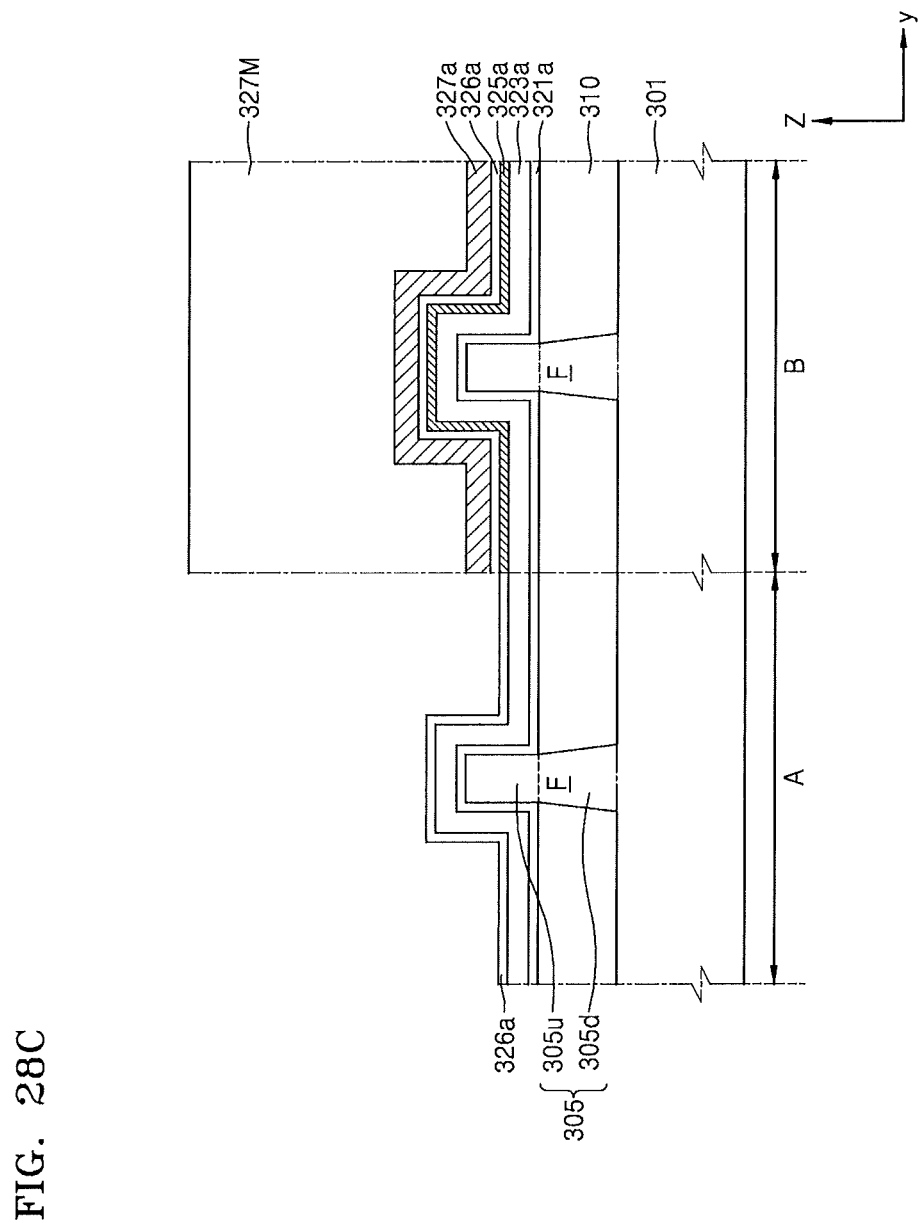

Similarly to FIG. 24C, in FIG. 27C, a side portion of the first metal layer 327a may be externally seen, but is not illustrated, Referring to FIGS. 28A to 28C, after the first metal layer 327a is formed, a second mask 327M may be formed in at logic device region B. The second mask 327M may be formed of, for example, PR or a hard mask through the photolithography process. Also, when a width of a gap remaining after the first metal layer 327a is formed is broad, a sacrificial layer may be formed before the second mask 327M is formed. Subsequently, the first metal layer 327a in the OTP memory device region A may be removed by performing an etching process with the second mask 327M. Therefore, the harrier metal layer 326a may be exposed in the OTP memory device region A. Depending on the case, the first metal layer 327a may be thinly maintained in the OTP memory device region A. Also, the barrier metal layer 326a may be may be removed due to over-etching. After the first metal layer 327a in the OTP memory device region A is removed, the second mask 327M may be removed.

Similarly to FIG. 24C, in the OTP memory device region A of FIG. 28C, a side portion of the barrier metal layer 326a may be externally seen, but is not illustrated.

Figure 29A:
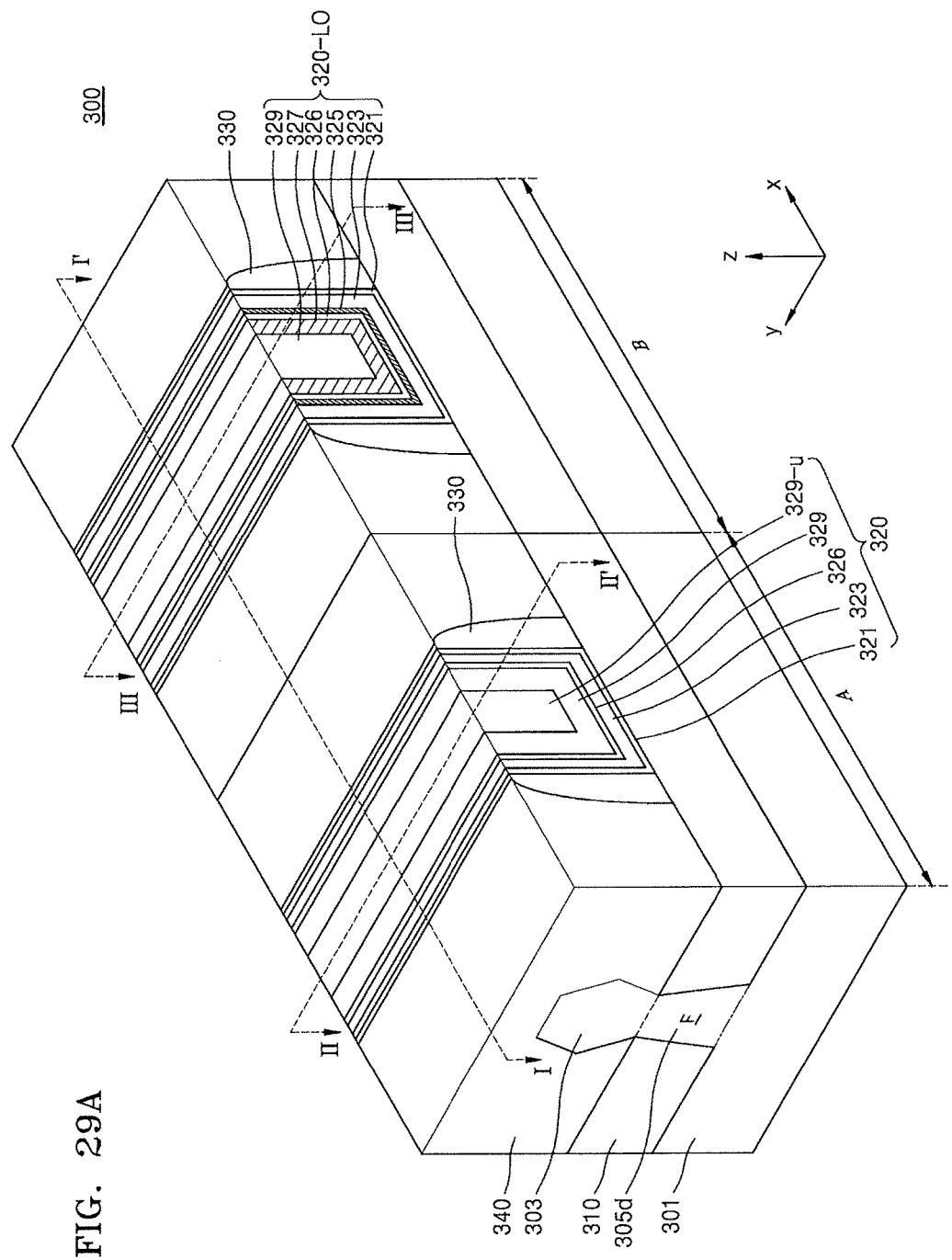
Figure 29B:
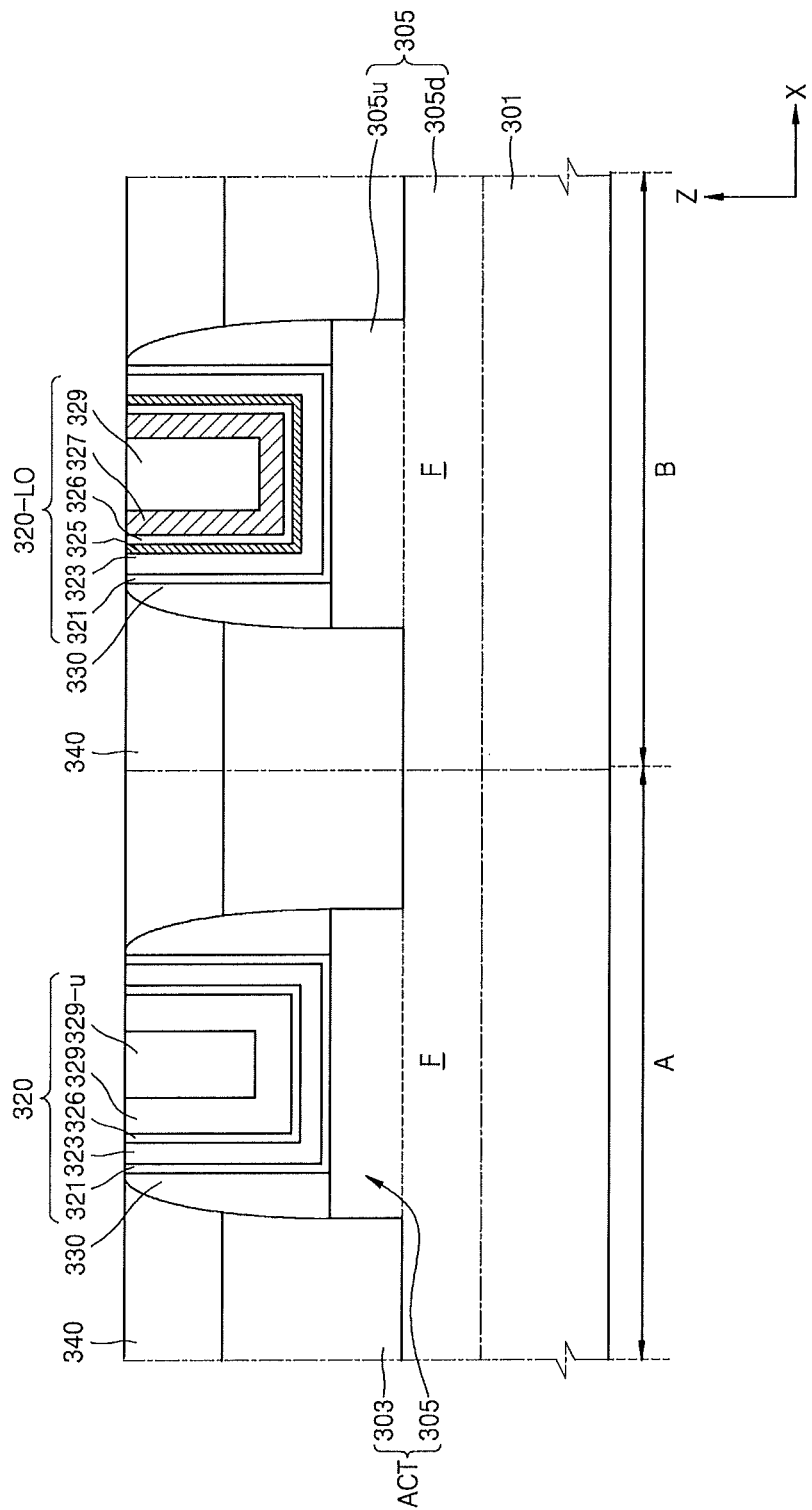
Figure 29C:
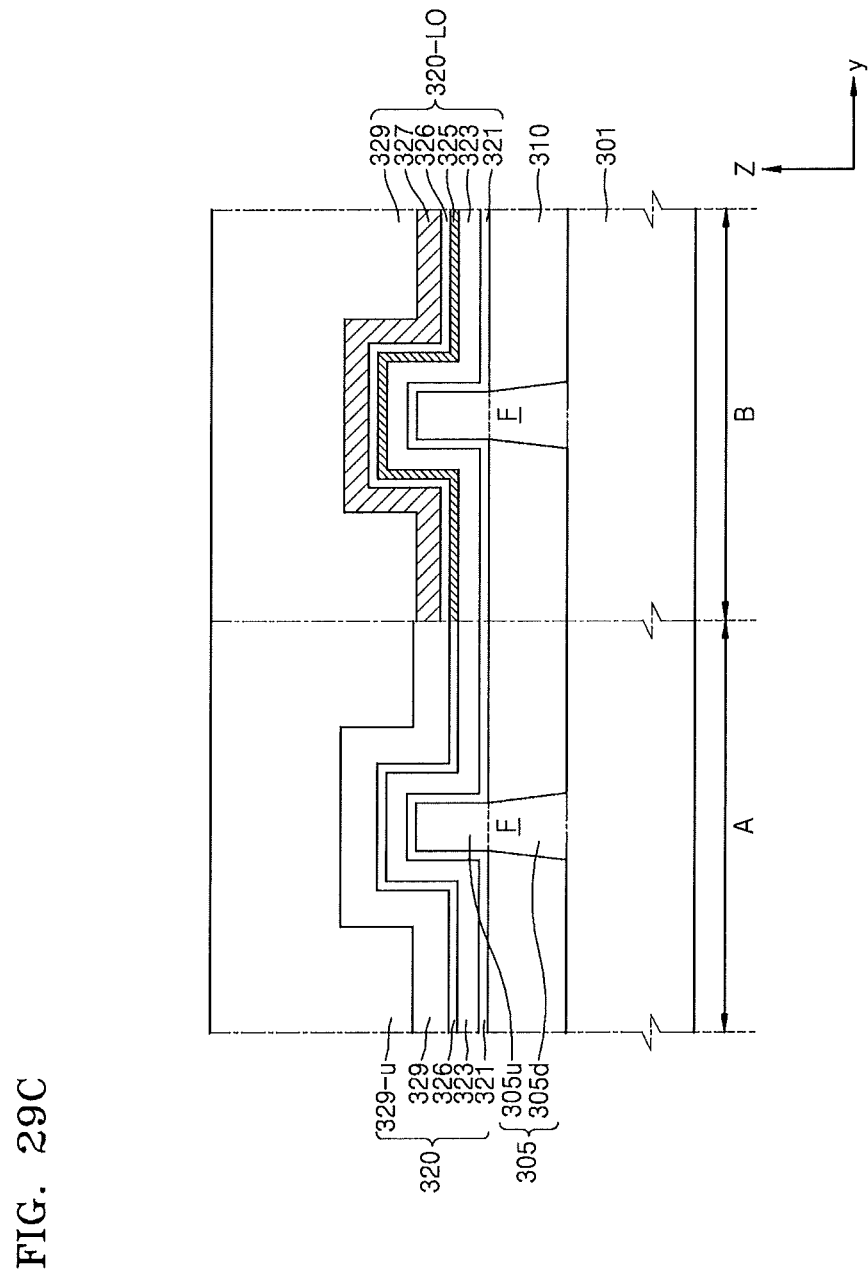

Referring to FIGS. 29A to 29C, after the second mask 327M is removed, a second metal layer and a gap-fill metal layer may be sequentially formed on the resultant material on the semiconductor substrate 301. The functions or materials of the second metal layer and the gap-fill metal layer are as described above with reference to FIG. 19H. Also, a barrier metal layer may be further formed before the gap-fill metal layer is formed. Also, at the logic device region B, the second metal layer may fill a whole gap. Thus, the gap-fill metal layer may be formed on the second metal layer without being formed in the gap.

After the gap-fill metal layer is formed, a planarizing process may be performed. The planarizing process, for example, may be performed by a CMP process or the like. The planarizing process may be performed to expose a top of the interlayer insulation layer 340. Through the planarizing process, the gate structure 320 of the OTP memory device 300 of FIG. 9A may be formed in the OTP memory device region A, and a U-shaped gate structure 320-LO having a layered structure similar to the third gate structure G3 of FIG. 4 may be formed at the logic device region B. The read transistor TI of the OTP memory device 300 of FIG. 9A may be formed in the OTP memory device region A by forming the gate structures 320 and 320-LO. Also, a MOS transistor having a desired threshold voltage may be formed at the logic device region B.

As described above with reference to FIGS. 17A to 17E, a mask process and an etching process may be appropriately applied to the OTP memory device region A, thereby forming the gate structure 320a of the OTP memory device 300a of FIG. 10 or the gate structure 320b of the OTP memory device 300b of FIG. 11. Also, a mask process and an etching process may be appropriately applied to the logic device region B, thereby forming a gate structure similar to at least one of the first gate structure G1, the second gate structure G2, and the fourth gate structure G4 other than the third gate structure G3.

As described above, in the OTP memory device and the method of manufacturing the same according to the embodiments, a program transistor and a read transistor may be formed by a CMOS process or the like. The program transistor may be formed in a structure where breakdown is easily made by applying a low programming voltage, thereby enhancing the programming efficiency of the OTP memory device, thereby increasing reliability of peripheral I/O elements used for a design of the OTP memory device, and simplifying the design.

While the inventive concept has been particularly shown and described with reference to embodiments thereof, it will he understood that various changes in form and details may be made therein without departing from the spirit and scope of the following claims.

What is claimed is:

1. A one time programmable (OTP) memory device disposed with a logic device including a plurality of metal oxide semiconductor field effect transistors (MOSFETs) having different threshold voltages, the OTP memory device comprising:

a program transistor configured to write data once according to a programming voltage being applied to a first gate structure, the program transistor including the first gate structure; and a read transistor configured to read data stored in the program transistor according to an operating voltage being applied to a second gate structure, the read transistor including the second gate structure, wherein at least one of the plurality of MOSFETs comprises a third gate structure which includes a high-k dielectric layer, a rare earth element (RE) supply layer on a top surface of the high-k dielectric layer, a first metal layer, and a second metal layer, wherein the first gate structure comprises a first gate oxide layer having at least one layer and a first metal electrode layer having at least one layer on the first gate oxide layer and comprises at least one of a first structure at which the first metal electrode layer is thinner than a sum of a thickness of the first metal layer and a thickness of the second metal layer, and a second structure at which the first gate oxide layer is thinner than a sum of a thickness of the high-k dielectric layer and a thickness of the RE supply layer, wherein the first gate oxide layer of the program transistor is broken down to write data by an application of the programming voltage.

2. The OTP memory device of claim 1, wherein:
the OTP memory device comprises at least one fin extending in a first direction at a protruding structure on a semiconductor substrate;
the first gate structure and the second gate structure cover a portion of the fin on the semiconductor substrate and extend in a second direction vertical to the first direction; and
the second gate structure comprises a structure which is substantially the same as a structure of the first gate structure.

3. The OTP memory device of claim 1, wherein the first metal layer comprises a nitride or an oxynitride of titanium (Ti) or a nitride or an oxynitride of tantalum (Ta).

4. The OTP memory device of claim 1, wherein the RE supply layer comprises at least one of lanthanum (La), scandium (Sc), erbium (Er), strontium (Sr), and yttrium (Yt).

5. The OTP memory device of claim 1, wherein:
the first gate structure comprises the first structure; and
the first metal electrode layer comprises the second metal layer and does not include the first metal layer.

6. The OTP memory device of claim 1, wherein:
the first gate structure comprises the second structure; and
the first gate oxide layer comprises the high-k dielectric layer and does not include the RE supply layer.

7. The OTP memory device of claim 1, wherein:
the first gate structure comprises a complex structure which includes the first structure and the second structure;
the first metal electrode layer comprises the second metal layer and does not include the first metal layer; and
the first gate oxide layer comprises the high-k dielectric layer and does not include the RE supply layer.

8. The OTP memory device of claim 1, wherein:
the second metal layer comprises aluminum (Al); and
the high-k dielectric layer comprises a hafnium (Hf)-based material or a zirconium (Zr)-based material.

9. The OTP memory device of claim 1, wherein:
the plurality of MOSFETs, the read transistor, and the program transistor comprise a FinFET structure; and
the read transistor and the program transistor are formed along with the plurality of MOSFETs.

10. The OTP memory device of claim 9, wherein the logic device comprises at least one of:
a first MOSFET including the third gate structure and a first threshold voltage;
a second MOSFET including a fourth gate structure and a second threshold voltage, the fourth gate structure including the high-k dielectric layer, the RE supply layer, and the second metal layer;
a third MOSFET including a fifth gate structure and a third threshold voltage, the fifth gate structure including the high-k dielectric layer, the first metal layer, and the second metal layer; and
a fourth MOSFET including a sixth gate structure and a fourth threshold voltage, the sixth gate structure including the high-k dielectric layer and the second metal layer, and wherein:
a threshold voltage increases in an order of the second threshold voltage, the fourth threshold voltage, the first threshold voltage, and the third threshold voltage;
a breakdown voltage increases in an order of the fourth MOSFET, the second MOSFET, the third MOSFET, and the first MOSFET; and
the first gate structure and the second gate structure each comprises a structure which is the same as a structure of one of the fourth to sixth gate structures.

11. The OTP memory device of claim 1, wherein the first gate structure comprises:
an interface layer under the first gate oxide layer; and
a barrier metal layer between the first gate oxide layer and the first metal electrode layer.

* * * * *